(12) United States Patent
Tong et al.

(10) Patent No.: US 9,310,030 B2
(45) Date of Patent: Apr. 12, 2016

(54) NON-UNIFORM DIFFUSER TO SCATTER LIGHT INTO UNIFORM EMISSION PATTERN

(75) Inventors: Tao Tong, Ventura, CA (US); Ronan Letoquin, Fremont, CA (US); Bernd Keller, Santa Barbara, CA (US); Eric Tarsa, Goleta, CA (US); Mark Youmans, Goleta, CA (US); Theodore Lowes, Lompoc, CA (US); Nicholas W. Medendorp, Jr., Raleigh, NC (US); Antony Van De Ven, Sai Kung (HK); Gerald Negley, Durham, NC (US); Peter Guschl, Carpinteria, CA (US); Zongjie Yuan, Santa Barbara, CA (US)

(73) Assignee: CREE, INC., Durham, NC (US)

( * ) Notice: Subject to any disclaimer, the term of this patent is extended or adjusted under 35 U.S.C. 154(b) by 25 days.

(21) Appl. No.: 12/901,405

(22) Filed: Oct. 8, 2010

(65) Prior Publication Data

US 2011/0216523 A1  Sep. 8, 2011

Related U.S. Application Data

(63) Continuation-in-part of application No. 12/848,825, filed on Aug. 2, 2010, now Pat. No. 8,562,161, and a continuation-in-part of application No. 12/889,719, filed on Sep. 24, 2010.

(Continued)

(51) Int. Cl.
*F21V 9/16* (2006.01)
*F21K 99/00* (2010.01)
(Continued)

(52) U.S. Cl.
CPC . *F21K 9/135* (2013.01); *F21K 9/50* (2013.01); *F21K 9/56* (2013.01); *F21K 9/58* (2013.01); *F21V 3/0481* (2013.01); *F21V 5/002* (2013.01); *F21V 29/505* (2015.01); *F21Y 2101/02* (2013.01)

(58) Field of Classification Search
CPC ....... F21Y 2101/02; F21K 9/135; F21K 9/56; F21V 29/773
USPC ........... 362/84, 800, 231, 235, 294, 373, 293, 362/311.06
See application file for complete search history.

(56) References Cited

U.S. PATENT DOCUMENTS

| 2,394,992 | A | 2/1946 | Franck ..................... 362/311.12 |
| 3,143,592 | A | 8/1964 | August ........................ 174/16.3 |

(Continued)

FOREIGN PATENT DOCUMENTS

| CN | 1425117 | 6/2003 |
| CN | 1465106 A | 12/2003 |

(Continued)

OTHER PUBLICATIONS

International Search Report and Written Opinion for PCT Patent Application No. PCT/US2011/000405 mailed Nov. 2, 2011.

(Continued)

*Primary Examiner* — Anh Mai
*Assistant Examiner* — Jessica M Apenteng
(74) *Attorney, Agent, or Firm* — Koppel, Patrick, Heybl & Philpott

(57) ABSTRACT

A lighting device comprising a light source and a diffuser spaced from the light source. The lighting device further comprises a wavelength conversion material disposed between the light source and the diffuser and spaced from the light source and the diffuser, wherein the diffuser is shaped such that there are different distances between the diffuser and said conversion material at different emission angles. In other embodiments the diffuser includes areas with different diffusing characteristics. Some lamps are arranged to meet A19 and Energy Star lighting standards.

78 Claims, 46 Drawing Sheets

Related U.S. Application Data

(60) Provisional application No. 61/339,516, filed on Mar. 3, 2010, provisional application No. 61/339,515, filed on Mar. 3, 2010, provisional application No. 61/386,437, filed on Sep. 24, 2010.

(51) Int. Cl.
*F21V 5/00* (2015.01)
*F21V 3/04* (2006.01)
*F21Y 101/02* (2006.01)
*F21V 29/505* (2015.01)

(56) References Cited

U.S. PATENT DOCUMENTS

| | | | |
|---|---|---|---|
| 3,581,162 A | 5/1971 | Wheatley | |
| 4,204,296 A | 5/1980 | Reilly | 361/699 |
| 5,463,280 A | 10/1995 | Johnson | |
| 5,535,230 A | 7/1996 | Abe | |
| 5,561,346 A | 10/1996 | Byrne | |
| 5,581,683 A | 12/1996 | Bertignoll et al. | |
| 5,585,783 A | 12/1996 | Hall | |
| 5,655,830 A | 8/1997 | Ruskouski | |
| 5,688,042 A | 11/1997 | Madadi et al. | |
| 5,806,965 A | 9/1998 | Deese | |
| 5,838,101 A | 11/1998 | Pappalardo | 313/487 |
| 5,890,794 A | 4/1999 | Abtahi et al. | |
| 5,934,798 A | 8/1999 | Roller et al. | 362/497 |
| 5,947,588 A | 9/1999 | Huang | |
| 5,949,347 A | 9/1999 | Wu | |
| 6,218,785 B1 | 4/2001 | Incerti | 315/185 S |
| 6,220,722 B1 | 4/2001 | Begemann | |
| 6,220,731 B1 | 4/2001 | Ryan | 362/373 |
| 6,227,679 B1 | 5/2001 | Zhang et al. | |
| 6,234,648 B1 | 5/2001 | Borner et al. | |
| 6,250,774 B1 | 6/2001 | Begemann et al. | |
| 6,270,722 B1 | 8/2001 | Yang et al. | 422/37 |
| 6,276,822 B1 | 8/2001 | Bedrosian et al. | |
| 6,350,041 B1 | 2/2002 | Tarsa | |
| 6,404,131 B1 | 6/2002 | Kawano et al. | 315/82 |
| 6,465,961 B1 | 10/2002 | Cao | 315/58 |
| 6,517,221 B1 | 2/2003 | Xie | 362/373 |
| 6,523,978 B1 | 2/2003 | Huang | |
| 6,550,953 B1 | 4/2003 | Ichikawa et al. | |
| 6,634,770 B2 | 10/2003 | Cao | |
| 6,659,632 B2 | 12/2003 | Chen | |
| 6,709,132 B2 | 3/2004 | Ishibashi | |
| 6,746,885 B2 | 6/2004 | Cao | 438/26 |
| 6,764,202 B1 | 7/2004 | Herring et al. | 362/371 |
| 6,803,607 B1 | 10/2004 | Chan et al. | |
| 6,848,819 B1 | 2/2005 | Arndt et al. | |
| 6,860,620 B2 | 3/2005 | Kuan et al. | 362/294 |
| 6,864,513 B2 | 3/2005 | Lin et al. | |
| 6,910,794 B2 | 6/2005 | Rice | 362/547 |
| 6,948,829 B2 | 9/2005 | Verdes et al. | |
| 6,982,518 B2 | 1/2006 | Chou et al. | |
| 6,997,580 B2 | 2/2006 | Wong | 362/311.02 |
| 7,048,412 B2 | 5/2006 | Martin et al. | |
| 7,080,924 B2 | 7/2006 | Tseng et al. | |
| 7,086,756 B2 | 8/2006 | Maxik | |
| 7,086,767 B2 | 8/2006 | Sidwell et al. | |
| 7,094,362 B2 | 8/2006 | Setlur et al. | 252/301 |
| 7,140,753 B2 | 11/2006 | Wang et al. | 362/294 |
| 7,144,135 B2 | 12/2006 | Martin et al. | |
| 7,160,012 B2 | 1/2007 | Hilscher et al. | |
| 7,160,120 B2 | 1/2007 | Zhang et al. | |
| 7,165,866 B2 | 1/2007 | Li | |
| 7,172,314 B2 | 2/2007 | Currie et al. | |
| 7,213,940 B1 | 5/2007 | Van De Ven | |
| D546,980 S | 7/2007 | Lo | |
| 7,270,446 B2 | 9/2007 | Chang et al. | 362/294 |
| D553,267 S | 10/2007 | Yuen | |
| 7,350,936 B2 | 4/2008 | Ducharme et al. | 362/231 |
| 7,354,174 B1 | 4/2008 | Yan | |
| 7,377,679 B2 | 5/2008 | Schultz et al. | 362/484 |
| 7,396,142 B2 | 7/2008 | Laizure, Jr. et al. | |
| 7,405,857 B2 | 7/2008 | Ma et al. | |
| 7,413,325 B2 | 8/2008 | Chen | 362/249.01 |
| D581,556 S | 11/2008 | To et al. | D26/2 |
| 7,547,124 B2 | 6/2009 | Chang et al. | 362/373 |
| 7,549,782 B2 | 6/2009 | Ng et al. | 362/555 |
| 7,553,047 B2 | 6/2009 | Shin et al. | 362/294 |
| 7,600,882 B1 | 10/2009 | Morejon et al. | |
| 7,607,802 B2 | 10/2009 | Kang et al. | 362/294 |
| 7,614,759 B2 | 11/2009 | Negley | |
| 7,618,157 B1 | 11/2009 | Galvez | |
| 7,663,315 B1 | 2/2010 | Hulse | |
| 7,686,478 B1 | 3/2010 | Hulse | |
| 7,726,836 B2 | 6/2010 | Chen | |
| 7,740,365 B2 | 6/2010 | Huttner et al. | 362/97 |
| 7,753,568 B2 | 7/2010 | Hu et al. | 362/373 |
| 7,810,954 B2 | 10/2010 | Kolodin | 362/277 |
| 7,824,065 B2 | 11/2010 | Maxik | |
| D629,928 S | 12/2010 | Chen et al. | |
| 7,884,538 B2 | 2/2011 | Mitsuishi et al. | 313/502 |
| 7,976,335 B2 | 7/2011 | Weber et al. | 439/487 |
| 7,989,236 B2 | 8/2011 | Yamaguchi et al. | 438/26 |
| 8,021,025 B2 | 9/2011 | Lee | |
| 8,235,571 B2 | 8/2012 | Park | 362/555 |
| 8,253,316 B2 | 8/2012 | Sun et al. | |
| 8,272,762 B2 | 9/2012 | Maxik et al. | |
| 8,274,241 B2 | 9/2012 | Guest et al. | |
| 8,277,082 B2 | 10/2012 | Dassanayake et al. | |
| 8,282,250 B1 | 10/2012 | Dassanayake et al. | |
| 8,292,468 B2 | 10/2012 | Narendran et al. | |
| 8,309,969 B2 | 11/2012 | Suehiro et al. | 257/79 |
| 8,314,537 B2 | 11/2012 | Gielen et al. | 313/46 |
| 8,322,896 B2 | 12/2012 | Falicoff et al. | |
| 8,348,470 B2 | 1/2013 | Liu et al. | 362/294 |
| 8,371,722 B2 | 2/2013 | Carroll | |
| 8,400,051 B2 | 3/2013 | Hakata et al. | |
| 8,410,512 B2 | 4/2013 | Andrews | 257/99 |
| 8,415,865 B2 | 4/2013 | Liang et al. | |
| 8,421,320 B2 | 4/2013 | Chuang | |
| 8,421,321 B2 | 4/2013 | Chuang | |
| 8,421,322 B2 | 4/2013 | Carroll et al. | |
| 8,449,154 B2 | 5/2013 | Uemoto et al. | |
| 8,502,468 B2 | 8/2013 | Li et al. | |
| 8,568,009 B2 | 10/2013 | Chiang et al. | 362/563 |
| 8,641,237 B2 | 2/2014 | Chuang | |
| 8,653,723 B2 | 2/2014 | Cao et al. | |
| 8,696,168 B2 | 4/2014 | Li et al. | |
| 8,740,415 B2 | 6/2014 | Wheelock | |
| 8,750,671 B1 | 6/2014 | Kelly et al. | |
| 8,752,984 B2 | 6/2014 | Lenk et al. | |
| 8,760,042 B2 | 6/2014 | Sakai et al. | |
| 8,922,106 B2 | 12/2014 | Helbing et al. | 313/318.11 |
| 2002/0047516 A1 | 4/2002 | Iwasa et al. | 313/512 |
| 2003/0021113 A1 | 1/2003 | Begemann | |
| 2003/0038291 A1 | 2/2003 | Cao | |
| 2003/0185005 A1 | 10/2003 | Sommers et al. | |
| 2004/0021629 A1 | 2/2004 | Sasuga et al. | |
| 2004/0159846 A1 | 8/2004 | Doxsee | |
| 2004/0201990 A1 | 10/2004 | Neyer | |
| 2004/0223315 A1 | 11/2004 | Suehiro et al. | 362/84 |
| 2005/0068776 A1 | 3/2005 | Ge | 362/296 |
| 2005/0168990 A1 | 8/2005 | Nagata et al. | 362/294 |
| 2005/0174780 A1 | 8/2005 | Park | 362/294 |
| 2005/0184638 A1 | 8/2005 | Mueller et al. | 313/485 |
| 2005/0219060 A1 | 10/2005 | Curran et al. | 340/815.45 |
| 2005/0225988 A1 | 10/2005 | Chaves et al. | |
| 2005/0242711 A1 | 11/2005 | Bloomfield | |
| 2005/0276053 A1 | 12/2005 | Nortrup et al. | 362/294 |
| 2006/0097245 A1 | 5/2006 | Aanegola et al. | 257/26 |
| 2006/0097385 A1 | 5/2006 | Negley | 257/722 |
| 2006/0105482 A1 | 5/2006 | Alferink et al. | 438/22 |
| 2006/0138435 A1 | 6/2006 | Tarsa et al. | 257/89 |
| 2006/0152140 A1 | 7/2006 | Brandes | 313/503 |
| 2006/0152820 A1 | 7/2006 | Lien et al. | 359/726 |
| 2006/0180774 A1 | 8/2006 | Endo | 250/485.1 |
| 2006/0227558 A1 | 10/2006 | Osawa et al. | 362/351 |
| 2007/0047232 A1 | 3/2007 | Kim et al. | |
| 2007/0090737 A1 | 4/2007 | Hu et al. | 313/11 |
| 2007/0091633 A1 | 4/2007 | Harrity et al. | |

(56) References Cited

U.S. PATENT DOCUMENTS

| | | | |
|---|---|---|---|
| 2007/0139938 A1 | 6/2007 | Petroski | |
| 2007/0139949 A1 | 6/2007 | Tanda et al. | 362/551 |
| 2007/0158668 A1 | 7/2007 | Tarsa et al. | 257/98 |
| 2007/0206375 A1 | 9/2007 | Lys et al. | |
| 2007/0215890 A1 | 9/2007 | Harbers et al. | |
| 2007/0223219 A1 | 9/2007 | Medendorp | |
| 2007/0263405 A1 | 11/2007 | Ng et al. | 362/555 |
| 2007/0267976 A1 | 11/2007 | Bohler et al. | 315/112 |
| 2007/0274080 A1 | 11/2007 | Negley et al. | 362/341 |
| 2007/0285924 A1 | 12/2007 | Morris et al. | 362/264 |
| 2007/0297183 A1 | 12/2007 | Coushaine | |
| 2008/0037257 A1 | 2/2008 | Bolta | |
| 2008/0055908 A1 | 3/2008 | Wu et al. | 362/294 |
| 2008/0062694 A1 | 3/2008 | Lai et al. | 362/294 |
| 2008/0080165 A1 | 4/2008 | Kim et al. | |
| 2008/0093615 A1 | 4/2008 | Lin et al. | |
| 2008/0106893 A1 | 5/2008 | Johnson et al. | |
| 2008/0117620 A1 | 5/2008 | Hama et al. | 362/84 |
| 2008/0128735 A1 | 6/2008 | Yoo et al. | |
| 2008/0149166 A1 | 6/2008 | Beeson et al. | 136/248 |
| 2008/0173884 A1 | 7/2008 | Chitnis et al. | 257/98 |
| 2008/0179611 A1 | 7/2008 | Chitnis et al. | 257/98 |
| 2008/0232119 A1 | 9/2008 | Ribarich | 362/373 |
| 2008/0285279 A1 | 11/2008 | Ng et al. | 362/249 |
| 2008/0308825 A1 | 12/2008 | Chakraborty et al. | 257/98 |
| 2009/0001399 A1 | 1/2009 | Diana et al. | 257/98 |
| 2009/0015137 A1 | 1/2009 | Su et al. | 313/503 |
| 2009/0040760 A1 | 2/2009 | Chen et al. | 362/249 |
| 2009/0046473 A1 | 2/2009 | Tsai et al. | 362/373 |
| 2009/0058256 A1 | 3/2009 | Mitsuishi et al. | 313/487 |
| 2009/0059559 A1 | 3/2009 | Pabst | |
| 2009/0067180 A1 | 3/2009 | Tahmosybayat | 362/339 |
| 2009/0086492 A1 | 4/2009 | Meyer | |
| 2009/0095960 A1 | 4/2009 | Murayama | 257/79 |
| 2009/0101930 A1 | 4/2009 | Li | |
| 2009/0103293 A1 | 4/2009 | Harbers et al. | 362/231 |
| 2009/0103296 A1 | 4/2009 | Harbers et al. | |
| 2009/0116217 A1 | 5/2009 | Teng et al. | |
| 2009/0175041 A1 | 7/2009 | Yuen et al. | |
| 2009/0184618 A1 | 7/2009 | Hakata et al. | |
| 2009/0190353 A1 | 7/2009 | Barker | 362/249 |
| 2009/0195186 A1 | 8/2009 | Guest et al. | 315/294 |
| 2009/0201679 A1 | 8/2009 | Konaka | 362/235 |
| 2009/0217970 A1 | 9/2009 | Zimmerman et al. | 136/252 |
| 2009/0262516 A1 | 10/2009 | Li | 362/84 |
| 2009/0273727 A1 | 11/2009 | Kubota et al. | 349/62 |
| 2009/0273924 A1 | 11/2009 | Chiang | 362/241 |
| 2009/0283779 A1 | 11/2009 | Negley et al. | 257/88 |
| 2009/0296387 A1 | 12/2009 | Reisenauer et al. | 362/235 |
| 2009/0310368 A1 | 12/2009 | Incerti et al. | 362/326 |
| 2009/0316073 A1 | 12/2009 | Chen et al. | 349/64 |
| 2009/0316383 A1 | 12/2009 | Son | |
| 2009/0322197 A1 | 12/2009 | Helbing | |
| 2009/0322208 A1 | 12/2009 | Shaikevitch et al. | 313/503 |
| 2009/0322800 A1 | 12/2009 | Atkins | 345/690 |
| 2009/0323333 A1 | 12/2009 | Chang | |
| 2010/0014839 A1 | 1/2010 | Benoy et al. | 386/117 |
| 2010/0020547 A1 | 1/2010 | Olsson | 362/311 |
| 2010/0025700 A1 | 2/2010 | Jung et al. | 257/99 |
| 2010/0026185 A1 | 2/2010 | Betsuda et al. | 315/32 |
| 2010/0027258 A1 | 2/2010 | Maxik et al. | 362/240 |
| 2010/0038660 A1 | 2/2010 | Shuja | 257/98 |
| 2010/0046231 A1 | 2/2010 | Medinis | 362/294 |
| 2010/0060144 A1 | 3/2010 | Justel et al. | 313/503 |
| 2010/0091487 A1 | 4/2010 | Shin | 362/235 |
| 2010/0096967 A1 | 4/2010 | Marinus et al. | 313/46 |
| 2010/0102707 A1 | 4/2010 | Fukuda et al. | 313/503 |
| 2010/0134047 A1 | 6/2010 | Hasnain | |
| 2010/0140655 A1 | 6/2010 | Shi | 257/99 |
| 2010/0149783 A1 | 6/2010 | Takenaka et al. | 362/84 |
| 2010/0149814 A1 | 6/2010 | Zhai et al. | 257/88 |
| 2010/0155763 A1 | 6/2010 | Donofrio | |
| 2010/0170075 A1 | 7/2010 | Kanade et al. | 29/428 |
| 2010/0177522 A1 | 7/2010 | Lee | 362/373 |
| 2010/0201284 A1 | 8/2010 | Kraus | |
| 2010/0207502 A1 | 8/2010 | Cao et al. | 313/46 |
| 2010/0219735 A1 | 9/2010 | Sakai et al. | 313/46 |
| 2010/0232134 A1 | 9/2010 | Tran | 362/84 |
| 2010/0244729 A1 | 9/2010 | Chen et al. | 315/291 |
| 2010/0246165 A1 | 9/2010 | Diaz et al. | 362/183 |
| 2010/0264799 A1 | 10/2010 | Liu et al. | 313/46 |
| 2010/0314985 A1 | 12/2010 | Premysler | 313/46 |
| 2010/0327745 A1 | 12/2010 | Dassanayake et al. | |
| 2010/0328925 A1 | 12/2010 | Hoelen et al. | 362/84 |
| 2011/0037368 A1 | 2/2011 | Huang | 313/46 |
| 2011/0044022 A1 | 2/2011 | Ko et al. | 362/84 |
| 2011/0058379 A1 | 3/2011 | Diamantidis | 362/296.01 |
| 2011/0074271 A1 | 3/2011 | Takeshi et al. | 313/46 |
| 2011/0074296 A1 | 3/2011 | Shen et al. | 315/112 |
| 2011/0080096 A1 | 4/2011 | Dudik et al. | 315/112 |
| 2011/0080740 A1 | 4/2011 | Allen et al. | 362/294 |
| 2011/0089804 A1 | 4/2011 | Mahalingam et al. | 313/46 |
| 2011/0089830 A1 | 4/2011 | Pickard et al. | 315/32 |
| 2011/0095686 A1 | 4/2011 | Falicoff et al. | 315/35 |
| 2011/0133222 A1 | 6/2011 | Allen et al. | 257/88 |
| 2011/0175528 A1 | 7/2011 | Rains et al. | 315/51 |
| 2011/0176316 A1 | 7/2011 | Phipps et al. | |
| 2011/0205733 A1 | 8/2011 | Lenderink et al. | 362/231 |
| 2011/0215696 A1 | 9/2011 | Tong et al. | 313/46 |
| 2011/0216523 A1 | 9/2011 | Tong et al. | 362/84 |
| 2011/0242816 A1 | 10/2011 | Chowdhury et al. | 362/294 |
| 2011/0267835 A1 | 11/2011 | Boonekamp et al. | 362/555 |
| 2011/0273072 A1 | 11/2011 | Oki | 313/46 |
| 2011/0291560 A1 | 12/2011 | Wang et al. | 315/32 |
| 2011/0298371 A1 | 12/2011 | Brandes et al. | 315/32 |
| 2012/0040585 A1 | 2/2012 | Huang | |
| 2012/0155059 A1 | 6/2012 | Hoelen et al. | 362/84 |
| 2012/0161626 A1 | 6/2012 | Van De Ven et al. | 315/35 |
| 2012/0320591 A1 | 12/2012 | Liao et al. | 362/249 |
| 2013/0049018 A1 | 2/2013 | Ramer et al. | 257/81 |
| 2013/0063945 A1 | 3/2013 | Wu et al. | 362/249 |
| 2013/0119280 A1 | 5/2013 | Fuchi et al. | 250/504 R |
| 2013/0249374 A1 | 9/2013 | Lee et al. | 313/12 |
| 2013/0293098 A1 | 11/2013 | Li et al. | 313/512 |

FOREIGN PATENT DOCUMENTS

| | | |
|---|---|---|
| CN | 1608326 | 4/2005 |
| CN | 1726410 | 1/2006 |
| CN | 1802533 | 7/2006 |
| CN | 101128695 | 2/2008 |
| CN | 101262032 | 9/2008 |
| CN | 1013388887 A | 1/2009 |
| CN | 101641623 | 2/2010 |
| CN | 102077011 | 5/2011 |
| DE | 10251955 A1 | 5/2004 |
| DE | 102006061164 | 6/2008 |
| DE | 10 2007 037862 A1 | 10/2008 |
| DE | 202008013667 | 12/2008 |
| DE | 102004051382 | 10/2009 |
| DE | 102011004718 | 8/2012 |
| EP | 0876085 | 11/1998 |
| EP | 0876085 A2 | 11/1998 |
| EP | 0890059 A1 | 1/1999 |
| EP | 1058221 A2 | 12/2000 |
| EP | 1881259 | 1/2008 |
| EP | 2146135 A2 | 1/2010 |
| EP | 2154420 | 2/2010 |
| EP | 2469154 | 6/2012 |
| FR | 2941346 | 7/2010 |
| GB | 2345954 A | 7/2000 |
| GB | 2 366 610 A | 3/2002 |
| GB | 2366610 | 3/2002 |
| GB | 2366610 A | 3/2002 |
| JP | H03081903 | 4/1991 |
| JP | H06283006 | 10/1994 |
| JP | H09265807 | 10/1997 |
| JP | H11177149 | 7/1999 |
| JP | 11-213730 A | 8/1999 |
| JP | H11260125 | 9/1999 |
| JP | 2000022222 | 1/2000 |
| JP | 2000173304 | 6/2000 |
| JP | 2001118403 | 4/2001 |
| JP | 2002525814 | 8/2002 |

(56) References Cited

FOREIGN PATENT DOCUMENTS

| | | |
|---|---|---|
| JP | 2003515899 | 5/2003 |
| JP | 2004146225 | 5/2004 |
| JP | 2004241318 | 8/2004 |
| JP | 2005-093097 A | 4/2005 |
| JP | 2005108700 | 4/2005 |
| JP | 20051008700 | 4/2005 |
| JP | 2005244226 | 9/2005 |
| JP | 2005-286267 A | 10/2005 |
| JP | 2005277127 | 10/2005 |
| JP | 2005021635 | 11/2005 |
| JP | 2006019676 | 1/2006 |
| JP | 2006108661 | 4/2006 |
| JP | 2006148147 | 6/2006 |
| JP | 2006156187 | 6/2006 |
| JP | 20066159187 | 6/2006 |
| JP | WO 2006065558 | 6/2006 |
| JP | 200640850 A | 9/2006 |
| JP | 2006525648 | 11/2006 |
| JP | 2006331683 | 12/2006 |
| JP | 2007049019 | 2/2007 |
| JP | 200759930 | 3/2007 |
| JP | 2007059911 | 3/2007 |
| JP | 2007081090 | 3/2007 |
| JP | 2007184330 | 7/2007 |
| JP | 3138653 | 12/2007 |
| JP | 2008505448 | 2/2008 |
| JP | 2008508742 | 3/2008 |
| JP | 2008091140 | 4/2008 |
| JP | 2008108835 | 5/2008 |
| JP | 2008523639 | 7/2008 |
| JP | 2008187195 | 8/2008 |
| JP | 2008262765 | 10/2008 |
| JP | 200828183 | 11/2008 |
| JP | 2008288409 | 11/2008 |
| JP | 2008300117 | 12/2008 |
| JP | 2008300203 | 12/2008 |
| JP | 2008300460 | 12/2008 |
| JP | 2008300570 | 12/2008 |
| JP | 2009-016058 A | 1/2009 |
| JP | 2009016058 | 1/2009 |
| JP | 2009016153 | 1/2009 |
| JP | 2009021264 | 1/2009 |
| JP | 2009059896 | 3/2009 |
| JP | 2009117346 | 5/2009 |
| JP | WO 2009093163 | 7/2009 |
| JP | U3153766 | 8/2009 |
| JP | WO 2009119038 | 10/2009 |
| JP | 2009266780 | 11/2009 |
| JP | 2009277586 | 11/2009 |
| JP | 2009295299 | 12/2009 |
| JP | 201001623 | 1/2010 |
| JP | 2010016223 | 1/2010 |
| JP | 2010040494 | 2/2010 |
| JP | 2010050473 | 3/2010 |
| JP | 2010129300 | 6/2010 |
| JP | 2010267826 | 11/2010 |
| KR | 100944181 | 2/2010 |
| KR | 1020100037353 | 4/2010 |
| KR | 100980588 B1 | 9/2010 |
| KR | 3020110008445 | 3/2011 |
| TW | 200505054 | 2/2005 |
| TW | 200527664 | 8/2005 |
| TW | 200618339 | 6/2006 |
| TW | 200619744 | 6/2006 |
| TW | M309750 | 4/2007 |
| TW | 200739151 | 10/2007 |
| TW | 200806922 | 2/2008 |
| TW | 200928435 | 7/2009 |
| TW | 200938768 | 9/2009 |
| TW | 200943592 | 10/2009 |
| TW | D134005 | 3/2010 |
| TW | 100300960 | 3/2011 |
| TW | D141681 | 7/2011 |
| WO | WO 00/17569 A1 | 3/2000 |
| WO | WO 0124583 A1 | 4/2001 |
| WO | WO 01/40702 A1 | 6/2001 |
| WO | WO 0160119 A2 | 8/2001 |
| WO | WO 2004100213 A2 | 5/2004 |
| WO | WO 2004068599 | 8/2004 |
| WO | WO 2004100213 | 11/2004 |
| WO | WO 2005107420 A2 | 11/2005 |
| WO | WO 2006012043 | 2/2006 |
| WO | WO 2006065558 | 6/2006 |
| WO | WO 2007/130358 A2 | 11/2007 |
| WO | WO 2007146566 A2 | 12/2007 |
| WO | WO 2008/018002 A2 | 2/2008 |
| WO | WO 2008018002 | 2/2008 |
| WO | WO 2008134056 A1 | 4/2008 |
| WO | WO 2008/052318 A1 | 5/2008 |
| WO | WO 2008/117211 A1 | 10/2008 |
| WO | WO 2008/146229 A2 | 12/2008 |
| WO | WO 2008146229 | 12/2008 |
| WO | WO 2009/024952 A2 | 2/2009 |
| WO | WO 2009052099 | 4/2009 |
| WO | WO 2009/091562 A2 | 7/2009 |
| WO | WO 2009/093163 A2 | 7/2009 |
| WO | WO 2009091562 | 7/2009 |
| WO | WO 2009093163 | 7/2009 |
| WO | WO 2009093163 A2 * | 7/2009 |
| WO | WO 2009/107052 A1 | 9/2009 |
| WO | WO 2009107052 | 9/2009 |
| WO | WO 2009/119038 A2 | 10/2009 |
| WO | WO 2009/128004 A1 | 10/2009 |
| WO | WO 2009119038 | 10/2009 |
| WO | WO 2009125314 A2 | 10/2009 |
| WO | WO 2009131627 | 10/2009 |
| WO | WO 2009143047 A2 | 11/2009 |
| WO | WO 2009/158422 A1 | 12/2009 |
| WO | WO 2009148543 | 12/2009 |
| WO | WO 2009158422 | 12/2009 |
| WO | WO 2009158422 A1 | 12/2009 |
| WO | WO 2010/012999 A2 | 2/2010 |
| WO | WO 2010012999 | 2/2010 |
| WO | WO 2010013893 | 2/2010 |
| WO | WO 2010052640 | 5/2010 |
| WO | WO 2010/119618 A1 | 10/2010 |
| WO | WO 2010/128419 A1 | 11/2010 |
| WO | WO 2011100193 | 8/2011 |
| WO | WO 2011109091 A1 | 9/2011 |
| WO | WO 2011109098 | 9/2011 |
| WO | WO 2012011279 | 1/2012 |
| WO | WO 2012031533 | 3/2012 |

OTHER PUBLICATIONS

International Search Report and Written Opinion for PCT/US2011/000407 mailed Nov. 16, 2011.
Office Action of the IPO for Taiwan Patent Application No. TW 100300962 issued Nov. 21, 2011.
Office Action of the IPO for Taiwan Patent Application No. TW 100300961 issued Nov. 16, 2011.
Office Action of the IPO for Taiwan Patent Application No. TW 100300960 issued Nov. 15, 2011.
Office Action of the IPO for Taiwan Patent Application No. TW 100302770 issued Jan. 13, 2012.
Cree LR6, 6' Recessed Downlight Module, Product Info, p. 1-2.
U.S. Appl. No. 12/901,405, filed Oct. 8, 2010, Tong.
U.S. Appl. No. 61/339,515, filed Mar. 3, 2010, Tong.
U.S. Appl. No. 12/848,825, filed Aug. 2, 2010, Tong.
U.S. Appl. No. 12/975,820, Van De Ven.
U.S. Appl. No. 13/029,063, filed Feb. 16, 2011, Hussell.
International Search Report and Written Opinion, PCT/US2009/063804, Mailed on Feb. 26, 2010.
U.S. Appl. No. 12/566,195, Van De Ven, filed Sep. 24, 2009.
U.S. Appl. No. 12/704,730, Van De Ven, filed Feb. 12, 2010.
C.Crane GEOBULB®—II LED Light Bulb, Item #2SW, Description, p. 1-2.
C.Crane GEOBULB®—II LED Light Bulb, Item #2SW, Specs, p. 1-2.
Cree LR4, 4' Recessed Architectural Downlight, Product Info p. 1-2.
U.S. Appl. No. 61/424,670, filed Dec. 19, 2010, Zongjie Yuan.
U.S. Appl. No. 11/656,759, filed Jan. 22, 2007, Chitnis.

(56) References Cited

OTHER PUBLICATIONS

U.S. Appl. No. 11/899,790, filed Sep. 7, 2007, Chitnis.
U.S. Appl. No. 11/473,089, filed Jun. 21, 2006, Tarsa.
U.S. Appl. No. 61/435,759, filed Jan. 24, 2011, Le.
U.S. Appl. No. 61/339,516, filed Mar. 3, 2010, Tong.
International Search Report and Written Opinion for PCT/US2011/000400 mailed May 2, 2011.
Cree XLAMP® XP-G LED, Product Info and Data Sheet, 14 Pages.
Cree XLAMP® XP-E LED, Product Info and Data Sheet, 20 Pages.
International Search Report and Written Opinion for PCT Application No. PCT/US2011/000397 mailed May 24, 2011.
International Search Report and Written Opinion for PCT Application No. PCT/US2010/003146 mailed Jun. 7, 2011.
Decision for Final Rejection for Japanese Patent Application No. 2001-542133 mailed Jun. 28, 2011.
Notice to Submit a Response from Korean Patent Application No. 30-2011-0008448, dated Apr. 16, 2012.
Notice to Submit a Response from Korean Patent Application No. 30-2011-0008445, dated Apr. 16, 2012.
Notice to Submit a Response from Korean Patent Application No. 30-2011-0008446, dated Apr. 16, 2012.
Office Action for Taiwanese Patent Application No. 100300961, dated May 7, 2012.
Office Action from Taiwanese Patent Application No. 100300960, dated May 7, 2012.
International Search Report and Written Opinion for PCT Application No. PCT/US2011/000399 mailed Jul. 12, 2011.
Decision to Refuse a European Patent Application for EP 09 152 962.8 dated Jul. 6, 2011.
International Search Report and Written Opinion for PCT/US2011/000403 mailed Aug. 23, 2011.
International Search Report and Written Opinion for PCT/US2011/000404 mailed Aug. 25, 2011.
International Search Report and Written Opinion for PCT/US2011/000398 mailed Aug. 30, 2011.
International Search Report and Written Opinion for PCT/US2011/000406 mailed Sep. 15, 2011.
Notice to Submit a Response from Korean Design Patent Application No. 30-2011-0024961, dated Sep. 10, 2012.
International Search Report and Written Opinion for PCT Application No. PCT/US2011/000391 mailed Oct. 6, 2011.
International Search Report and Written Opinion for PCT Application No. PCT/US2011/000402 mailed Sep. 30, 2011.
International Search Report and Written Opinion from PCT Application No. PCT/US2012/044705 dated Oct. 9, 2012.
Notice to Submit a Response from Korean Patent Application No. 30-2011-0008446, dated Oct. 22, 2012.
International Search Report and Written Opinion from PCT Application No. PCT/US2011/000390. dated May 6, 2013.
International Preliminary Report on Patentability from PCT/US2011/000390, dated May 8, 2013.
Search Report and Written Opinion from PCT Application No. PCT/US2012/072108, dated Feb. 27, 2013.
International Search Report and Written Opinion from PCT Application No. PCT/US2011/000389, dated May 6, 2013.
International Preliminary Report on Patentability from PCT/US2011/00389, dated May 8, 2013.
Reasons for Rejection from Japanese Patent Appl. No. 2011-198454, dated Mar. 7, 2013.
Decision of Dismissal of Amendment, Decision of Rejection from Japanese Patent Appl. No. 2011-231319, dated Oct. 15, 2013.
Office Action from Japanese Patent Application No. 2012-556063, dated Oct. 11, 2013.
Office Action from Japanese Patent Application No. 2012-556066, dated Oct. 25, 2013.
Office Action from Japanese Patent Application No. 2012-556065, dated Oct. 25, 2013.
Office Action from U.S. Appl. No 13/028,913, dated Nov. 4, 2013.
Office Action from Japanese Patent Appl. No. 2012-556064, dated Oct. 29, 2013.
Office Action from U.S. Appl. No. 13/029,063, dated Oct. 23, 2013.
Office Action from U.S. Appl. No. 13/028,946, dated Oct. 31, 2013.
Office Action from U.S. Appl. No. 13/029,068, dated Nov. 15, 2013.
Office Action from U.S. Appl. No. 13/029,025, dated Dec. 6, 2013.
Notice of Reasons for Rejection from Japanese Patent Appl. No. 2012-543086, dated Aug. 27, 2013.
Office Action from U.S. Appl. No. 13/028,946, dated Jul. 16, 2012.
Response to OA from U.S. Appl. No. 13/028,946, filed Oct. 8, 2012.
Office Action from U.S. Appl. No. 13/029,025, dated Jul. 16, 2013.
Office Action from U.S. Appl. No. 13/430,478, dated Jun. 18, 2013.
Office Action from U.S. Appl. No. 13/018,291, dated Oct. 10, 2012.
Response to OA from U.S. Appl. No. 13/018,291, filed Jan. 7, 2013.
Office Action from U.S. Appl. No. 13/022,490, dated Nov. 7, 2012.
Response to OA from U.S. Appl. No. 13/022,490, filed Feb. 1, 2013
Office Action from U.S. Appl. No. 13/034,501, dated Dec. 3, 2012.
Response to OA from U.S. Appl. No. 13/034,501, filed Apr. 3, 2013.
Office Action from U.S. Appl. No. 13/028,946, dated Dec. 4, 2012.
Response to OA from U.S. Appl. No. 13/028,946, filed Jan. 29, 2013.
Office Action from U.S. Appl. No. 13/029,005, dated Jan. 24, 2013
Response to OA from U.S. Appl. No. 13/029,005, filed Apr. 17, 2013.
Office Action from U.S. Appl. No. 12/985,275, dated Feb. 28, 2013.
Response to OA from U.S. Appl. No. 12/985,275, filed May 28, 2013.
Office Action from U.S. Appl. No. 13/018,291, dated Mar. 20, 2013.
Response to OA from U.S. Appl. No. 13/018,291, filed May 20, 2013.
Office Action from U.S. Appl. No. 13/022,490, dated Apr. 2, 2013.
Office Action from U.S. Appl. No. 13/018,291, dated May 31, 2013.
Office Action from U.S. Appl. No. 12/636,958, dated Jul. 19, 2012.
Response to OA from U.S. Appl. No. 12/636,958, filed Nov. 19, 2012.
Office Action from U.S. Appl. No 13/054,501, dated May 31, 2013.
Office Action from U.S. Appl. No. 13/028,946, filed Apr. 11, 2013.
Office Action from U.S. Appl. No. 13/028,913, dated Apr. 29, 2013.
Office Action from U.S. Appl. No. 13/029,005, dated Jan. 4, 2013.
Office Action from U.S. Appl. No. 12/848,825, dated Nov. 5, 2012.
Response to OA from U.S. Appl. No. 12/848,825, filed Feb. 5, 2013.
Office Action from U.S. Appl. No. 13/029,005, dated Jun. 11, 2013.
Notice of Reasons for Rejection from Japanese Patent Appl. No. 2012-543086, dated Dec. 24, 2013.
Office Action from Japanese Patent Appl. No. 2012-556062, dated Dec. 20, 2013.
International Preliminary Report on Patentability and Written Opinion from PCT/US2012/044705 dated Jan. 7, 2014.
Office Action from Japanese Patent Appl. No. 2012-556066, dated Mar. 14, 2014.
Office Action from U.S. Appl. No. 13/029,063, dated Apr. 1, 2014.
Office Action from U.S. Appl. No. 12/985,275, dated Apr. 10, 2014.
Office Action from U.S. Appl. No. 13/029,068, dated Apr. 24, 2014.
Office Action from U.S. Appl. No. 13/034,501, dated May 5, 2014.
Office Action from U.S. Appl. No. 13/022,490, dated May 6, 2014.
Office Action from U.S. Appl. No. 13/028,863, dated May 9, 2014.
First Office Action from Chinese Patent Application No. 2011800207069, dated May 5, 2014.
First Office Action from Chinese Patent Application No. 201180022606, dated May 4, 2014.
First Office Action from Chinese Patent Appl. No. 201180020709.2, dated May 4, 2014.
Office Action from U.S. Appl. No. 13/028,946, dated May 27, 2014.
Office Action from U.S. Appl. No. 13/028,913, dated May 22, 2014.
Office Action from Japanese Patent appl. No. 2012-556063, dated Jan. 28, 2014.
Comments on the Written Opinion and Amendment of the Application from European Patent appl. No. 12740244.4, dated Feb. 20, 2014.
International Search Report and Written Opinion from PCT/US2013/057712 dated Feb. 4, 2014.
Office Action from U.S. Appl. No. 11/149,999, dated Jan. 15, 2014.
Office Action from U.S. Appl. No. 13/034,501, dated Jan. 23, 2014.
Office Action from U.S. Appl. No. 13/022,490, dated Oct. 17, 2013.
Office Action from U.S. Appl. No. 11/149,999, dated May 13, 2013.
Response to OA from U.S. Appl. No. 11/149,999, filed Sep. 13, 2013.
Office Action from U.S. Appl. No. 12/985,275, dated Aug. 27, 2013.
Office Action from U.S. Appl. No. 13/358,901, dated Oct. 9, 2013.
Office Action from U.S. Appl. No. 13/028,863, dated Jul. 30, 2013.

(56) References Cited

OTHER PUBLICATIONS

First Office Action from Chinese Patent Appl. No. 201080062056.X, dated Feb. 12, 2014.
Office Action from U.S. Appl. No. 13/028,913, dated Feb. 19, 2014.
Office Action from U.S. Appl. No. 13/028,863, dated Mar. 4, 2014.
Office Action from U.S. Appl. No. 13/430,478, dated Feb. 21, 2014.
Office Action from U.S. Appl. No. 13/358,901, dated Mar. 6, 2014.
Office Action from U.S. Appl. No. 13/018,291, dated Mar. 7, 2014.
Office Action from U.S. Appl. No. 13/029,025, dated Mar. 19, 2014.
Second Office Action from Chinese Appl. No. 201080062056.X, dated Sep. 29, 2014.
First Office Action and Search Report from Chinese Appl. No. 2011800223856, dated Aug. 1, 2014.
Communication from European Appl. No. 12816621.2-1757, dated Sep. 25, 2014.
Pretrial Report from Japanese Patent Appl. No. 2011-231319, dated Apr. 14, 2014.
Office Action from U.S. Appl. No. 13/029,068, dated Jun. 13, 2014.
Office Action from U.S. Appl. No. 13/018,245, dated Jun. 10, 2014.
Decision to Grant from Japanese Patent Appl. No. 2012-556066, dated Jul. 4, 2014.
Decision of Rejection from Japanese Patent Appl. No. 2012-556064, dated Jun. 6, 2014.
Office Action from Japanese Patent Appl. No. 2012-556062, dated Aug. 5, 2014.
First Office Action from Chinese Patent Appl. No. 2011800223856, dated Aug. 1, 2014.
First Office Action from Chinese Patent Appl. No. 2011800226248, dated Aug. 25, 2014.
Official Action from European Patent Appl. No 11710348.1-1757, dated Oct. 9, 2014.
Office Action from Japanese Patent Appl. No. 2012-556065, dated Aug. 5, 2014.
First Office Action from Chinese Patent App. No. 2011800223837, dated Jul. 24, 2014.
Office Action from European Patent Appl. No. 11710906.6-1757, dated Sep. 10, 2014.
First Office Action and Search Report from Chinese Patent Appl. No. 201180022620X. dated Jul. 1, 2014.
Office Action from U.S. Appl. No. 13/358,901, dated Jul. 15, 2014.
Response to OA from U.S. Appl. No. 13/358,901, filed Aug. 21, 2014.
Office Action from U.S. Appl. No. 13/340,478, dated Jul. 23, 2014.
Office Action from U.S. Appl. No. 14/014,272, dated Jul. 29, 2014.
Office Action from U.S. Appl. No. 13/029,025, dated Aug. 6, 2014.
Office Action from U.S. Appl. No. 12/985,275, dated Aug. 7, 2014.
First Office Action from Chinese Appl. No. 201180022626.7. dated Nov. 15, 2014.
Second Office Action from Chinese Appl. No. 201180022606X, dated Dec. 23, 2014.
Appeal Decision from Japanese Appl. No. 2011-231319, dated Jan. 13, 2015.
Office Action from U.S. Appl. No. 13/607,300, dated Nov. 19, 2014.
Office Action from U.S. Appl. No. 13/029,025, dated Dec. 11, 2014.
Office Action from U.S. Appl. No. 13/018,245, dated Dec. 11, 2014.
Office Action from U.S. Appl. No. 13/029,068, dated Dec. 23, 2014.
Office Action from U.S. Appl. No. 12/985,275, dated Dec. 29, 2014.
Office Action from Taiwanese Appl. No. 100107047, dated Jun. 5, 2015.
Second Office Action from Chinese Patent Appl. No. 2011800223856, dated Apr. 16, 2015.
Office Action from Taiwanese Patent Appl. No. 100107048, dated Apr. 24, 2015.
Notice of Decline of Amendments and Final Office Action from Japanese Appl. No. 2012-556065.
Second Office Action from Chinese Patent Appl. No. 2011800223837, dated Apr. 13, 2015.
Communication from European Patent Appl. No. 13762957.2-1757, dated Apr. 30, 2015.
Office Action and Search Report from Taiwanese Patent Appl. No. 100107051, dated May 12, 2015.
Third Office Action from Chinese Patent Appl. No. 2011800207069, dated Apr. 13, 2015.
Second Office Action from Chinese Patent Appl. No. 2011800226248, dated May 4, 2015.
Second Office Action from Chinese Appl. No. 201180022620X, dated Apr. 20, 2015.
Office Action from Taiwanese Appl. No. 100107040, dated Jun. 5, 2015.
Office Action from Taiwanese Patent Appl. No. 10420724800, dated Jun. 2, 2015.
Office Action from U.S. Appl. No. 13/029,068, dated Mar. 31, 2015.
Office Action from U.S. Appl. No. 11/149,999, dated Mar. 31, 2015.
Office Action from U.S. Appl. No. 12/985,275, dated Apr. 3, 2015.
Office Action from U.S. Appl. No. 13/430,478, dated Apr. 22, 2015.
Office Action from U.S. Appl. No. 13/029,025, dated Apr. 29, 2015.
Office Action from U.S. Appl. No. 13/018,245, dated May 28, 2015.
Office Action from U.S. Appl. No. 13/028,863, dated Jun. 3, 2015.
Office Action from U.S. Appl. No. 13/758,763, dated Jun. 5, 2015.
Office Action from U.S. Appl. No. 14/185,123, dated Jun. 9, 2015.
Summons to Oral Proceedings from European Patent Appl. No. 09152962/2166580, dated Jan. 29, 2015.
First Office Action from Chinese Patent Appl. No. 2011800225832, dated Jan. 20, 2015.
First Office Action from Chinese Patent Appl. No. 2011800226214, dated Dec. 25, 2014.
Second Office Action and Search Report from Chinese Patent Appl. No. 2011800207092, dated Jan. 22, 2015.
Examination Report from European Patent Appl. No. 11 710 348.1-1757, dated Feb. 18, 2015.
Examination Report from European Patent Appl. No. 11 710 906.6-1757, dated Feb. 18, 2015.
Examination Report from European Patent Appl. No. 12 740 244.4-1757, dated Feb. 9, 2015.
Office Action from U.S. Appl. No. 13/029,063, dated Jan. 13, 2015.
Office Action from U.S. Appl. No. 14/014,272, dated Jan. 14, 2015.
Response to OA from U.S. Appl. No. 14/014,272, filed Mar. 3, 2015.
Office Action from U.S. Appl. No. 13/029,068, dated Sep. 26, 2014.
Response to OA from U.S. Appl. No. 13/029,068, filed Nov. 18, 2014.
Office Action from U.S. Appl. No. 13/358,901, dated Oct. 31, 2014.
Office Action from U.S. Appl. No. 13/430,478, dated Nov. 5, 2014.
Office Action from U.S. Appl. No. 13/034,501, dated Nov. 5, 2014.
Office Action from U.S. Appl. No. 13/028,663, dated Nov. 10, 2014.
Decision to Grant from Japanese Appl. No. 2012-556062, dated Nov. 27, 2014.
Second Office Action from Chinese Patent Appl. No. 2011800207069, dated Dec. 5, 2014.
Office Action from Japanese Patent Appl. No. 2014-122643, dated Apr. 10, 2015.
Search Report and Office Action from Taiwanese Patent Appl. No. 099143827, dated Jun. 12, 2015.
Office Action from Taiwanese Patent Appl. No. 100107012, dated Jul. 22, 2015.
Decision of Board of Appeal and Minutes of Oral Proceedings from European Appl. No. 09152962. dated Jun. 2, 2015.
Decision to Grant from Chinese Patent Appl. No. 201080062056.X, dated Jul. 6, 2015.
Office Action from Taiwanese Appl. No. 101107038, dated Jul. 21, 2015.
Office Action from Taiwanese Patent Appl. No. 100107042, dated Jun. 2, 2015.
Office Action from Taiwanese Patent Appl. No. 100107047, dated Jun. 2, 2015.
Office Action from Taiwanese Patent Appl. No. 100107040, dated Jun. 2, 2015.
Office Action from Taiwanese Patent Appl. No. 100107044. dated Jun. 1, 2015.
Third Office Action from Chinese Patent Appl. No. 201180022606X, dated Jun. 10, 2015.
Third Office Action from Chinese Patent Appl. No. 2011800207092. dated Jul. 13, 2015.

(56) References Cited

OTHER PUBLICATIONS

Notice of Allowance from Japanese Patent Appl. No. 2014-122643, dated Sep. 3. 2015.
Notification of the Fourth Office Action from Chinese Patent Appl. No. 2011800207069, dated Aug. 24, 2015.
Decision of Rejection from Japanese Patent Appl. No. 2012-566065. dated Aug. 18, 2015.
Office Action from U.S. Appl. No. 13/029,025. dated Aug. 17, 2015.
Office Action from U.S. Appl. No. 13/430,478, dated Aug. 27, 2015.
Office Action from U.S. Appl. No. 12/985,275, dated Sep. 2, 2015.
Office Action from U.S. Appl. No. 13/029,068, dated Sep. 8, 2015.
Office Action from U.S. Appl. No. 13/029.063, dated Sep. 17, 2015.
Office Action from U.S. Appl. No. 11/149,999, dated Oct. 1, 2015.
Second Office Action from Chinese Patent Appl. 2011800226267, dated Aug. 3, 2015.

* cited by examiner

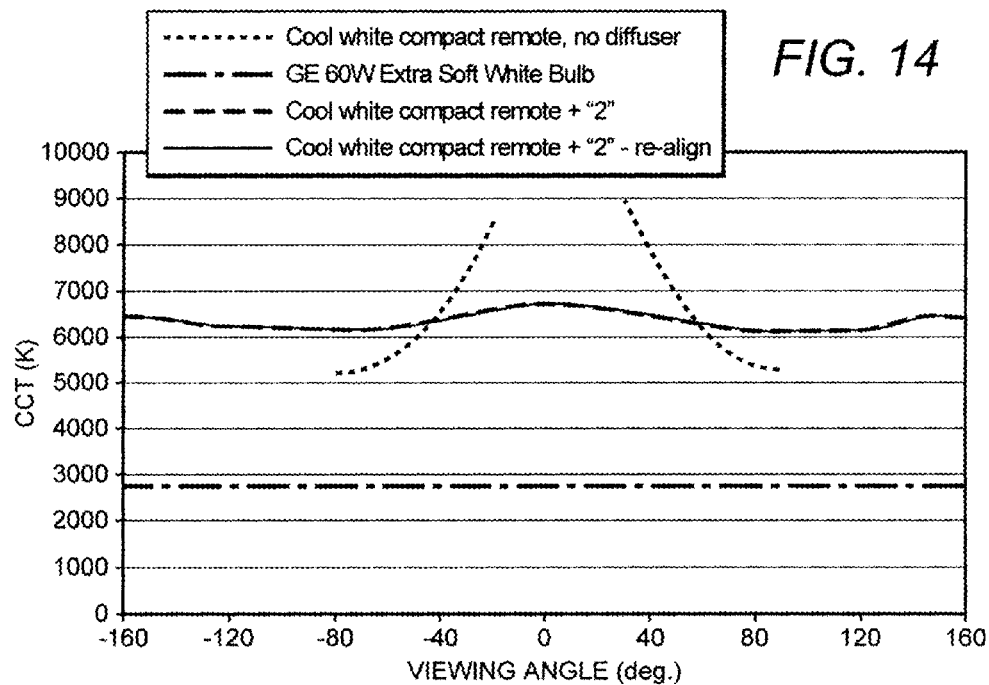
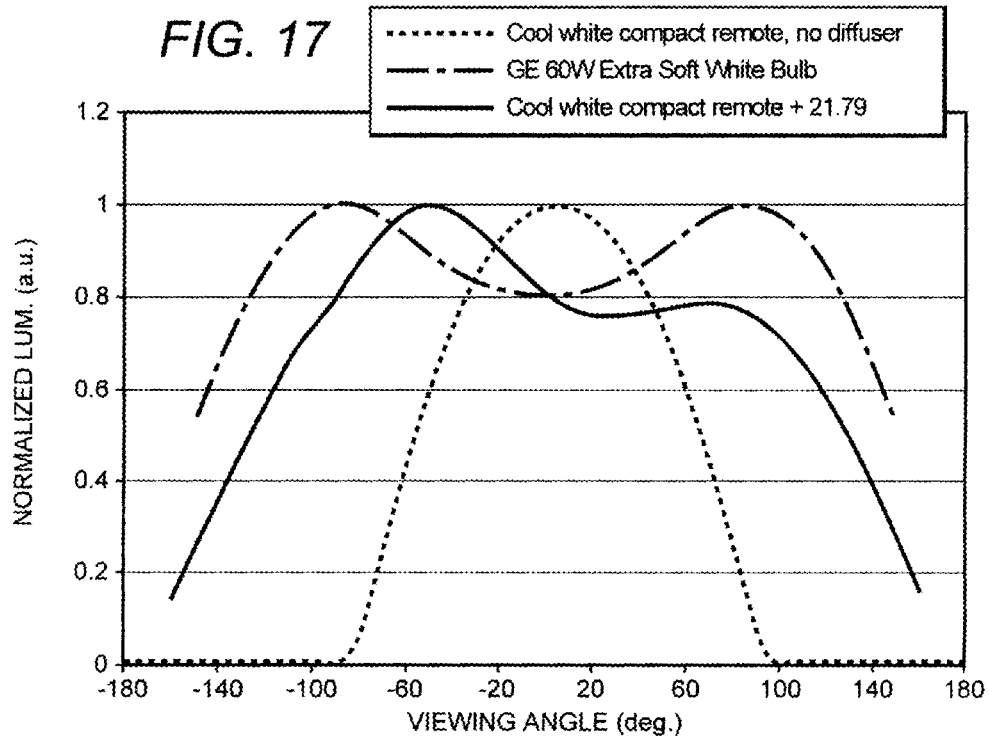

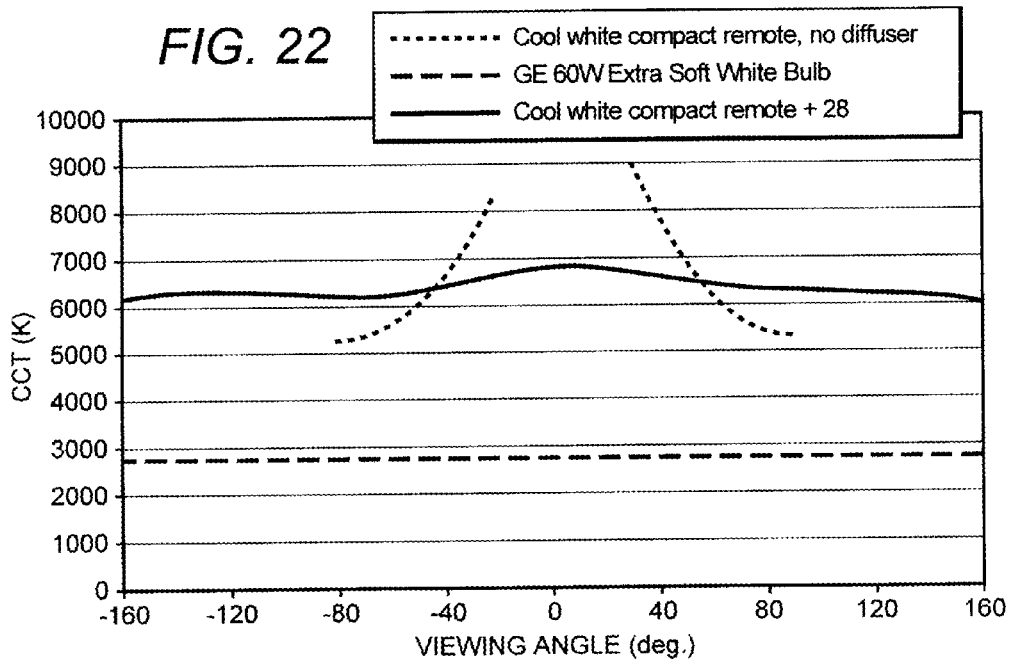
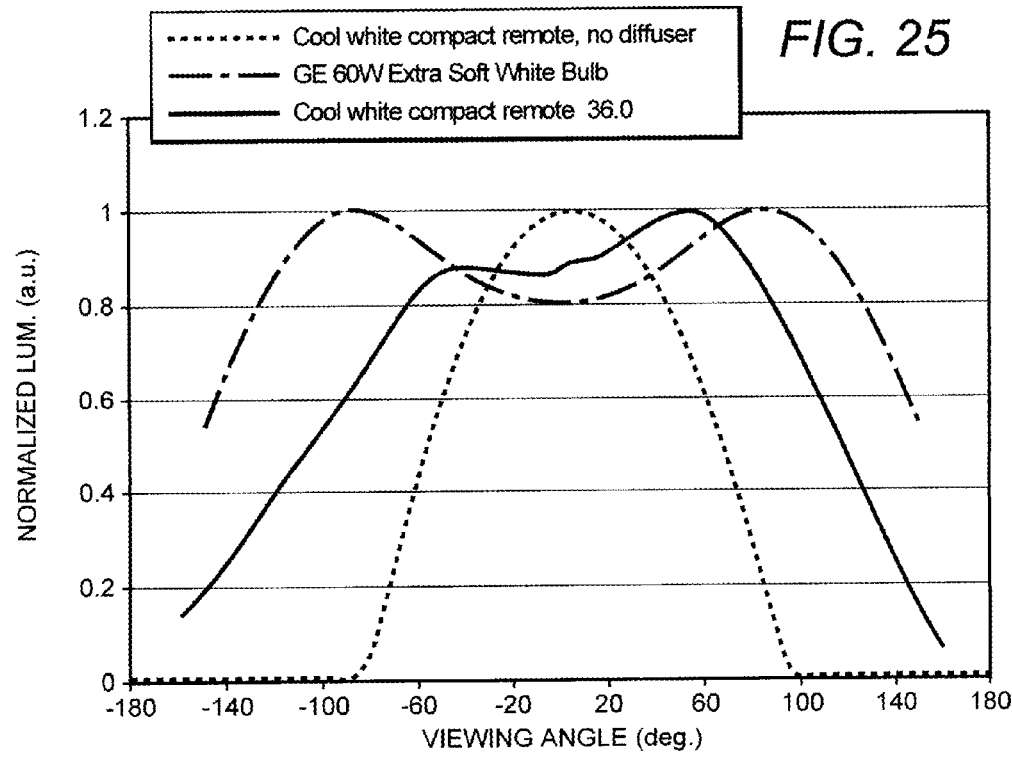

| COOL WHITE COMPACT REMOTE + | 28 | |
|---|---|---|
| | RESULT | E-STAR |
| FORWARD FLUX (<90°) | 63.1% | |
| BACKWARD FLUX (>90°) | 36.9% | |
| FLUX > 135° | 4.9% | >5% |
| MAX TO AVG. DIFF. 0° TO 135° | 17.5% | <20% |
| MIN TO AVG. DIFF. 0° TO 135° | 48.1% | <20% |
| MEAS. 0°, 45°, 90° AZIMUTHS | NO | YES |

FIG. 63
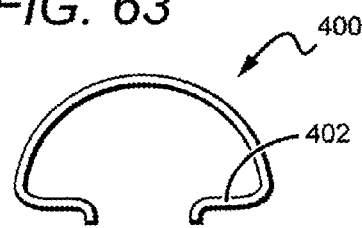
FIG. 64
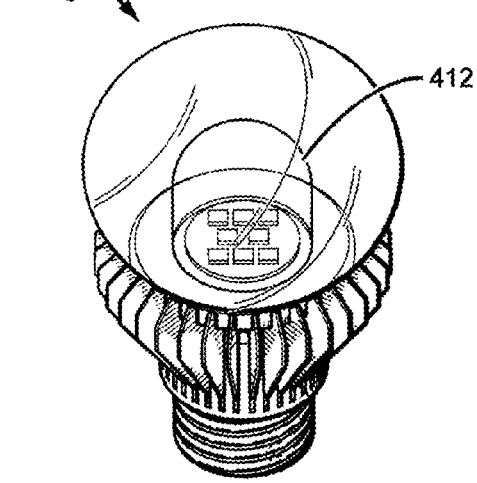
FIG. 65
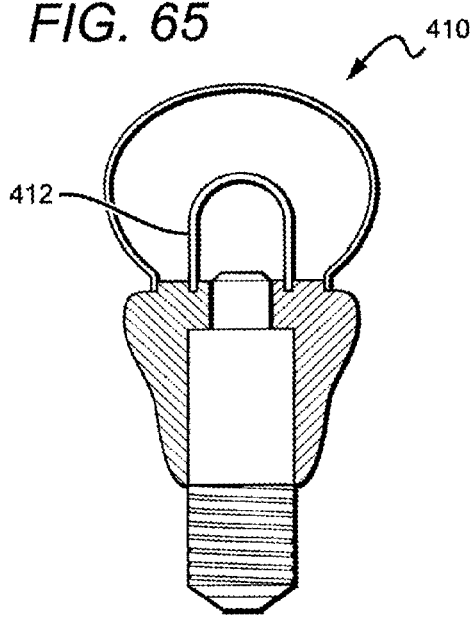
FIG. 66
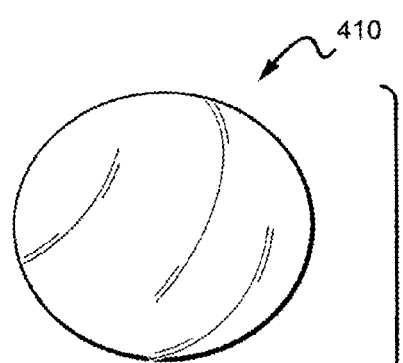
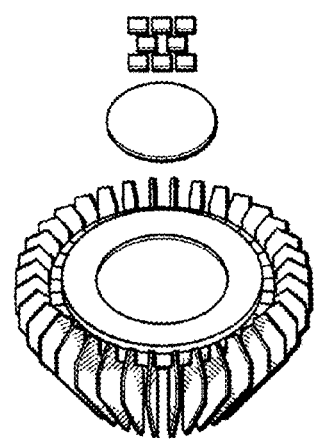
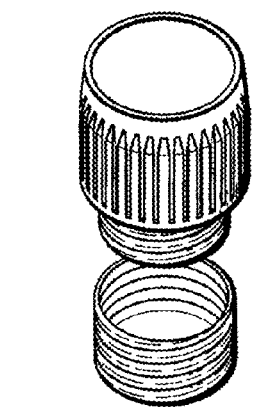

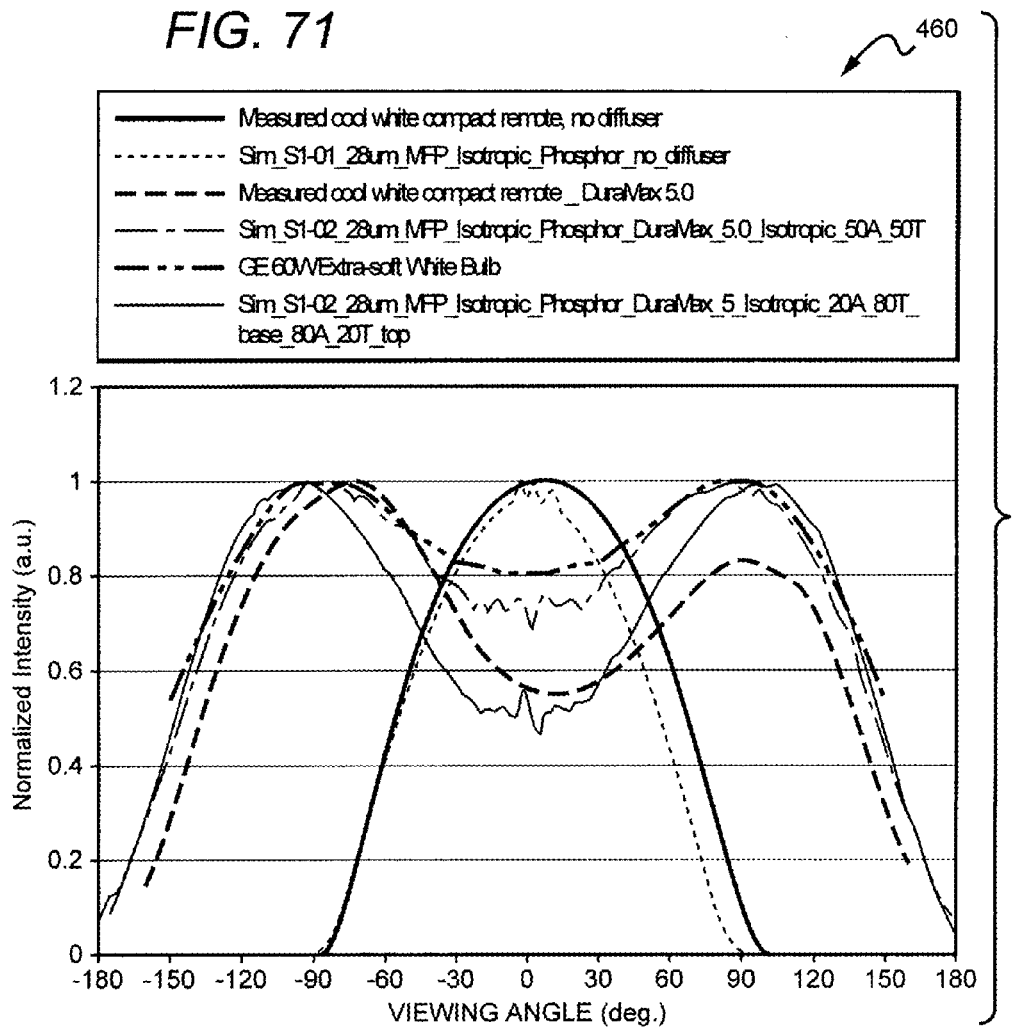
FIG. 71
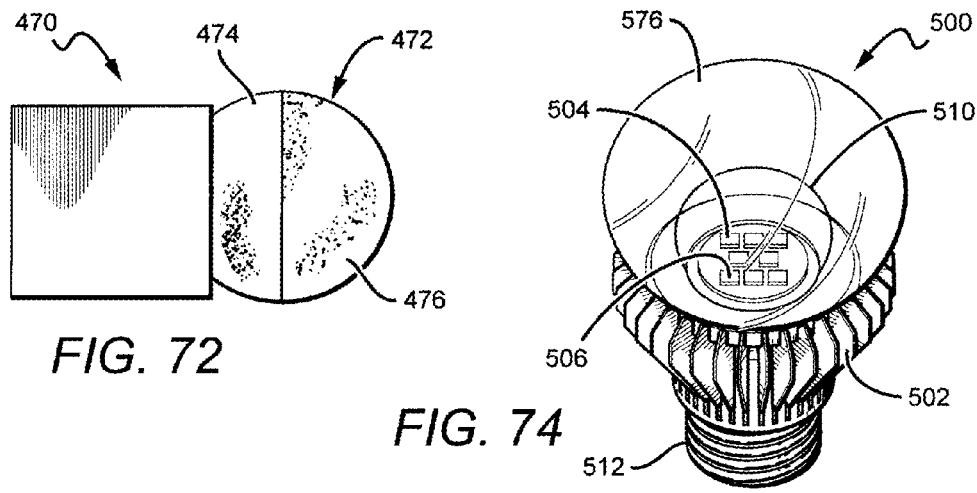
FIG. 72
FIG. 74

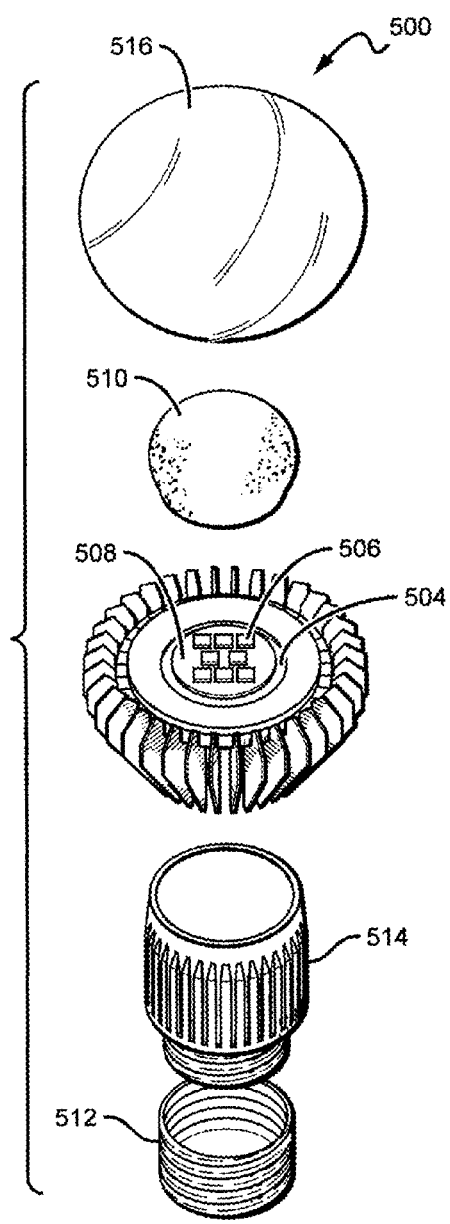
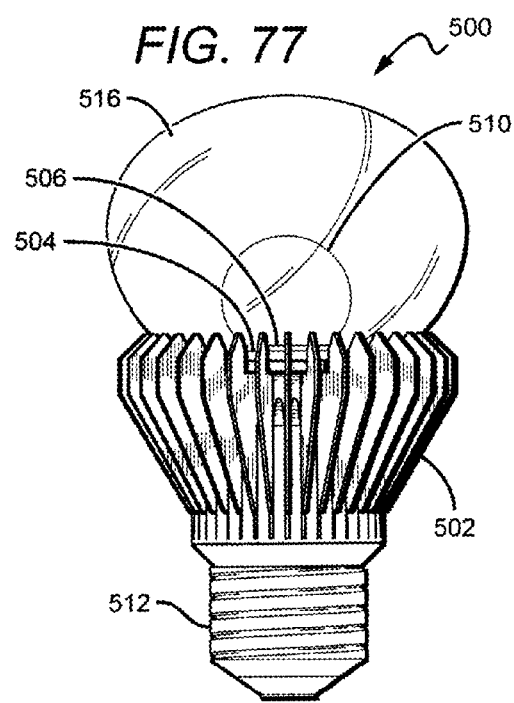
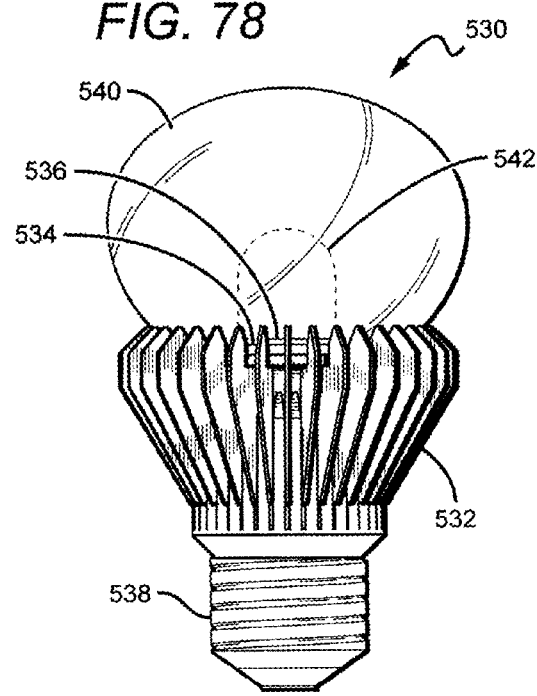
FIG. 75
FIG. 77
FIG. 78

| V5-HS+Globe24+MS2B_B2(Band Coating) | | |
|---|---|---|
| | RESULT | E-STAR |
| FORWARD FLUX (<90°) | 54.4% | |
| BACKWARD FLUX (>90°) | 45.6% | |
| FLUX > 135° | 10.2% | >5% |
| MAX TO AVG. DIFF. 0° TO 135° | 10.4% | <20% |
| MIN TO AVG. DIFF. 0° TO 135° | 16.9% | <20% |
| MEAS. 0°, 45°, 90° AZIMUTHS | NO | YES |

| Forward Source + Non-uniform Diffuser (87% Eff.) | | |
|---|---|---|
| | RESULT | E-STAR |
| FORWARD FLUX (<90°) | 53.0% | |
| BACKWARD FLUX (>90°) | 47.0% | |
| FLUX > 135° | 9.6% | >5% |
| MAX TO AVG. DIFF. 0° TO 135° | 5.6% | <20% |
| MIN TO AVG. DIFF. 0° TO 135° | 14.7% | <20% |
| MEAS. 0°, 45°, 90° AZIMUTHS | NO | YES |

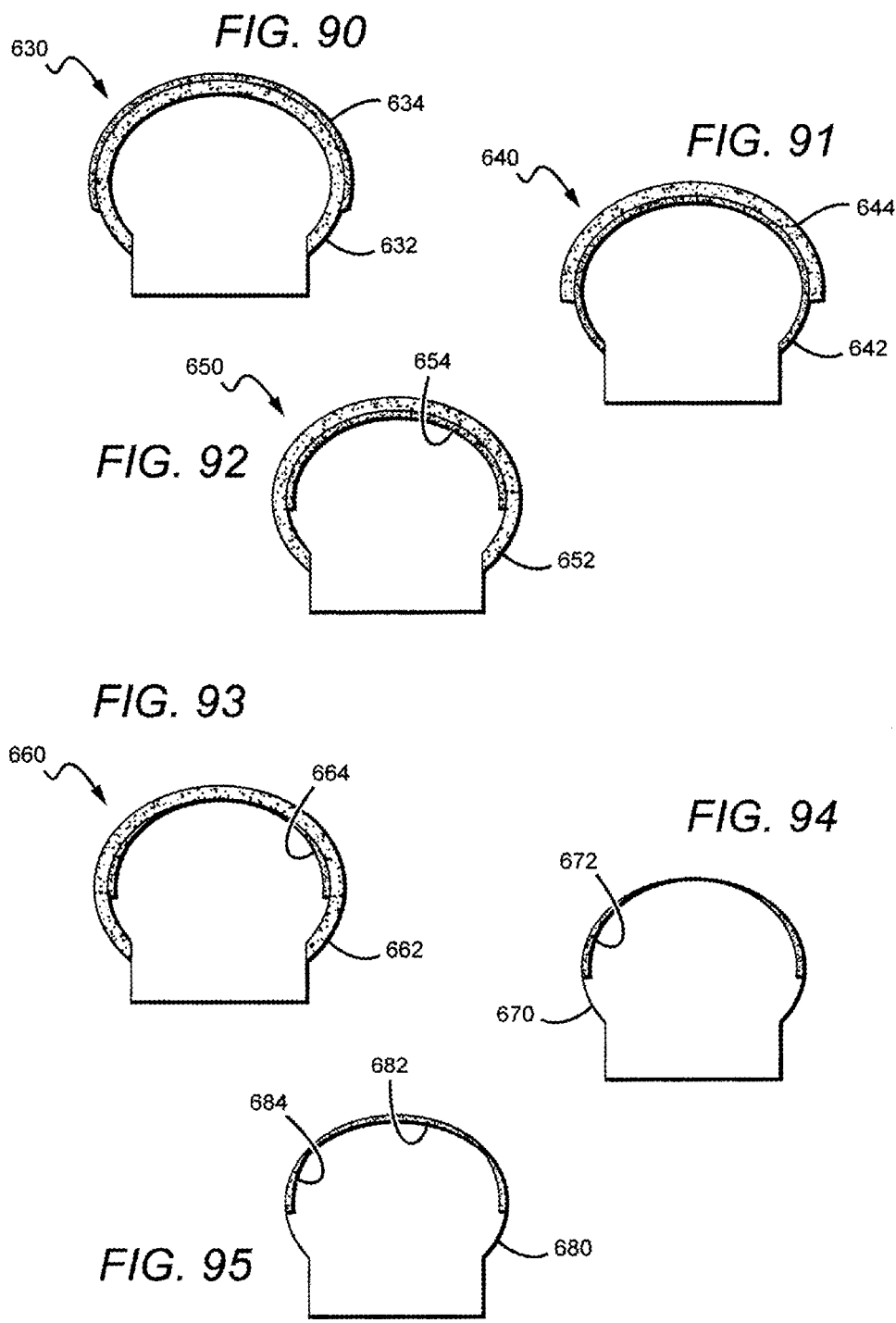

NON-UNIFORM DIFFUSER TO SCATTER LIGHT INTO UNIFORM EMISSION PATTERN

This application claims the benefit of U.S. Provisional Patent Application Ser. No. 61/339,516, filed on Mar. 3, 2010, U.S. Provisional Patent Application Ser. No. 61/339,515, filed on Mar. 3, 2010, U.S. Provisional Patent Application Ser. No. 61/386,437, filed on Sep. 24, 2010. This application is also a continuation-in-part from, and claims the benefit of, U.S. patent application Ser. No. 12/848,825, filed on Aug. 2, 2010 now U.S. Pat. No. 8,562,161, and U.S. patent application Ser. No. 12/889,719, filed on Sep. 24, 2010.

BACKGROUND OF THE INVENTION

1. Field of the Invention

This invention relates to solid state lamps and bulbs and in particular to efficient and reliable light emitting diode (LED) based lamps and bulbs capable of producing omnidirectional emission patterns.

2. Description of the Related Art

Incandescent or filament-based lamps or bulbs are commonly used as light sources for both residential and commercial facilities. However, such lamps are highly inefficient light sources, with as much as 95% of the input energy lost, primarily in the form of heat or infrared energy. One common alternative to incandescent lamps, so-called compact fluorescent lamps (CFLs), are more effective at converting electricity into light but require the use of toxic materials which, along with its various compounds, can cause both chronic and acute poisoning and can lead to environmental pollution. One solution for improving the efficiency of lamps or bulbs is to use solid state devices such as light emitting diodes (LED or LEDs), rather than metal filaments, to produce light.

Light emitting diodes generally comprise one or more active layers of semiconductor material sandwiched between oppositely doped layers. When a bias is applied across the doped layers, holes and electrons are injected into the active layer where they recombine to generate light. Light is emitted from the active layer and from various surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflective cup due to the less than 100% reflectivity of practical reflector surfaces). In addition, heat retention may be an issue for a package such as the package 10 shown in FIG. 1a, since it may be difficult to extract heat through the leads 15A, 15B.

A conventional LED package 20 illustrated in FIG. 2 may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 27 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

LED chips, such as those found in the LED package 20 of FIG. 2 can be coated by conversion material comprising one or more phosphors, with the phosphors absorbing at least some of the LED light. The LED chip can emit a different wavelength of light such that it emits a combination of light from the LED and the phosphor. The LED chip(s) can be coated with a phosphor using many different methods, with one suitable method being described in U.S. patent application Ser. Nos. 11/656,759 and 11/899,790, both to Chitnis et al. and both entitled "Wafer Level Phosphor Coating Method and Devices Fabricated Utilizing Method". Alternatively, the LEDs can be coated using other methods such as electrophoretic deposition (EPD), with a suitable EPD method described in U.S. patent application Ser. No. 11/473,089 to Tarsa et al. entitled "Close Loop Electrophoretic Deposition of Semiconductor Devices".

LED chips which have a conversion material in close proximity or as a direct coating have been used in a variety of different packages, but experience some limitations based on the structure of the devices. When the phosphor material is on or in close proximity to the LED epitaxial layers (and in some instances comprises a conformal coat over the LED), the phosphor can be subjected directly to heat generated by the chip which can cause the temperature of the phosphor material to increase. Further, in such cases the phosphor can be subjected to very high concentrations or flux of incident light from the LED. Since the conversion process is in general not 100% efficient, excess heat is produced in the phosphor layer in proportion to the incident light flux. In compact phosphor layers close to the LED chip, this can lead to substantial temperature increases in the phosphor layer as large quantities of heat are generated in small areas. This temperature increase can be exacerbated when phosphor particles are embedded in low thermal conductivity material such as silicone which does not provide an effective dissipation path for the heat generated within the phosphor particles. Such elevated operating temperatures can cause degradation of the phosphor and surrounding materials over time, as well as a reduction in phosphor conversion efficiency and a shift in conversion color.

Lamps have also been developed utilizing solid state light sources, such as LEDs, in combination with a conversion material that is separated from or remote to the LEDs. Such arrangements are disclosed in U.S. Pat. No. 6,350,041 to Tarsa et al., entitled "High Output Radial Dispersing Lamp Using a Solid State Light Source." The lamps described in this patent can comprise a solid state light source that transmits light through a separator to a disperser having a phosphor. The disperser can disperse the light in a desired pattern and/or changes its color by converting at least some of the light to a different wavelength through a phosphor or other conversion material. In some embodiments the separator spaces the light source a sufficient distance from the disperser such that heat from the light source will not transfer to the disperser when the light source is carrying elevated currents necessary for room illumination. Additional remote phosphor techniques are described in U.S. Pat. No. 7,614,759 to Negley et al., entitled "Lighting Device."

One potential disadvantage of lamps incorporating remote phosphors is that they can have undesirable visual or aesthetic characteristics. When the lamps are not generating light the lamp can have a surface color that is different from the typical white or clear appearance of the standard Edison bulb. In some instances the lamp can have a yellow or orange appearance, primarily resulting from the phosphor conversion material. This appearance can be considered undesirable for many applications where it can cause aesthetic issues with the surrounding architectural elements when the light is not illuminated. This can have a negative impact on the overall consumer acceptance of these types of lamps.

Further, compared to conformal or adjacent phosphor arrangements where heat generated in the phosphor layer during the conversion process may be conducted or dissipated via the nearby chip or substrate surfaces, remote phosphor arrangements can be subject to inadequate thermally conductive heat dissipation paths. Without an effective heat dissipation pathway, thermally isolated remote phosphors may suffer from elevated operating temperatures that in some instances can be even higher than the temperature in comparable conformal coated layers. This can offset some or all of the benefit achieved by placing the phosphor remotely with respect to the chip. Stated differently, remote phosphor placement relative to the LED chip can reduce or eliminate direct heating of the phosphor layer due to heat generated within the LED chip during operation, but the resulting phosphor temperature decrease may be offset in part or entirely due to heat generated in the phosphor layer itself during the light conversion process and lack of a suitable thermal path to dissipate this generated heat.

Another issue affecting the implementation and acceptance of lamps utilizing solid state light sources relates to the nature of the light emitted by the light source itself. In order to fabricate efficient lamps or bulbs based on LED light sources (and associated conversion layers), it is typically desirable to place the LED chips or packages in a co-planar arrangement. This facilitates manufacture and can reduce manufacturing costs by allowing the use of conventional production equipment and processes. However, co-planar arrangements of LED chips typically produce a forward directed light intensity profile (e.g., a Lambertian profile). Such beam profiles are generally not desired in applications where the solid-state lamp or bulb is intended to replace a conventional lamp such as a traditional incandescent bulb, which has a much more omni-directional beam pattern. While it is possible to mount the LED light sources or packages in a three-dimensional arrangement, such arrangements are generally difficult and expensive to fabricate.

SUMMARY OF THE INVENTION

The present invention provides lamps and bulbs generally comprising different combinations and arrangement of a light source, one or more wavelength conversion materials, regions or layers which are positioned separately or remotely with respect to the light source, and a separate diffusing layer. This arrangement allows for the fabrication of lamps and bulbs that are efficient, reliable and cost effective and can provide an essentially omni-directional emission pattern, even with a light source comprised of a co-planar arrangement of LEDs. Additionally, this arrangement allows aesthetic masking or concealment of the appearance of the conversion regions or layers when the lamp is not illuminated. Various embodiments of the invention may be used to address many of the difficulties associated with utilizing efficient solid state light sources such as LEDs in the fabrication of lamps or bulbs suitable for direct replacement of traditional incandescent bulbs. Embodiments of the invention can be arranged to fit recognized standard size profiles such as those ascribed to commonly used lamps such as incandescent light bulbs, thereby facilitating direct replacement of such bulbs. Embodiments of the invention can also comprise various arrangements having a conversion material positioned remote to the lamp light source, and diffusers can be provided over the conversion material and light source with the diffusers dispersing the light from the lamp's light source and/or conversion material into a desired pattern, such as near uniform color and/or intensity over a range of viewing angles.

By having a conversion material and diffuser remote to the light source, elevated electrical signals can also be applied to the light source which can result in increased light output but can also cause the light source to operate at higher temperatures. The distance between the light source and conversion material reduces the amount of heat generated within the light source from transferring to the phosphor or conversion material. This maintains high conversion efficiency and reliability while enabling a small chip count which leads to a lower manufacturing cost. Some embodiments can also comprise features that allow efficient conduction of conversion related heat away from the remote conversion material. The diffusers and conversion materials can have different shapes, and in some embodiments the geometry of the two can cooperate to provide a desired lamp emission pattern or uniformity.

One embodiment of a lamp according to the present invention comprising a light source emitting a substantially forward emission pattern. A diffuser is arranged to alter the substantially forward emission pattern so that the lamp emits an emission pattern more uniform than the forward emission pattern.

Another embodiment of a lamp according to the present invention comprises a light source and an optical element at least partially covering the light source so that at least some light from the light source passes through the optical element. The optical element has scattering properties that vary along at least one dimension of the optical element to modify the emission distribution of the light emitted by the light source.

One embodiment of a lighting device according to the present invention comprises a light source and a diffuser spaced from the light source. A wavelength conversion element is disposed between the light source and the diffuser and spaced from the light source and the diffuser, wherein the diffuser is shaped such that there are different distances between the diffuser and the conversion element at different emission angles.

Still another embodiment of a lighting device according to the present invention comprises a light source and a diffuser spaced from the light source. The diffuser includes areas with different diffusing characteristics. A wavelength conversion element is disposed between the light source and the diffuser and spaced from the light source and the diffuser.

These and other aspects and advantages of the invention will become apparent from the following detailed description and the accompanying drawings which illustrate by way of example the features of the invention.

BRIEF DESCRIPTION OF THE DRAWINGS

FIGS. 13 through 16 are graphs showing the emission characteristics of a lamp with the diffuser shown in FIG. 9 and flat remote phosphor disk shown schematically in FIG. 30;

FIGS. 17 through 20 are graphs showing the emission characteristics of a lamp with the diffuser shown in FIG. 10 and flat remote phosphor disk shown schematically in FIG. 30;

FIGS. 21 through 24 are graphs showing the emission characteristics of a lamp with the diffuser shown in FIG. 11 and flat remote phosphor disk shown schematically in FIG. 30;

FIGS. 25 through 28 are graphs showing the emission characteristics of a lamp with the diffuser shown in FIG. 12 and flat remote phosphor disk shown schematically in FIG. 30;

FIG. 63 is a sectional view of still another embodiment of a diffuser according to the present invention;

FIG. 64 is a perspective view of another embodiment of a lamp according to the present invention with a three-dimensional phosphor carrier;

FIG. 65 is a sectional view of the lamp shown in FIG. 64;

FIG. 66 is an exploded view of the lamp shown in FIG. 64;

FIG. 71 is graph showing the emission characteristics of the lamp in FIG. 70;

FIG. 72 is a side view of still another embodiment of a lamp according to the present invention;

FIG. 74 is a perspective view of another embodiment of a lamp according to the present invention;

FIG. 75 is a perspective exploded view of the lamp shown in FIG. 74;

FIG. 77 is a side view of the lamp shown in FIG. 74, with the phosphor carrier in phantom;

FIG. 78 is a side view of another embodiment of lamp according to the present invention with the phosphor carrier in phantom;

FIGS. 78 through 82 are side views of a diffuser dome according to the present invention;

FIGS. 90 through 95 show different embodiments of diffuser domes according to the present invention.

DETAILED DESCRIPTION OF THE INVENTION

Figure 1:
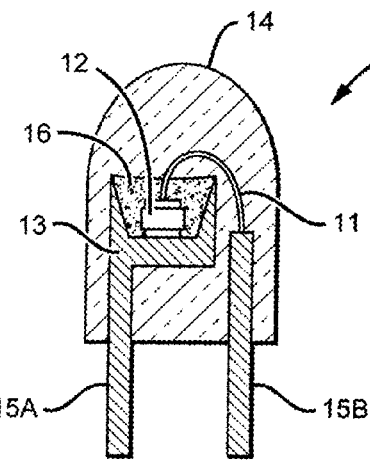
FIG. 1 shows a sectional view of one embodiment of a prior art LED lamp.
Figure 2:
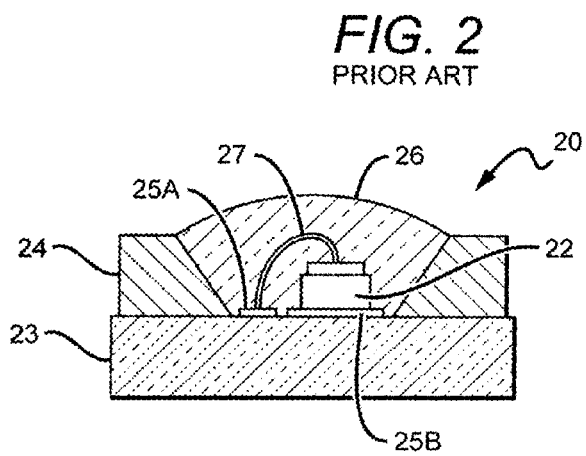
FIG. 2 shows a sectional view of another embodiment of a prior art LED lamp.

The present invention is directed to different embodiments of lamp or bulb structures that are efficient, reliable and cost effective, and that in some embodiments can provide a substantially omnidirectional emission pattern from different light sources such directional or forward emitting light. The present invention is also directed to lamp structures using solid state emitters with remote conversion materials (or phosphors) and remote diffusing elements or diffusers. In some embodiments, the diffuser not only serves to mask the phosphor from the view by the lamp user, but can also disperse or redistribute the light from the remote phosphor and/or the lamp's light source into a desired emission pattern. In some embodiments the diffuser can comprise a dome and can be arranged to disperse forward directed emission pattern into a more omnidirectional pattern useful for general lighting applications. The diffuser can be used in embodiments having two-dimensional as well as three-dimensional shaped remote conversion materials, with a combination of features capable of transforming forward directed emission from an LED light source into a beam profile comparable with standard incandescent bulbs.

The present invention is described herein with reference to conversion materials, wavelength conversion materials, remote phosphors, phosphors, phosphor layers and related terms. The use of these terms should not be construed as limiting. It is understood that the use of the term remote phosphors, phosphor or phosphor layers is meant to encompass and be equally applicable to all wavelength conversion materials.

Some embodiments of lamps can have a dome-shaped (or frusto-spherical shaped) three dimensional conversion material over and spaced apart from the light source, and a dome-shaped diffuser spaced apart from and over the conversion material, such that the lamp exhibits a double-dome structure. The spaces between the various structures can comprise light mixing chambers that can promote not only dispersion of, but also color uniformity of the lamp emission. The space between the light source and conversion material, as well as the space between the conversion material, can serve as light mixing chambers. Other embodiments can comprise additional conversion materials or diffusers that can form additional mixing chambers. The order of the dome conversion materials and dome shaped diffusers can be different such that some embodiments can have a diffuser inside a conversion material, with the spaces between forming light mixing chambers. These are only a few of the many different conversion material and diffuser arrangement according to the present invention.

Some lamp embodiments according to the present invention can comprise a light source having a co-planar arrangement of one or more LED chips or packages, with the emitters being mounted on a flat or planar surface. In other embodiments, the LED chips can be non co-planar, such as being on a pedestal or other three-dimensional structure. Co-planar light sources can reduce the complexity of the emitter arrangement, making them both easier and cheaper to manufacture. Co-planar light sources, however, tend to emit primarily in the forward direction such as in a Lambertian emission pattern. In different embodiments it can be desirable to emit a light pattern mimicking that of conventional incandescent light bulbs that can provide nearly uniform emission intensity and color uniformity at different emission angles. Different embodiments of the present invention can comprise features that can transform the emission pattern from the non-uniform to substantially uniform within a range of viewing angles.

In some embodiments, a conversion layer or region that can comprise a planar or three-dimensional phosphor carrier made of a thermally conductive material that is at least partially transparent to light from the light source. It and also comprise at least one phosphor material each of which can absorb light from the light source and emits a different wavelength of light. The diffuser can comprise a scattering film/particles and associated carrier such as a glass enclosure, and can serve to scatter or re-direct at least some of the light emitted by the light source and/or phosphor carrier to provide a desired emission profile. In some embodiments the lamps according to the present invention can emit a beam profile compatible with standard incandescent bulbs.

The properties of the diffuser, such as geometry, scattering properties of the scattering layer, surface roughness or smoothness, and spatial distribution of the scattering layer properties may be used to control various lamp properties such as color uniformity and light intensity distribution as a function of viewing angle. The diffuser can comprise scattering elements arranged in many different ways, with some embodiments having scattering elements that provide scattering properties that vary along at least one dimension of the diffuser. In some embodiments the variation can be due to changes in the scattering nature of the surfaces and/or variations in the amount of scattering material along that particular dimension. The diffuser can further comprise an optical element that at least partially encloses a light source, with the optical element having scattering properties that vary along at least one dimension. The varying scattering properties can be arranged to vary the emission pattern from the light source to produce a desired lamp emission pattern. In some embodiments the varying scattering elements can modify the angular distribution of light emitted by the light source.

It is understood the diffusers according to the present invention can at least partially surround a light source, with a phosphor carrier between the light source and the diffuser. The phosphor carriers can comprise both planar and three-dimensional light sources. The diffusion properties of the phosphor carrier along with those of the diffuser can transform the emission pattern of the light source into a desired lamp emission pattern. In some embodiments, the light source can provide a generally forward directed or Lambertian emission pattern, and the diffusion properties of the phosphor carrier and the diffuser can transform the light source emission pattern to a generally uniform emission pattern. Generally uniform can mean emission intensity variation at different viewing angles that is within a desired variation percentage.

The diffuser can also provide a generally white appearance to the user, and can mask the features below or within the diffuser. The can include the phosphor carrier and other internal lamp features which provides a desired and commercially acceptable overall lamp appearance when the lamp or bulb is not illuminated. Stated differently, the color of the phosphor carrier and the emitters of the lamp will not be visible when the lamp is not illuminated.

A heat sink structure can be included which can be in thermal contact with the light source and with the phosphor carrier in order to dissipate heat generated within the light source and phosphor layer into the surrounding ambient. Electronic circuits may also be included to provide electrical power to the light source and other capabilities such as dimming, etc., and the circuits may include a means by which to apply power to the lamp, such as an Edison socket, etc.

Figure 3:
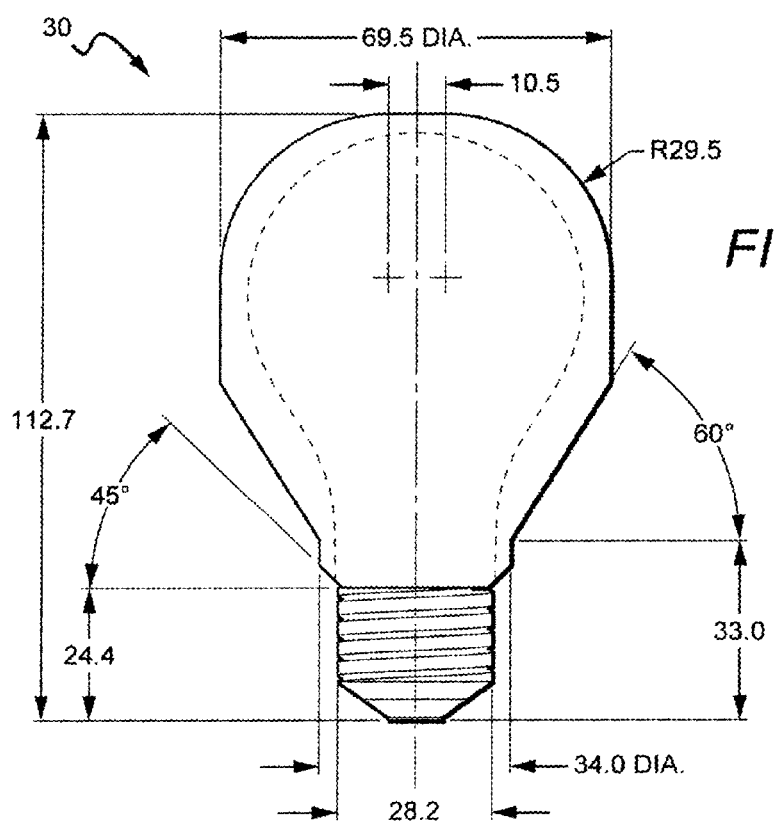
FIG. 3 shows the size specifications for an A19 replacement bulb.

Different embodiments of the lamps can have many different shapes and sizes, with some embodiments having dimensions to fit into standard size envelopes, such as the A19 size envelope 30 as shown in FIG. 3. This makes the lamps particularly useful as replacements for conventional incandescent and fluorescent lamps or bulbs, with lamps according to the present invention experiencing the reduced energy consumption and long life provided from their solid state light sources. The lamps according to the present invention can also fit other types of standard size profiles including but not limited to A21 and A23.

In some embodiments the light sources can comprise solid state light sources, such as different types of LEDs, LED chips or LED packages. In some embodiments a single LED chip or package can be used, while in others multiple LED chips or packages can be used arranged in different types of arrays. By having the phosphor thermally isolated from LED chips and with good thermal dissipation, the LED chips can be driven by higher current levels without causing detrimental effects to the conversion efficiency of the phosphor and its long term reliability. This can allow for the flexibility to overdrive the LED chips to lower the number of LEDs needed to produce the desired luminous flux. This in turn can reduce the cost on complexity of the lamps. These LED packages can comprise LEDs encapsulated with a material that can withstand the elevated luminous flux or can comprise unencapsulated LEDs.

In some embodiments the light source can comprise one or more blue emitting LEDs and the phosphor layer in the phosphor carrier can comprise one or more materials that absorb a portion of the blue light and emit one or more different wavelengths of light such that the lamp emits a white light combination from the blue LED and the conversion material. The conversion material can absorb the blue LED light and emit different colors of light including but not limited to yellow and green. The light source can also comprise different LEDs and conversion materials emitting different colors of light so that the lamp emits light with the desired characteristics such as color temperature and color rendering.

Conventional lamps incorporating both red and blue LEDs chips can be subject to color instability with different operating temperatures and dimming. This can be due to the different behaviors of red and blue LEDs at different temperature and operating power (current/voltage), as well as different operating characteristics over time. This effect can be mitigated somewhat through the implementation of an active control system that can add cost and complexity to the overall lamp. Different embodiments according to the present invention can address this issue by having a light source with the same type of emitters in combination with a remote phosphor carrier that can comprise multiple layers of phosphors that remain relatively cool through the thermal dissipation arrangements disclosed herein. In some embodiments, the remote phosphor carrier can absorb light from the emitters and can re-emit different colors of light, while still experiencing the efficiency and reliability of reduced operating temperature for the phosphors.

The separation of the phosphor elements from the LEDs provides that added advantage of easier and more consistent color binning. This can be achieved in a number of ways. LEDs from various bins (e.g. blue LEDs from various bins) can be assembled together to achieve substantially wavelength uniform excitation sources that can be used in different lamps. These can then be combined with phosphor carriers having substantially the same conversion characteristics to provide lamps emitting light within the desired bin. In addition, numerous phosphor carriers can be manufactured and pre-binned according to their different conversion characteristics. Different phosphor carriers can be combined with light sources emitting different characteristics to provide a lamp emitting light within a target color bin.

Some lamps according to the present invention can also provide for improved emission efficiency by surrounding the light source by a reflective surface. This results in enhanced photon recycling by reflecting much of the light re-emitted from the conversion material back toward the light source. To further enhance efficiency and to provide the desired emission profile, the surfaces of the phosphor layer, carrier layer or diffuser can be smooth or scattering. In some embodiments, the internal surfaces of the carrier layer and diffuser can be optically smooth to promote total internal reflecting behavior that reduces the amount of light directed backward from the phosphor layer (either downconverted light or scattered light). This reduces the amount of backward emitted light that can be absorbed by the lamp's LED chips, associated substrate, or other non-ideal reflecting surfaces within the interior of the lamp.

The present invention is described herein with reference to certain embodiments, but it is understood that the invention can be embodied in many different forms and should not be construed as limited to the embodiments set forth herein. In particular, the present invention is described below in regards to certain lamps having one or multiple LEDs or LED chips or LED packages in different configurations, but it is understood that the present invention can be used for many other lamps having many different configurations. The embodiments below are described with reference to LED of LEDs, but it is understood that this is meant to encompass LED chips and LED packages. The components can have different shapes and sizes beyond those shown and different numbers of LEDs can be included. It is also understood that the embodiments described below are utilize co-planar light sources, but it is understood that non co-planar light sources can also be used. It is also understood that the lamp's LED light source may be comprised of one or multiple LEDs, and in embodiments with more than one LED, the LEDs may have different emission wavelengths. Similarly, some LEDs may have adjacent or contacting phosphor layers or regions, while others may have either adjacent phosphor layers of different composition or no phosphor layer at all.

The present invention is described herein with reference to conversion materials, phosphor layers and phosphor carriers and diffusers being remote to one another. Remote in this context refers being spaced apart from and/or to not being on or in direct thermal contact.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 4:
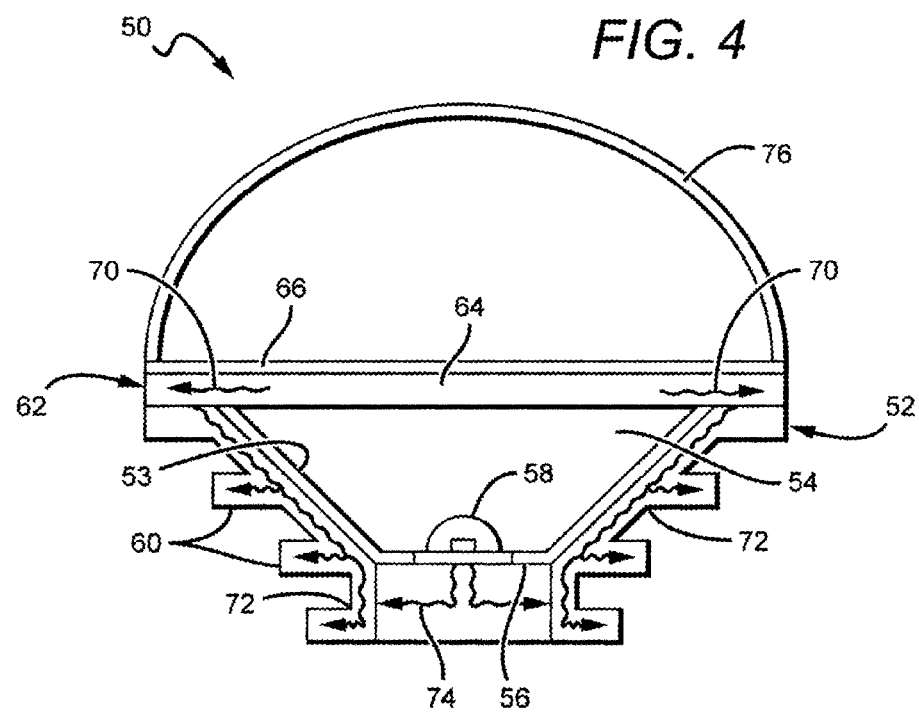
FIG. 4 is a sectional view of one embodiment of a lamp according to the present invention.

FIG. 4 shows one embodiment of a lamp 50 according to the present invention that comprises a heat sink structure 52 having an optical cavity 54 with a platform 56 for holding a light source 58. Although this embodiment and some embodiments below are described with reference to an optical cavity, it is understood that many other embodiments can be provided without optical cavities. These can include, but are not limited to, light sources being on a planar surface of the lamp structure or on a pedestal. The light source 58 can comprise many different emitters with the embodiment shown comprising an LED. Many different commercially available LED chips or LED packages can be used including but not limited to those commercially available from Cree, Inc. located in Durham, N.C. It is understood that lamp embodiments can be provided without an optical cavity, with the LEDs mounted in different ways in these other embodiments. By way of example, the light source can be mounted to a planar surface in the lamp or a pedestal can be provided for holding the LEDs.

The light source 58 can be mounted to the platform using many different known mounting methods and materials with light from the light source 58 emitting out the top opening of the cavity 54. In some embodiments light source 58 can be mounted directly to the platform 56, while in other embodiments the light source can be included on a submount or printed circuit board (PCB) that is then mounted to the platform 56. The platform 56 and the heat sink structure 52 can comprise electrically conductive paths for applying an electrical signal to the light source 58, with some of the conductive paths being conductive traces or wires. Portions of the platform 56 can also be made of a thermally conductive material and in some embodiments heat generated during operation can spread to the platform and then to the heat sink structure.

The heat sink structure 52 can at least partially comprise a thermally conductive material, and many different thermally conductive materials can be used including different metals such as copper or aluminum, or metal alloys. Copper can have a thermal conductivity of up to 400 W/m-k or more. In some embodiments the heat sink can comprise high purity aluminum that can have a thermal conductivity at room temperature of approximately 210 W/m-k. In other embodiments the heat sink structure can comprise die cast aluminum having a thermal conductivity of approximately 200 W/m-k. The heat sink structure 52 can also comprise other heat dissipation features such as heat fins 60 that increase the surface area of the heat sink to facilitate more efficient dissipation into the ambient. In some embodiments, the heat fins 60 can be made of material with higher thermal conductivity than the remainder of the heat sink. In the embodiment shown the fins 60 are shown in a generally horizontal orientation, but it is understood that in other embodiments the fins can have a vertical or angled orientation. In still other embodiments, the heat sink can comprise active cooling elements, such as fans, to lower the convective thermal resistance within the lamp. In some embodiments, heat dissipation from the phosphor carrier is achieved through a combination of convection thermal dissipation and conduction through the heat sink structure 52. Different heat dissipation arrangements and structures are described in U.S. Provisional Patent Application Ser. No. 61/339,516, to Tong et al., entitled "LED Lamp Incorporating Remote Phosphor with Heat Dissipation Features," also assigned to Cree, Inc., filed Mar. 3, 2010. This application is incorporated herein by reference.

Reflective layers 53 can also be included on the heat sink structure 52, such as on the surface of the optical cavity 54. In those embodiments not having an optical cavity the reflective layers can be included around the light source. In some embodiments the surfaces can be coated with a material having a reflectivity of approximately 75% or more to the lamp visible wavelengths of light emitted by the light source 58 and/or wavelength conversion material ("the lamp light"), while in other embodiments the material can have a reflectivity of approximately 85% or more to the lamp light. In still other embodiments the material can have a reflectivity to the lamp light of approximately 95% or more.

The heat sink structure 52 can also comprise features for connecting to a source of electricity such as to different electrical receptacles. In some embodiments the heat sink structure can comprise a feature of the type to fit in conventional electrical receptacles. For example, it can include a feature for mounting to a standard Edison socket, which can comprise a screw-threaded portion which can be screwed into an Edison socket. In other embodiments, it can include a standard plug and the electrical receptacle can be a standard outlet, or can comprise a GU24 base unit, or it can be a clip and the electrical receptacle can be a receptacle which receives and retains the clip (e.g., as used in many fluorescent lights). These are only a few of the options for heat sink structures and receptacles, and other arrangements can also be used that safely deliver electricity from the receptacle to the lamp 50. The lamps according to the present invention can comprise a power supply or power conversion unit that can comprise a driver to allow the bulb to run from an AC line voltage/current and to provide light source dimming capabilities. In some embodiments, the power supply can comprise an offline constant-current LED driver using a non-isolated quasi-resonant flyback topology. The LED driver can fit within the lamp and in some embodiments can comprise a less than 25 cubic centimeter volume, while in other embodiments it can comprise an approximately 20 cubic centimeter volume. In some embodiments the power supply can be non-dimmable but is low cost. It is understood that the power supply used can have different topology or geometry and can be dimmable as well.

A phosphor carrier 62 is included over the top opening of the cavity 54 and a dome shaped diffuser 76 is included over the phosphor carrier 62. In the embodiment shown phosphor carrier covers the entire opening and the cavity opening is shown as circular and the phosphor carrier 62 is a circular disk. It is understood that the cavity opening and the phosphor carrier can be many different shapes and sizes. It is also understood that the phosphor carrier 62 can cover less than the entire cavity opening. As further described below, the diffuser 76 is arranged to disperse the light from the phosphor carrier and/or LED into the desired lamp emission pattern and can comprise many different shapes and sizes depending on the light it receives from and the desired lamp emission pattern.

Embodiments of phosphor carriers according to the present invention can be characterized as comprising a conversion material and thermally conductive light transmitting material, but it is understood that phosphor carriers can also be provided that are not thermally conductive. The light transmitting material can be transparent to the light emitted from the light source 54 and the conversion material should be of the type that absorbs the wavelength of light from the light source and re-emits a different wavelength of light. In the embodiment shown, the thermally conductive light transmitting material comprises a carrier layer 64 and the conversion material comprises a phosphor layer 66 on the phosphor carrier. As further described below, different embodiments can comprise many different arrangements of the thermally conductive light transmitting material and the conversion material.

When light from the light source 58 is absorbed by the phosphor in the phosphor layer 66 it is re-emitted in isotropic directions with approximately 50% of the light emitting forward and 50% emitting backward into the cavity 54. Further, some of the light from the light source 58 may enter the phosphor layer and not be absorbed, but rather scattered while retaining its original wavelength. Some of this scattered light may also be directed backward into cavity 54. In prior LEDs having conformal phosphor layers, a significant portion of the light emitted or scattered backwards can be directed back into the LED and its likelihood of escaping is limited by the extraction efficiency of the LED structure. For some LEDs the extraction efficiency can be approximately 70%, so a percentage of the light directed from the conversion material back into the LED can be lost. In the lamps according to the present invention having the remote phosphor configuration with LEDs on the platform 56 at the bottom of the cavity 54 a higher percentage of the backward phosphor light strikes a surface of the cavity instead of the LED. Coating these services with a reflective layer 53 increases the percentage of light that reflects back into the phosphor layer 66 where it can emit from the lamp. These reflective layers 53 allow for the optical cavity to effectively recycle photons, and increase the emission efficiency of the lamp. It is understood that the reflective layer can comprise many different materials and structures including but not limited to reflective metals or multiple layer reflective structures such as distributed Bragg reflectors. Reflective layers can also be included around the LEDs in those embodiments not having an optical cavity.

The carrier layer 64 can be made of many different materials having a thermal conductivity of 0.5 W/m-k or more, such as quartz, silicon carbide (SiC) (thermal conductivity ~120 W/m-k), glass (thermal conductivity of 1.0-1.4 W/m-k) or sapphire (thermal conductivity of ~40 W/m-k). In other embodiments, the carrier layer 64 can have thermal conductivity greater than 1.0 W/m-k, while in other embodiments it can have thermal conductivity of greater than 5.0 W/m-k. In still other embodiments it can have a thermal conductivity of greater that 10 W/m-k. In some embodiments the carrier layer can have thermal conductivity ranging from 1.4 to 10 W/m-k. The phosphor carrier can also have different thicknesses depending on the material being used, with a suitable range of thicknesses being 0.1 mm to 10 mm or more. It is understood that other thicknesses can also be used depending on the characteristics of the material for the carrier layer. The material should be thick enough to provide sufficient lateral heat spreading for the particular operating conditions. Generally, the higher the thermal conductivity of the material, the thinner the material can be while still providing the necessary thermal dissipation. Different factors can impact which carrier layer material is used including but not limited to cost and transparency to the light source light. Some materials may also be more suitable for larger diameters, such as glass or quartz. These can provide reduced manufacturing costs by formation of the phosphor layer on the larger diameter carrier layers and then singulation into the smaller carrier layers.

Many different phosphors can be used in the phosphor layer 66 with the present invention being particularly adapted to lamps emitting white light. As described above, in some embodiments the light source 58 can be LED based and can emit light in the blue wavelength spectrum. The phosphor layer can absorb some of the blue light and re-emit yellow. This allows the lamp to emit a white light combination of blue and yellow light. In some embodiments, the blue LED light can be converted by a yellow conversion material using a commercially available YAG:Ce phosphor, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for creating white light when used with a blue emitting LED based emitter include but not limited to:

$Tb_{3-x}RE_xO_{12}$:Ce (TAG); RE=Y, Gd, La, Lu; or
$Sr_{2-x-y}Ba_xCa_ySiO_4$:Eu.

The phosphor layer can also be arranged with more than one phosphor either mixed in with the phosphor layer 66 or as a second phosphor layer on the carrier layer 64. In some embodiments, each of the two phosphors can absorb the LED light and can re-emit different colors of light. In these embodiments, the colors from the two phosphor layers can be combined for higher CRI white of different white hue (warm white). This can include light from yellow phosphors above that can be combined with light from red phosphors. Different red phosphors can be used including:

$Sr_xCa_{1-x}S:Eu, Y; Y=halide$;
$CaSiAlN_3:Eu$; or
$Sr_{2-y}Ca_ySiO_4:Eu$

Other phosphors can be used to create color emission by converting substantially all light to a particular color. For example, the following phosphors can be used to generate green light:

$SrGa_2S_4:Eu$;
$Sr_{2-y}Ba_ySiO_4:Eu$; or
$SrSi_2O_2N_2:Eu$.

The following lists some additional suitable phosphors used as conversion particles phosphor layer 66, although others can be used. Each exhibits excitation in the blue and/or UV emission spectrum, provides a desirable peak emission, has efficient light conversion, and has acceptable Stokes shift:

Yellow/Green
$(Sr,Ca,Ba)(Al,Ga)_2S_4:Eu^{2+}$
$Ba_2(Mg,Zn)Si_2O_7:Eu^{2+}$
$Gd_{0.46}Sr_{0.31}Al_{1.23}O_xF_{1.38}:Eu^{2+}{}_{0.06}$
$(Ba_{1-x-y}Sr_xCa_y)SiO_4:Eu$
$Ba_2SiO_4:Eu^{2+}$ Red
$Lu_2O_3:Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3:Pr^{3+},Ga^{3+}$
$CaAlSiN_3:Eu^{2+}$
$Sr_2Si_5N_8:Eu^{2+}$ Different sized phosphor particles can be used including but not limited to particles in the range of 10 nanometers (nm) to 30 micrometers (µm), or larger. Smaller particle sizes typically scatter and mix colors better than larger sized particles to provide a more uniform light. Larger particles are typically more efficient at converting light compared to smaller particles, but emit a less uniform light. In some embodiments, the phosphor can be provided in the phosphor layer 66 in a binder, and the phosphor can also have different concentrations or loading of phosphor materials in the binder. A typical concentration being in a range of 30-70% by weight. In one embodiment, the phosphor concentration is approximately 65% by weight, and is preferably uniformly dispersed throughout the remote phosphor. The phosphor layer 66 can also have different regions with different conversion materials and different concentrations of conversion material.

Different materials can be used for the binder, with materials preferably being robust after curing and substantially transparent in the visible wavelength spectrum. Suitable materials include silicones, epoxies, glass, inorganic glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. The binder can be cured using many different curing methods depending on different factors such as the type of binder used. Different curing methods include but are not limited to heat, ultraviolet (UV), infrared (IR) or air curing.

Phosphor layer 66 can be applied using different processes including but not limited to spin coating, sputtering, printing, powder coating, electrophoretic deposition (EPD), electrostatic deposition, among others. As mentioned above, the phosphor layer 66 can be applied along with a binder material, but it is understood that a binder is not required. In still other embodiments, the phosphor layer 66 can be separately fabricated and then mounted to the carrier layer 64.

In one embodiment, a phosphor-binder mixture can be sprayed or dispersed over the carrier layer 64 with the binder then being cured to form the phosphor layer 66. In some of these embodiments the phosphor-binder mixture can be sprayed, poured or dispersed onto or over the heated carrier layer 64 so that when the phosphor binder mixture contacts the carrier layer 64, heat from the carrier layer 64 spreads into and cures the binder. These processes can also include a solvent in the phosphor-binder mixture that can liquefy and lower the viscosity of the mixture making it more compatible with spraying. Many different solvents can be used including but not limited to toluene, benzene, zylene, or OS-20 commercially available from Dow Corning®, and different concentration of the solvent can be used. When the solvent-phosphor-binder mixture is sprayed or dispersed on the heated carrier layer 64 the heat from the carrier layer 64 evaporates the solvent, with the temperature of the carrier layer impacting how quickly the solvent is evaporated. The heat from the carrier layer 64 can also cure the binder in the mixture leaving a fixed phosphor layer on the carrier layer. The carrier layer 64 can be heated to many different temperatures depending on the materials being used and the desired solvent evaporation and binder curing speed. A suitable range of temperature is 90 to 150° C., but it is understood that other temperatures can also be used. Various deposition methods and systems are described in U.S. patent application Ser. No. 12/717,048 to Donofrio et al., entitled "Systems and Methods for Application of Optical Materials to Optical Elements," and also assigned to Cree, Inc., filed Mar. 3, 2010. This application is incorporated herein by reference.

The phosphor layer 66 can have many different thicknesses depending at least partially on the concentration of phosphor material and the desired amount of light to be converted by the phosphor layer 66. Phosphor layers according to the present invention can be applied with concentration levels (phosphor loading) above 30%. Other embodiments can have concentration levels above 50%, while in still others the concentration level can be above 60%. In some embodiments the phosphor layer can have thicknesses in the range of 10-100 microns, while in other embodiments it can have thicknesses in the range of 40-50 microns.

The methods described above can be used to apply multiple layers of the same of different phosphor materials and different phosphor materials can be applied in different areas of the carrier layer using known masking processes. The methods described above provide some thickness control for the phosphor layer 66, but for even greater thickness control the phosphor layer can be ground using known methods to reduce the thickness of the phosphor layer 66 or to even out the thickness over the entire layer. This grinding feature provides the added advantage of being able to produce lamps emitting within a single bin on the CIE chromaticity graph. Binning is generally known in the art and is intended to ensure that the LEDs or lamps provided to the end customer emit light within an acceptable color range. The LEDs or lamps can be tested and sorted by color or brightness into different bins, generally referred to in the art as binning. Each bin typically contains LEDs or lamps from one color and brightness group and is typically identified by a bin code. White emitting LEDs or lamps can be sorted by chromaticity (color) and luminous flux (brightness). The thickness control of the phosphor layer provides greater control in producing lamps that emit light within a target bin by controlling the amount of light source light converted by the phosphor layer. Multiple phosphor carriers 62 with the same thickness of phosphor layer 66 can be provided. By using a light source 58 with substantially the same emission characteristics, lamps can be manufactured having nearly the same emission characteristics that in some instances can fall within a single bin. In some embodiments, the lamp emissions fall within a standard deviation from a point on a CIE diagram, and in some embodiments the standard deviation comprises less than a 10-step McAdams ellipse. In some embodiments the emission of the lamps falls within a 4-step McAdams ellipse centered at CIExy(0.313, 0.323).

The phosphor carrier 62 can be mounted and bonded over the opening in the cavity 54 using different known methods or materials such as thermally conductive bonding materials or a thermal grease. Conventional thermally conductive grease can contain ceramic materials such as beryllium oxide and aluminum nitride or metal particles such colloidal silver. In other embodiments the phosphor carrier can be mounted over the opening using thermal conductive devices such as clamping mechanisms, screws, or thermal adhesive hold phosphor carrier 62 tightly to the heat sink structure to maximize thermal conductivity. In one embodiment a thermal grease layer is used having a thickness of approximately 100 μm and thermal conductivity of k=0.2 W/m-k. This arrangement provides an efficient thermally conductive path for dissipating heat from the phosphor layer 66. As mentioned above, different lamp embodiments can be provided without cavity and the phosphor carrier can be mounted in many different ways beyond over an opening to the cavity.

During operation of the lamp 50 phosphor conversion heating is concentrated in the phosphor layer 66, such as in the center of the phosphor layer 66 where the majority of LED light strikes and passes through the phosphor carrier 62. The thermally conductive properties of the carrier layer 64 spreads this heat laterally toward the edges of the phosphor carrier 62 as shown by first heat flow 70. There the heat passes through the thermal grease layer and into the heat sink structure 52 as shown by second heat flow 72 where it can efficiently dissipate into the ambient.

As discussed above, in the lamp 50 the platform 56 and the heat sink structure 52 can be thermally connected or coupled. This coupled arrangement results in the phosphor carrier 62 and that light source 58 at least partially sharing a thermally conductive path for dissipating heat. Heat passing through the platform 56 from the light source 58 as shown by third heat flow 74 can also spread to the heat sink structure 52. Heat from the phosphor carrier 62 flowing into the heat sink structure 52 can also flow into the platform 56. As further described below, in other embodiments, the phosphor carrier 62 and the light source 54 can have separate thermally conductive paths for dissipating heat, with these separate paths being referred to as "decoupled".

It is understood that the phosphor carriers can be arranged in many different ways beyond the embodiment shown in FIG. 4. The phosphor layer can be on any surface of the carrier layer or can be mixed in with the carrier layer. The phosphor carriers can also comprise scattering layers that can be included on or mixed in with the phosphor layer or carrier layer. It is also understood that the phosphor and scattering layers can cover less than a surface of the carrier layer and in some embodiments the conversion layer and scattering layer can have different concentrations in different areas. It is also understood that the phosphor carrier can have different roughened or shaped surfaces to enhance emission through the phosphor carrier.

As mentioned above, the diffuser is arranged to disperse light from the phosphor carrier and LED into the desired lamp emission pattern, and can have many different shapes and sizes. In some embodiments, the diffuser also can be arranged over the phosphor carrier to mask the phosphor carrier when the lamp is not emitting. The diffuser can have materials to give a substantially white appearance to give the bulb a white appearance when the lamp is not emitting.

There are at least four attributes or characteristics of the diffuser that can be used to control the output beam characteristics for the lamp 50. The first is diffuser geometry independent of the phosphor layer geometry. The second is the diffuser geometry relative to the phosphor layer geometry. The third is diffuser scattering properties including the nature of the scattering layer and smoothness/roughness of the diffuser surfaces. The fourth is the distribution of scattering particles across the diffuser such as intentional non-uniformity of the scattering or variation of the scattering properties across the diffuser surface or along a particular diffuser dimension. These attributes allow for control of, for example, the ratio of axially (~0) emitted light relative to "sideways" emitted light (~90°), and also relative to "high angle" (>~130°). These attributes can also apply differently depending on the geometry of and pattern of light emitted by the phosphor carrier and the light source.

For two-dimensional phosphor carriers and/or light sources such as those shown in FIG. 4, the light emitted is generally forward directed (e.g. Lambertian). For these embodiments, the attributes listed above can provide for the dispersion of the forward directed emission pattern into broad beam intensity profiles. Variations in the second and fourth attributes that can be particularly applicable to achieving broad beam omnidirectional emission from forward directed emission profile.

For three-dimensional phosphor carriers (described in more detail below) and three dimensional light sources, the light emitted can already have significant emission intensity at greater than 90° provided that the emission is not blocked by other lamp surfaces, such as the heat sink. As a result, the diffuser attributes listed above can be utilized to provide further adjustment or fine-tuning to the beam profile from the phosphor carrier and light source so that it more closely matches the desired output beam intensity, color uniformity, color point, etc. In some embodiments, the beam profile can be adjusted to substantially match the output from conventional incandescent bulbs.

Figure 5:
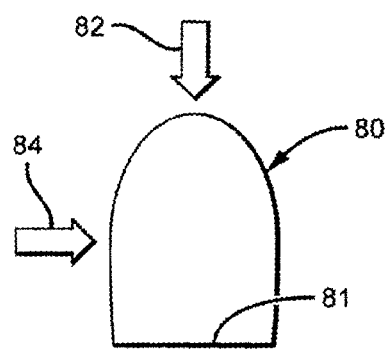
FIG. 5 is a side view of one embodiment of a lamp according to the present invention.

As for the first attribute above regarding diffuser geometry independent of phosphor geometry, in those embodiments where light is emitted uniformly from the diffuser surface, the amount of light directed "forward" (axially or ~0°) relative to sideways (~90°), and relative to "high angle" (>~130°), can depend greatly on the cross sectional area of the diffuser when viewed from that angle. FIG. 5 shows one embodiment of a tall narrow diffuser 80 according to the present invention, which has a small two dimensional phosphor carrier 81. It is characterized by having a circular area when viewed axially along first viewing angle 82 and a larger area when viewed from the side along second viewing angle 84. If all surfaces of the diffuser were to emit an equal amount of light per unit area, such a diffuser would generally have low axial light emission relative to "sideways" emission. When illuminated internally by a small two-dimensional phosphor carrier 81, the diffuser surfaces may not all emit an equal amount of light. Accordingly, the impact of the diffuser geometry can vary depending on factors such as the emission profile of the internal light source. In general, if a heat sink or other light blocking feature is present at the base of the diffuser, increasing the height of the diffuser can increase the amount of backward or high angle emission.

Figure 6:
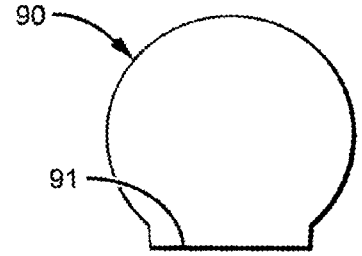
FIG. 6 is a side view of another embodiment of a lamp according to the present invention.

FIG. 6 shows another embodiment of a diffuser 90 according to the present invention that is particularly applicable to uniform omnidirectional emission depending on the emission pattern of the co-planar light source and or phosphor carrier 91. The diffuser 90 has a nearly uniform spherical geometry, which provides a nearly constant cross-sectional area when viewed form all angles. This promotes uniform or nearly omni-directional emission intensity.

Figure 7:
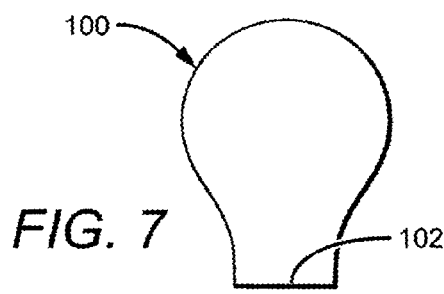
FIG. 7 is a side view of still another embodiment of a lamp according to the present invention.

As for the second attribute, the diffuser geometry relative to the phosphor carrier geometry, FIG. 7 shows another embodiment of a diffuser 100 that is arranged that is particularly applicable to two-dimensional phosphor carriers and co-planar LED light sources that typically provide a forward directed or Lambertian emission pattern. The diffuser 100 is oblong and has a narrow neck 102. By placing the light source and/or phosphor carrier at the base of the diffuser 100, light that would otherwise be directed to a forward angle from the source would be "intercepted" and directed to a higher angle or sideways (~90°) due to the scattering nature of the diffuser surface. This effect can also occur with three-dimensional light sources and phosphor carriers, but can have less of an effect. In some embodiments of these three-dimensional embodiments the diffuser may not need the neck feature, but can take on more of globe shape.

Figure 8:
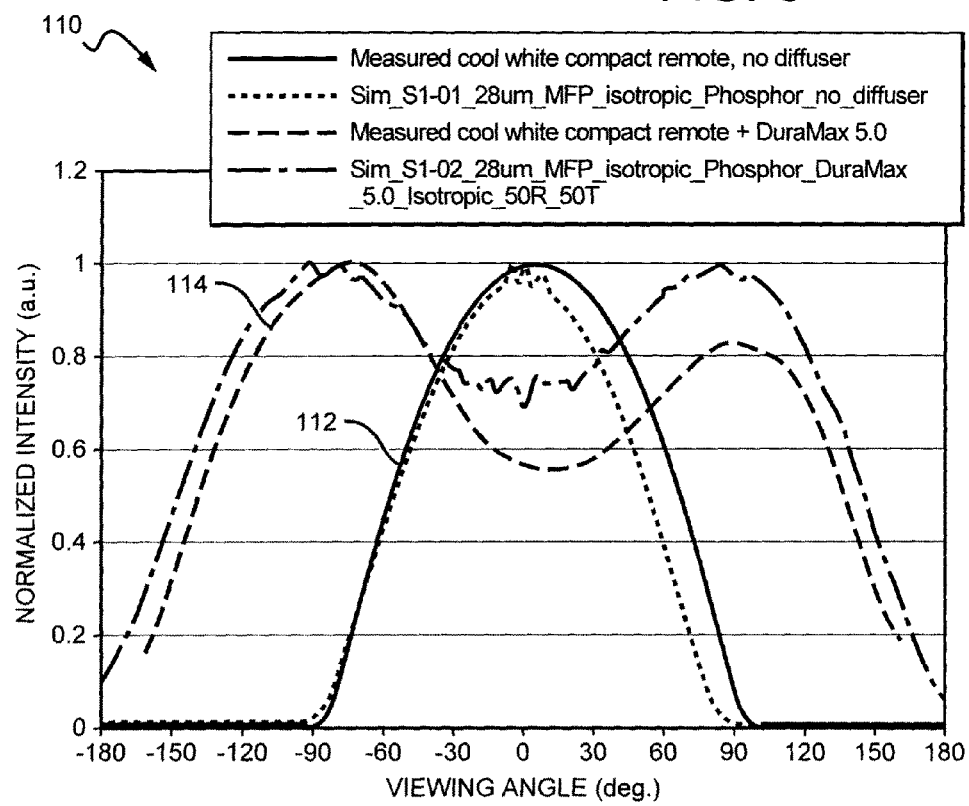
FIG. 8 is a graph showing the emission characteristics of one embodiment of a lamp according to the present invention.

FIG. 8 is a graph 110 showing one embodiment of the forward directed or Lambertian emission pattern 112 from the two dimensional phosphor carrier and co-planar LED light sources. Emission pattern 114 shows the lamp emission pattern after the emission pattern represented by line 112 passes through the diffuser as shown in FIG. 7. The pattern 114 shows reduced emission intensity axially (~0°), but significantly higher emission sideways (~90°). This reflects a more uniform emission pattern compared to the forward directed emission pattern 112.

As for the third attribute listed above, diffuser scattering properties, different embodiments of the diffuser can comprise a carrier made of different materials such as glass or plastics, and one or more scattering films, layers or regions. The scattering layer can be deposited using the methods described above with reference to deposition of the phosphor layer and can comprise a dense packing of particles. The scattering particles can also be included in a binder material that can be the same as those described above in reference to the binder used with the phosphor layer. The scattering particle layer can have different concentrations of scattering particles depending on the application and materials used. A suitable range for scattering particle concentration is from 0.01% to 0.2%, but it is understood that the concentration can be higher or lower. In some embodiments the concentration can be as low as 0.001%. It is also understood that the scattering particle layer can have different concentrations of scattering particles in different regions. For some scattering particles there can be an increase in loss due to absorption for higher concentrations. Thus, the concentrations of the scattering particles can be chosen in order to maintain an acceptable loss figure, while at the same time dispersing the light to provide the desired emission pattern.

The scattering particles can comprise many different materials including but not limited to:

silica;
kaolin;
zinc oxide (ZnO);
yttrium oxide ($Y_2O_3$);
titanium dioxide ($TiO_2$);
barium sulfate ($BaSO_4$);
alumina ($Al_2O_3$);
fused silica ($SiO_2$);
fumed silica ($SiO_2$);
aluminum nitride;
glass beads;
zirconium dioxide ($ZrO_2$);
silicon carbide (SiC);
tantalum oxide ($TaO_5$);
silicon nitride ($Si_3N_4$);
niobium oxide ($Nb_2O_5$);
boron nitride (BN); or
phosphor particles (e.g., YAG:Ce, BOSE)

More than one scattering material in various combinations of materials or combinations of different forms of the same material may be used to achieve a particular scattering effect.

The scattering layer can be located on the inside surface of the diffuser, the outside surface, or can be mixed in with the carrier. The surfaces of the carrier of the scattering layer may be optically smooth or rough. The scattering layer may be composed of a film or particles such as silica or kaolin particles adhered to the surface of the carrier with air between the particles. The scattering layer can also comprise particles in a binder matrix layer such as a film of silica, alumina, etc. particles in silicon. The can be spray coated onto the interior or exterior surface of the carrier or the carrier itself may contain scattering particles One example of a scattering film which can be molded into the shape of the diffuser is a film commercially available from FusionOptix, Inc.

In general, the scattering material or particles can be characterized by the degree to which light incident on the particles is re-directed from its original course. In the case of individual particles, a larger particle will tend to Mie scatter, leading to a relatively small change in the direction of the light. Smaller particles tend to Reyleigh scatter, leading to a large change in the direction and essentially uniform or isotropic distribution of the light after interaction with the particle. Films composed of the particles can behave in a similar manner. A wide variety of surface features and/or scattering particles can be used, the effectiveness of which is determined by the absorption (lower is better) and index of refraction differences with the surrounding matrix/ambient (larger differences produce more effective scattering).

The smoothness of the diffuser surfaces can be used to impact the amount of light which is directed back towards the light source of phosphor carrier due to the total internal reflection (TIR) effect. A smooth interior surface can lead to TIR and re-direct light which would otherwise be directed towards the source. In contrast, a roughened internal surface can reduce the magnitude of the TIR effect. Light which is redirected back towards the source of other internal lamp surfaces may be absorbed, leading to reduced lamp efficiency. Light scattered back towards the phosphor layer can lead to increased amounts of downconversion and thus a shift in color temperature or color point of the lamp due to the diffuser. However, high degrees of backscattering can also improve uniformity by creating a "lightbox" effect where light is scattered internally in the diffuser leading to a more uniform distribution across the diffuser surface and a more uniform color point and intensity distribution of the lamp emitted beam profile.

For the fourth attribute, diffuser scattering distribution across the surface, the uniformity of the scattering properties across the diffuser surface can be used to control the amount of light emitted from the surface in specific regions and therefore the resulting beam profile. This can be particularly useful when combined with other attributes, such as attribute number two as shown in FIG. 7 having the necking feature in the disperser. By utilizing an oblong diffuser having a narrow neck region, and a rough highly scattering (Rayleigh or isotropic) internal rough surface film in a lamp exhibiting the emission of a two dimensional phosphor carrier and co-planar LED light source, significant portions of light can be directed sideways as shown in FIG. 8. The effect can be magnified by increasing the amount of light that is transmitted through the scattering film in the neck region of the diffuser. If a significant portion of the light emitted by the phosphor carrier and light source interacts with the scattering layer, light will bounce around within the body of the diffuser, which can enhance uniform emission. By creating regions where the scattering film is more transparent, such as by making the scattering film thinner, less scattering, or smoother in such regions, it possible to increase the relative intensity leaving that surface. In the embodiment shown in FIG. 7, the amount of light leaving the neck region into a sideways beam direction can be increased by having a thinner or smoother scattering layer in that region.

Figure 9:
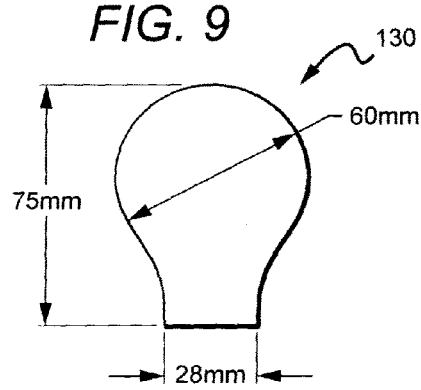
FIG. 9 is a side view of a diffuser according to the present invention.
Figure 10:
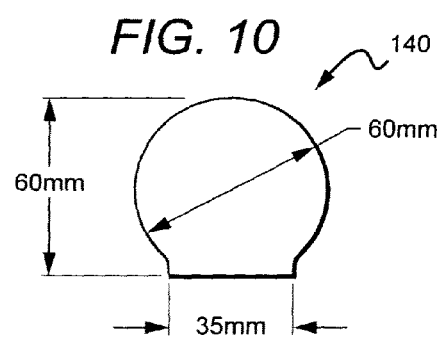
FIG. 10 is a side view of another diffuser according to the present invention.
Figure 11:
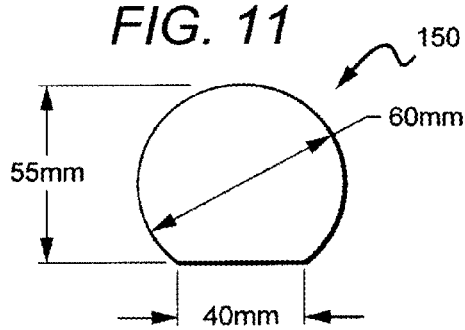
FIG. 11 is a side view of another embodiment diffuser according to the present invention.
Figure 12:
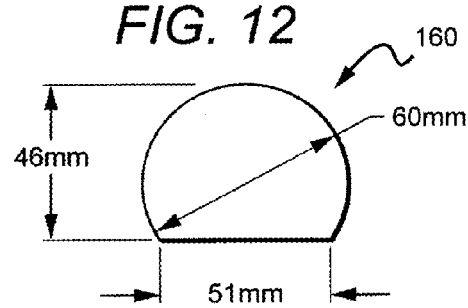
FIG. 12 is a side view of still another diffuser according to the present invention.

These are only some of the ways that these attributes can be combined in different ways to provide the desired emission pattern. The combination can result in many different shapes that can provide many different lamp emission patterns beyond omnidirectional. FIGS. 9-12 show some additional diffuser shapes and sizes that can be used with a two-dimensional carrier phosphor (and three-dimensional phosphors as described below) in lamps according to the present invention. FIG. 9 shows a diffuser 130 similar to the embodiment shown in FIG. 7 and being generally globe shaped with a shorter narrow neck portion. The dimensions for one embodiment of the diffuser 130 are shown in FIG. 9, with the dimensions for the diffusers in FIGS. 10-12 also shown. FIG. 10 shows another embodiment of a diffuser 140 not having a having a shorter neck and retaining much of its globe shape. FIG. 11 shows another embodiment of diffuser 150 having no neck region, but retaining much of its globe shape. FIG. 12 shows still another embodiment of a diffuser 160 where the diffuser comprises more of a hemispheric shape. These shapes provide emitters with different patterns and different levels of efficiency as described below and shown in the attached figures. These are countless other shapes that the diffuser (and carrier phosphor) can take and with some additional shapes being elongated, mushroom, bullet, cylindrical, egg shapes, oval, rotationally symmetric, etc. In other embodiments the diffuser can take on a shape where it is wider at the base and narrows at least through one portion moving away from the base. These embodiments can take on the shape of being wider at the bottom than the top.

Figure 13:
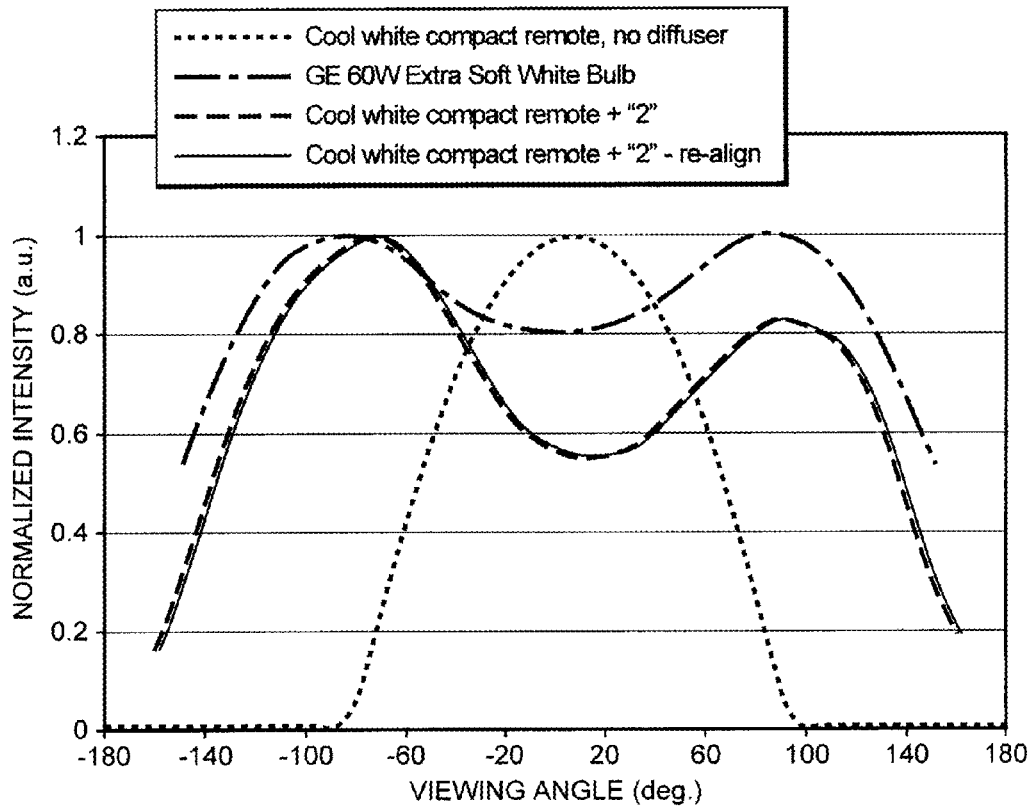
Figure 15:
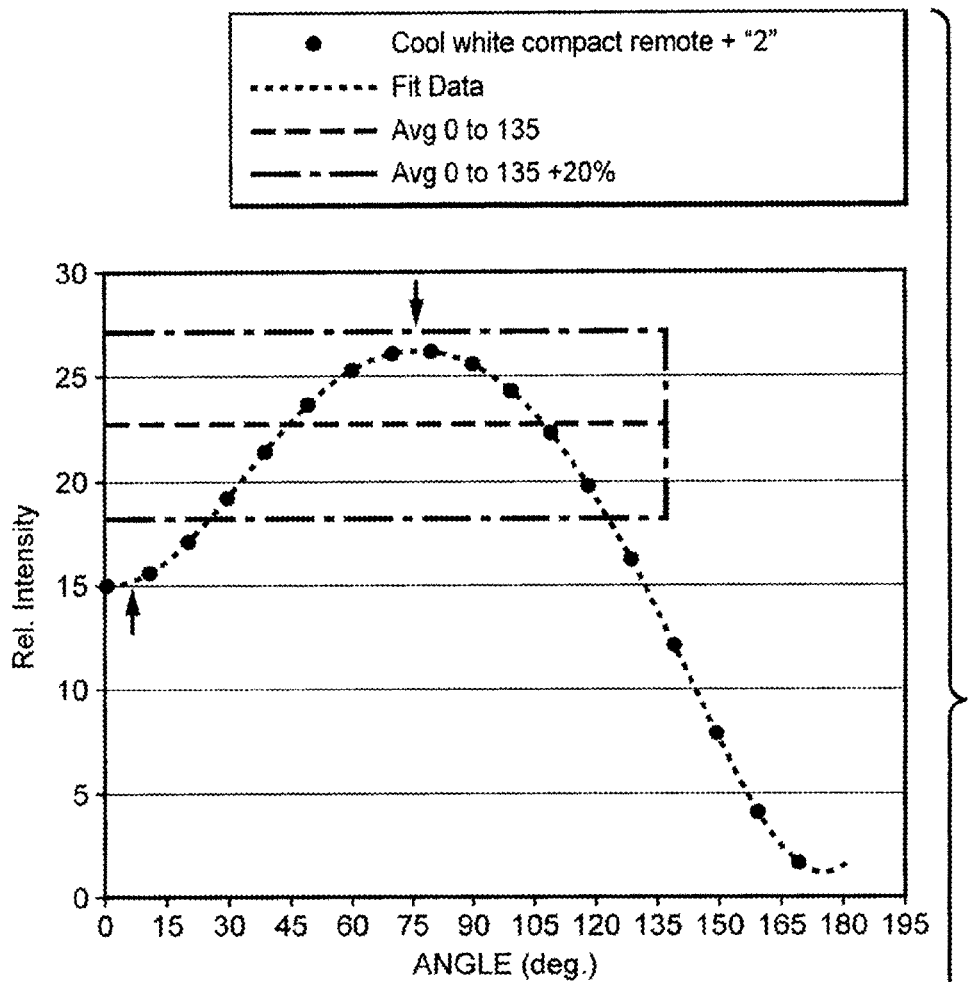
Figure 16:
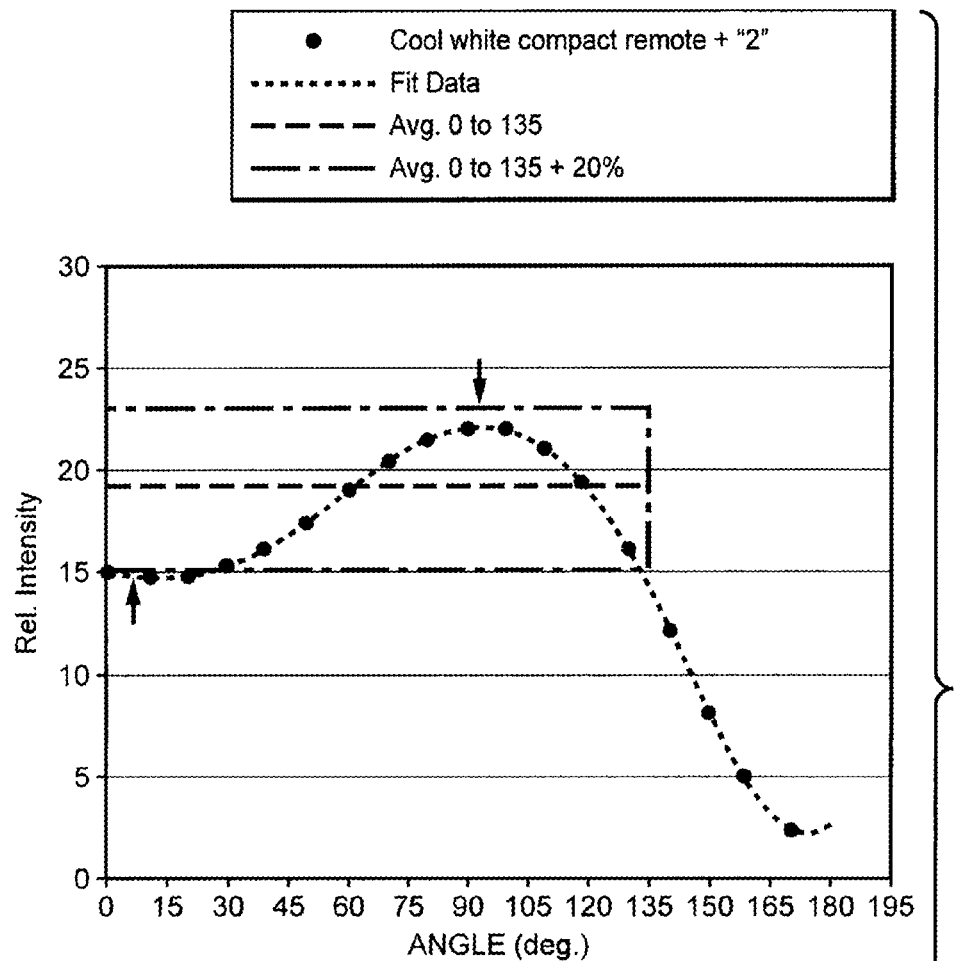
Figure 18:
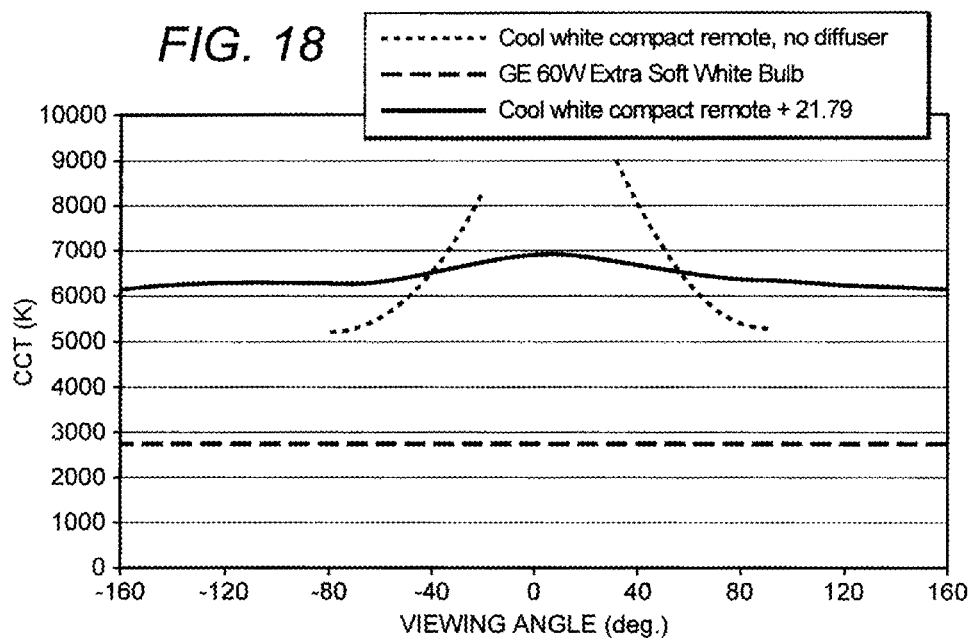
Figure 21:
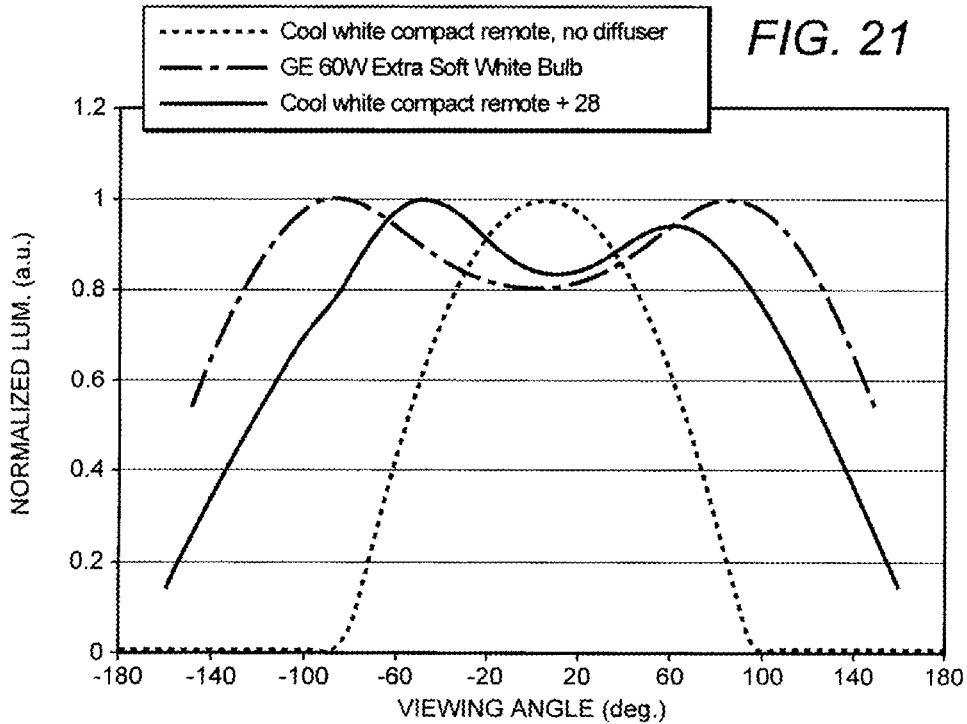
Figure 19:
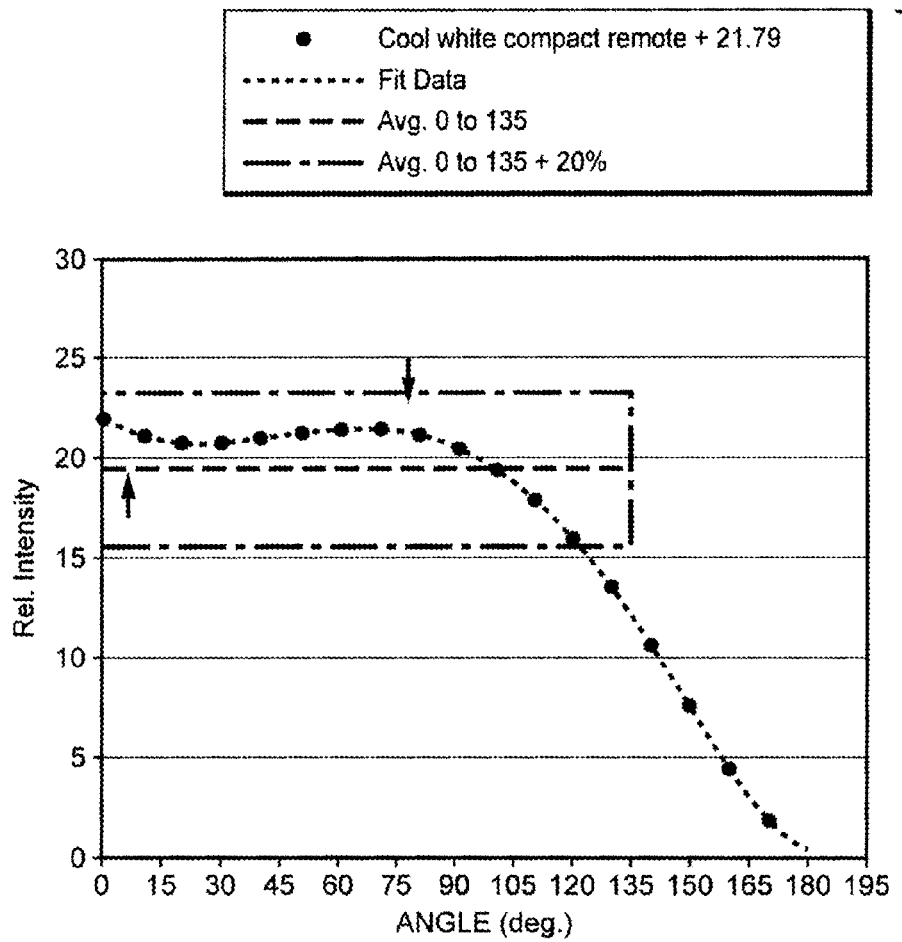
Figure 20:
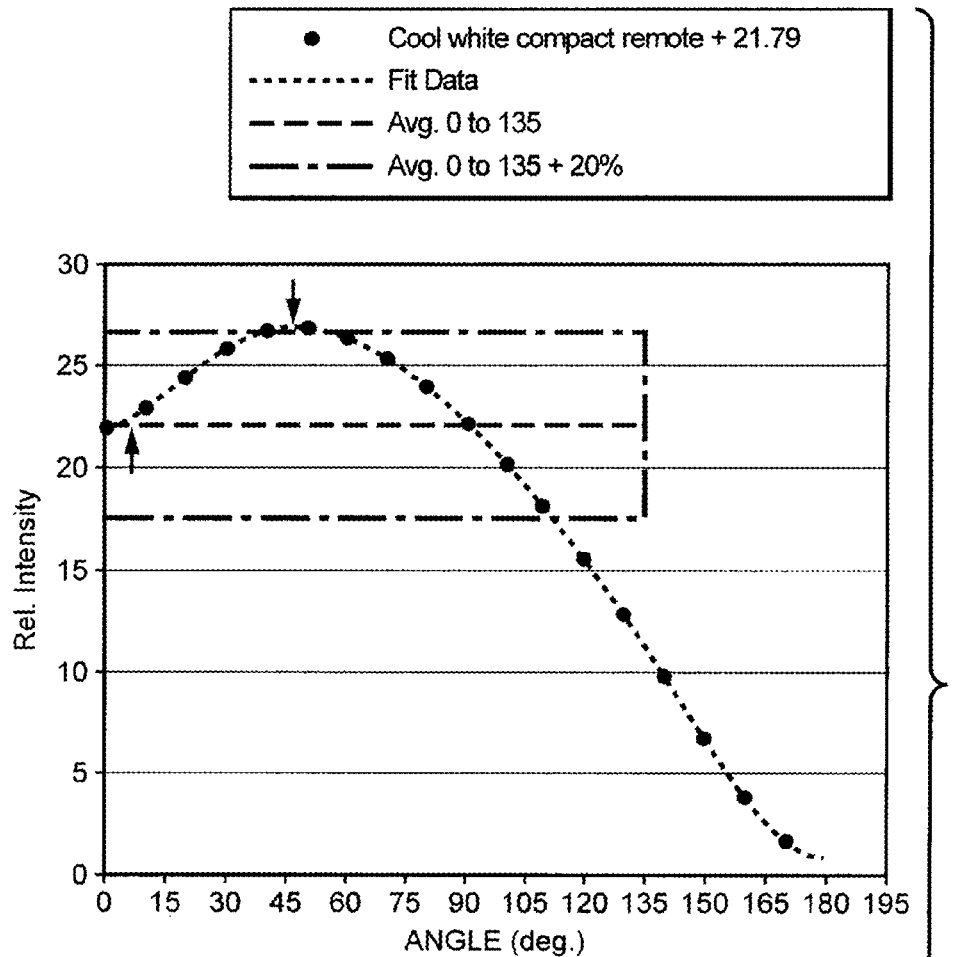
Figure 23:
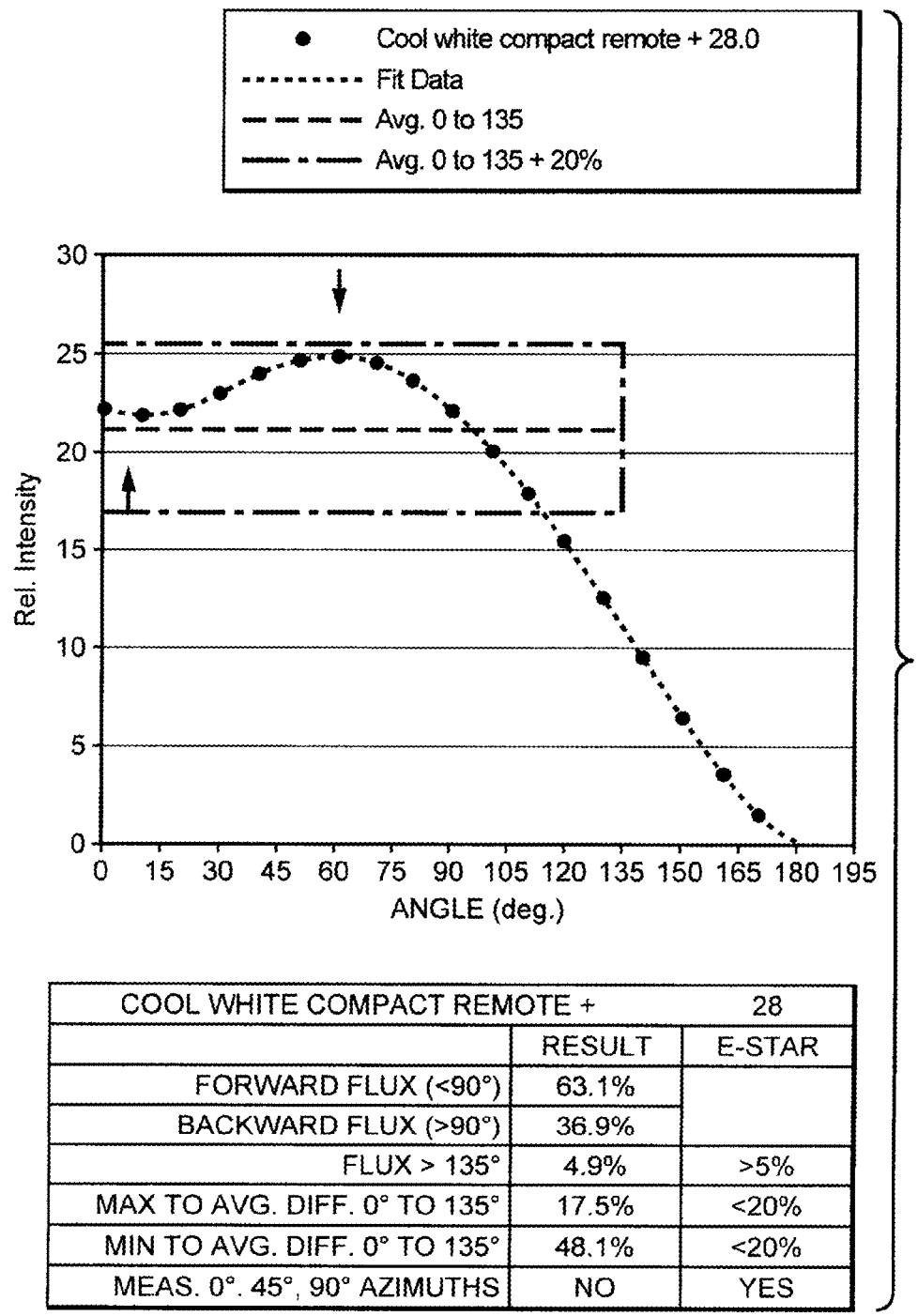
Figure 24:
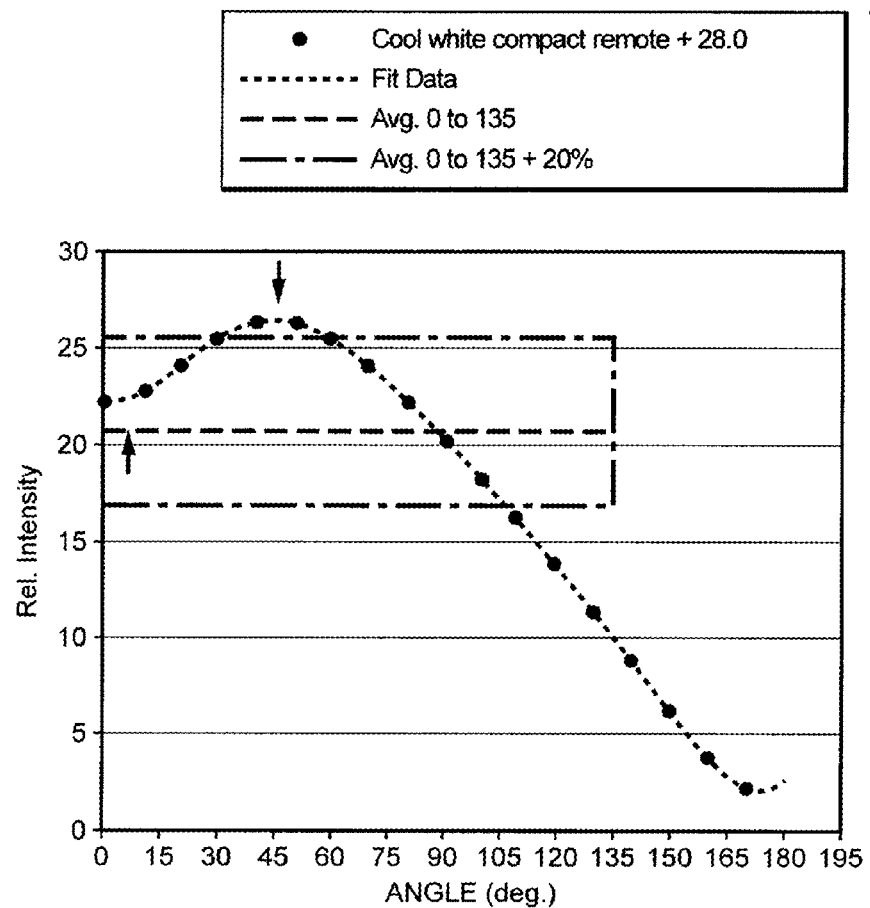
Figure 26:
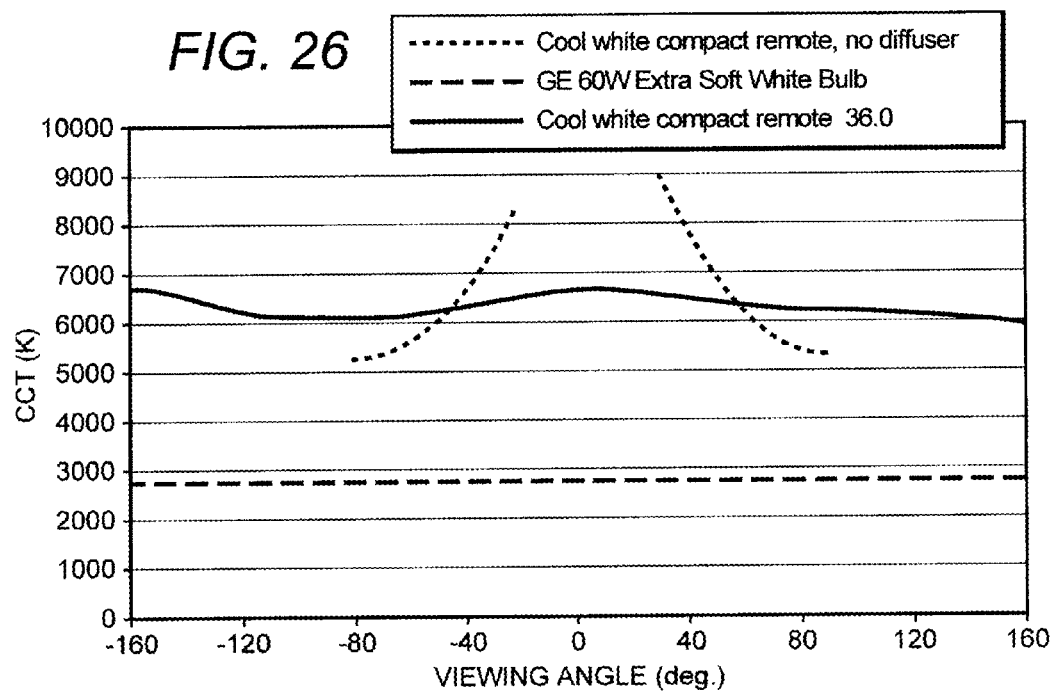

FIGS. 13 through 16 are graphs showing the emission characteristics for a lamp according to the present invention having a two-dimensional phosphor carrier with the diffuser 130 arranged over the phosphor so that light from the phosphor carrier passes through the diffuser. FIGS. 13 and 14 show the emission characteristics of the lamp compared to the lamp without a diffuser, and also compared to a standard General Electric 60 W Extra Soft Light Bulb. FIGS. 15 and 16 show variations in emission intensity from viewing angles 0 to 180°.

FIGS. 17 through 20 are similar to the graphs in FIGS. 13 through 16 and show the emission characteristics for a lamp according to the present invention also having a two-dimensional phosphor carrier with the diffuser 140 arranged over the phosphor carrier. FIGS. 21 through 24 are also similar to those in FIGS. 13 through 16 and show the emission characteristics for another lamp according to the present invention also having a two-dimensional phosphor carrier with the diffuser 150 arranged over the phosphor carrier. Likewise, FIGS. 25 through 28 are also similar to those in FIGS. 13 through 16 and show the emission characteristics for another lamp according to the present invention also having a two-dimensional phosphor carrier with the diffuser 160 arranged over the phosphor carrier.

The lamps according to the present invention can comprise many different features beyond those described above. Referring again to FIG. 4, in those lamp embodiments having a cavity 54 can be filled with a transparent heat conductive material to further enhance heat dissipation for the lamp. The cavity conductive material could provide a secondary path for dissipating heat from the light source 58. Heat from the light source would still conduct through the platform 56, but could also pass through the cavity material to the heat sink structure 52. This would allow for lower operating temperature for the light source 58, but presents the danger of elevated operating temperature for the phosphor carrier 62. This arrangement can be used in many different embodiments, but is particularly applicable to lamps having higher light source operating temperatures compared to that of the phosphor carrier. This arrangement allows for the heat to be more efficiently spread from the light source in applications where additional heating of the phosphor carrier layer can be tolerated.

Figure 29:
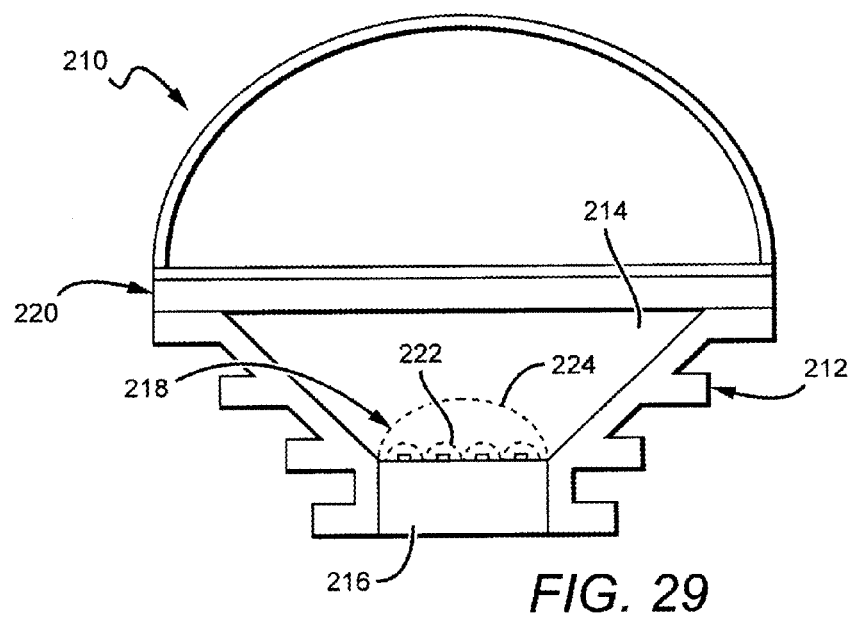
FIG. 29 is a sectional view of another embodiment of a lamp according to the present invention having a diffuser dome.
Figure 27:
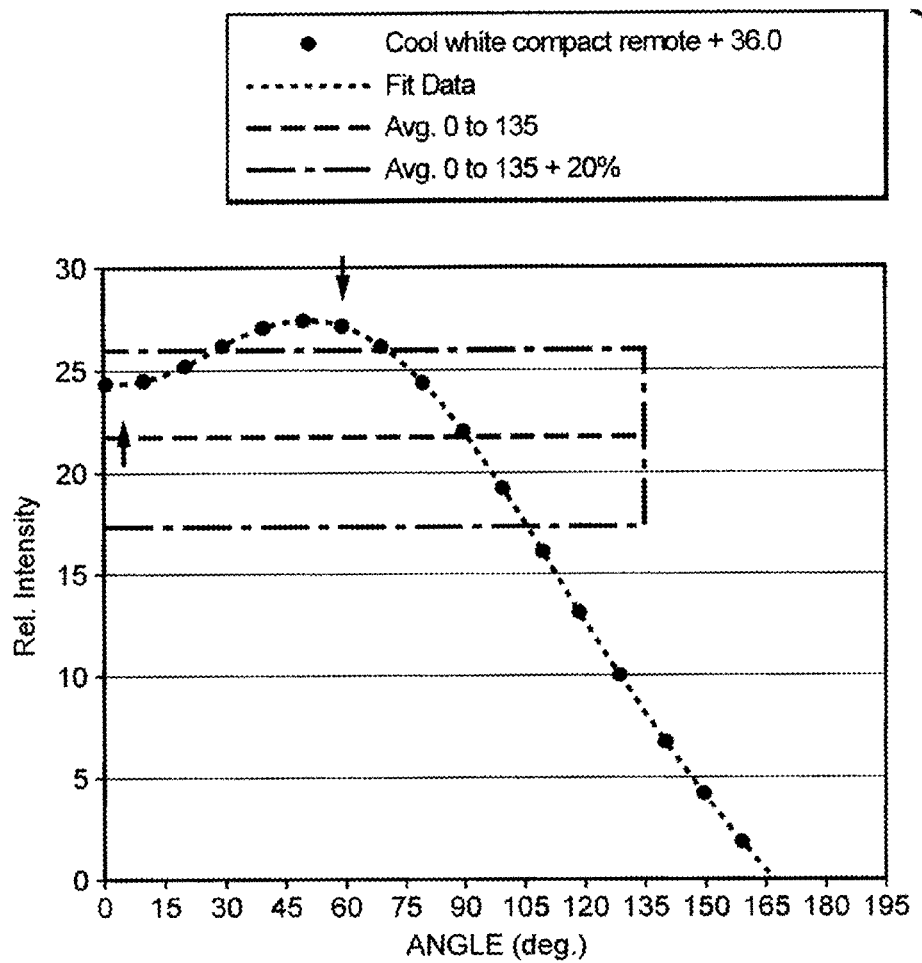
Figure 28:
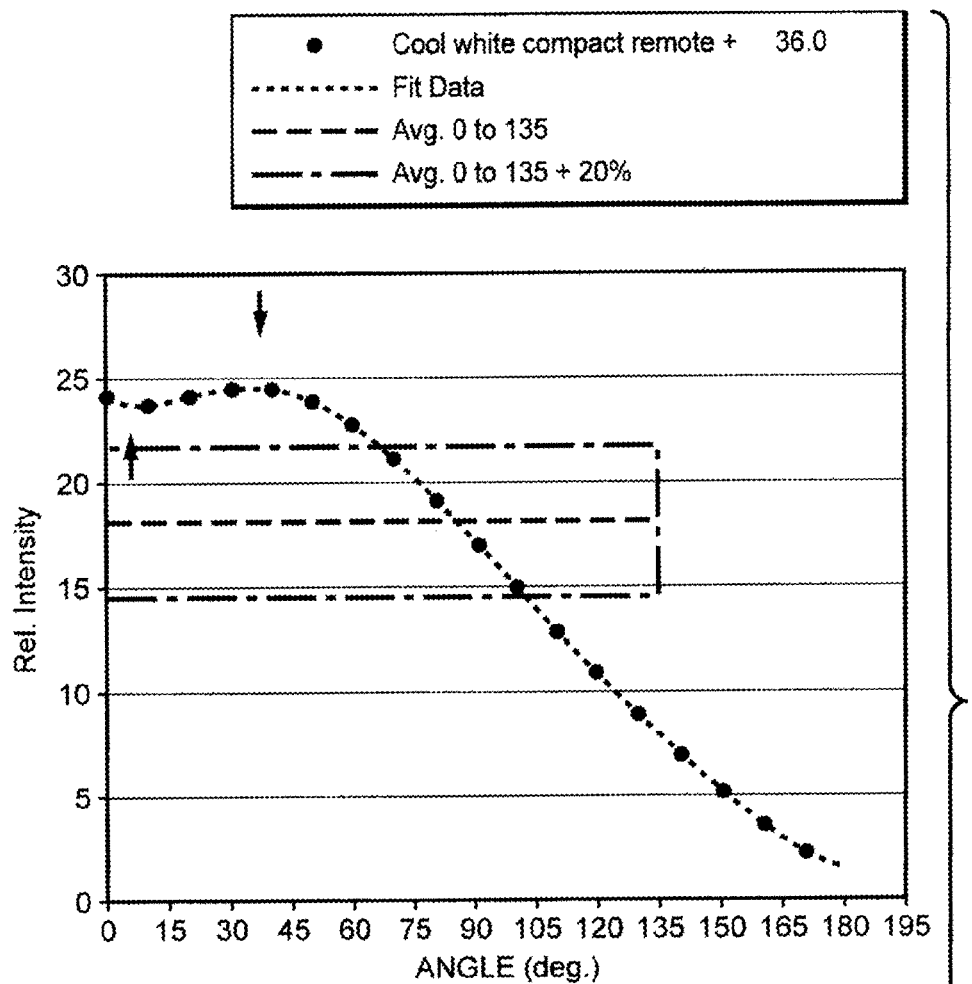

As discussed above, different lamp embodiments according to the present invention can be arranged with many different types of light sources. FIG. 29 shows another embodiment of a lamp 210 similar to the lamp 50 described above and shown in FIG. 4. The lamp 210 comprises a heat sink structure 212 having a cavity 214 with a platform 216 arranged to hold a light source 218. A phosphor carrier 220 can be included over and at least partially covering the opening to the cavity 214. In this embodiment, the light source 218 can comprise a plurality of LEDs arranged in separate LED packages or arranged in an array in single multiple LED packages. For the embodiments comprising separate LED packages, each of the LEDs can comprise its own primary optics or lens 222. In embodiments having a single multiple LED package, a single primary optic or lens 224 can cover all the LEDs. It is also understood that the LED and LED arrays can have secondary optics or can be provided with a combination of primary and secondary optics. It is understood that the LEDs can be provided without lenses and that in the array embodiments each of the LEDs can have its own lens. Like the lamp 50, the heat sink structure and platform can be arranged with the necessary electrical traces or wires to provide an electrical signal to the light source 218. In each embodiment, the emitters can be coupled on different series and parallel arrangement. In one embodiment eight LEDs can be used that are connected in series with two wires to a circuit board. The wires can then be connected to the power supply unit described above. In other embodiments, more or less than eight LEDs can be used and as mentioned above, commercially available LEDs from Cree, Inc. can used including eight XLamp® XP-E LEDs or four XLamp® XP-G LEDs. Different single string LED circuits are described in U.S. patent application Ser. No. 12/566,195, to van de Ven et al., entitled "Color Control of Single String Light Emitting Devices Having Single String Color Control, and U.S. patent application Ser. No. 12/704,730 to van de Ven et al., entitled "Solid State Lighting Apparatus with Compensation Bypass Circuits and Methods of Operation Thereof", both of with are incorporated herein by reference.

In the lamps 50 and 210 described above, the light source and the phosphor carrier share a thermal path for dissipating heat, referred to as being thermally coupled. In some embodiments the heat dissipation of the phosphor carrier may be enhanced if the thermal paths for the phosphor carrier and the light source are not thermally connected, referred to as thermally decoupled.

Figure 30:
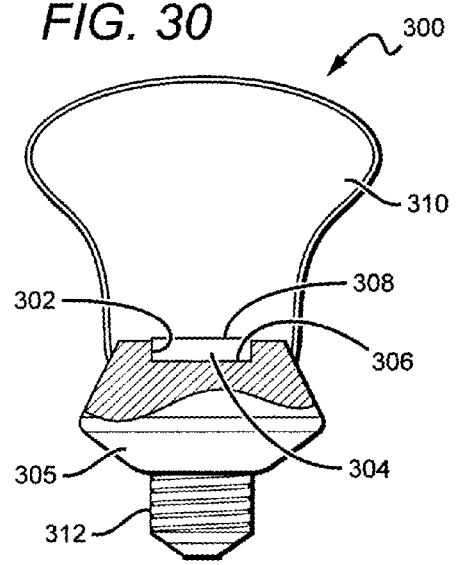
FIG. 30 is a sectional view of another embodiment of a lamp according to the present invention.

FIG. 30 shows still another embodiment of lamp 300 according to the present invention that comprises an optical cavity 302 within a heat sink structure 305. Like the embodiments above, the lamp 300 can also be provided without a lamp cavity, with the LEDs mounted on a surface of the heat sink or on a three dimensional or pedestal structures having different shapes. A planar LED based light source 304 is mounted to the platform 306, and a phosphor carrier 308 is mounted to the top opening of the cavity 302, with the phosphor carrier 308 having any of the features of those described above. In the embodiment shown, the phosphor carrier 308 can be in a flat disk shape and comprises a thermally conductive transparent material and a phosphor layer. It can be mounted to the cavity with a thermally conductive material or device as described above. The cavity 302 can have reflective surfaces to enhance the emission efficiency as described above.

Light from the light source 304 passes through the phosphor carrier 308 where a portion of it is converted to a different wavelength of light by the phosphor in the phosphor carrier 308. In one embodiment the light source 304 can comprise blue emitting LEDs and the phosphor carrier 308 can comprise a yellow phosphor as described above that absorbs a portion of the blue light and re-emits yellow light. The lamp 300 emits a white light combination of LED light and yellow phosphor light. Like above, the light source 304 can also comprise many different LEDs emitting different colors of light and the phosphor carrier can comprise other phosphors to generate light with the desired color temperature and rendering.

The lamp 300 also comprises a shaped diffuser dome 310 mounted over the cavity 302 that includes diffusing or scattering particles such as those listed above. The scattering particles can be provided in a curable binder that is formed in the general shape of dome. In the embodiment shown, the dome 310 is mounted to the heat sink structure 305 and has an enlarged portion at the end opposite the heat sink structure 305. Different binder materials can be used as discussed above such as silicones, epoxies, glass, inorganic glass, dielectrics, BCB, polymides, polymers and hybrids thereof. In some embodiments white scattering particles can be used with the dome having a white color that hides the color of the phosphor in the phosphor carrier 308 in the optical cavity. This gives the overall lamp 300 a white appearance that is generally more visually acceptable or appealing to consumers than the color of the phosphor. In one embodiment the diffuser can include white titanium dioxide particles that can give the diffuser dome 310 its overall white appearance.

The diffuser dome 310 can provide the added advantage of distributing the light emitting from the optical cavity in a more uniform pattern. As discussed above, light from the light source in the optical cavity can be emitted in a generally Lambertian pattern and the shape of the dome 310 along with the scattering properties of the scattering particles causes light to emit from the dome in a more omnidirectional emission pattern. An engineered dome can have scattering particles in different concentrations in different regions or can be shaped to a specific emission pattern. In some embodiments the dome can be engineered so that the emission pattern from the lamp complies with the Department of Energy (DOE) Energy Star defined omnidirectional distribution criteria. One requirement of this standard met by the lamp 300 is that the emission uniformity must be within 20% of mean value from 0 to 135° viewing and; >5% of total flux from the lamp must be emitted in the 135-180° emission zone, with the measurements taken at 0, 45, 90° azimuthal angles. As mentioned above, the different lamp embodiments described herein can also comprise A-type retrofit LED bulbs that meet the DOE Energy Star standards. The present invention provides lamps that are efficient, reliable and cost effective. In some embodiments, the entire lamp can comprise five components that can be quickly and easily assembled.

Like the embodiments above, the lamp 300 can comprise a mounting mechanism of the type to fit in conventional electrical receptacles. In the embodiment shown, the lamp 300 includes a screw-threaded portion 312 for mounting to a standard Edison socket. Like the embodiments above, the lamp 300 can include standard plug and the electrical receptacle can be a standard outlet, or can comprise a GU24 base unit, or it can be a clip and the electrical receptacle can be a receptacle which receives and retains the clip (e.g., as used in many fluorescent lights).

As mentioned above, the space between some of the features of the lamp 300 can be considered mixing chambers, with the space between the light source 306 and the phosphor carrier 308 comprising a first light mixing chamber. The space between the phosphor carrier 308 and the diffuser 310 can comprise a second light mixing chamber, with the mixing chamber promoting uniform color and intensity emission for the lamp. The same can apply to the embodiments below having different shaped phosphor carriers and diffusers. In other embodiments, additional diffusers and/or phosphor carriers can be included forming additional mixing chambers, and the diffusers and/or phosphor carriers can be arranged in different orders.

Figure 31:
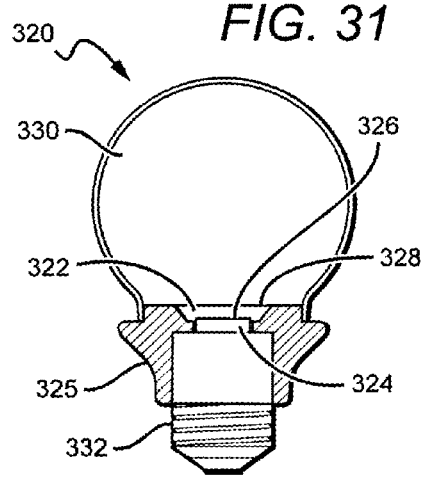
FIG. 31 is a sectional view of another embodiment of a lamp according to the present invention having a diffuser dome.

Different lamp embodiments according to the present invention can have many different shapes and sizes. FIG. 31 shows another embodiment of a lamp 320 according to the present invention that is similar to the lamp 300 and similarly comprises an optical cavity 322 in a heat sink structure 325 with a light source 324 mounted to the platform 326 in the optical cavity 322. Like above, the heat sink structure need not have an optical cavity, and the light sources can be provided on other structures beyond a heat sink structure. These can include planar surfaces or pedestals having the light source. A phosphor carrier 328 is mounted over the cavity opening with a thermal connection. The lamp 320 also comprises a diffuser dome 330 mounted to the heat sink structure 325, over the optical cavity. The diffuser dome can be made of the same materials as diffuser dome 310 described above and shown in FIG. 15, but in this embodiment the dome 300 is oval or egg shaped to provide a different lamp emission pattern while still masking the color from the phosphor in the phosphor carrier 328. It is also noted that the heat sink structure 325 and the platform 326 are thermally de-coupled. That is, there is a space between the platform 326 and the heat sink structure such that they do not share a thermal path for dissipating heat. As mentioned above, this can provide improved heat dissipation from the phosphor carrier compared to lamps not having de-coupled heat paths. The lamp 300 also comprises a screw-threaded portion 332 for mounting to an Edison socket.

Figure 32:
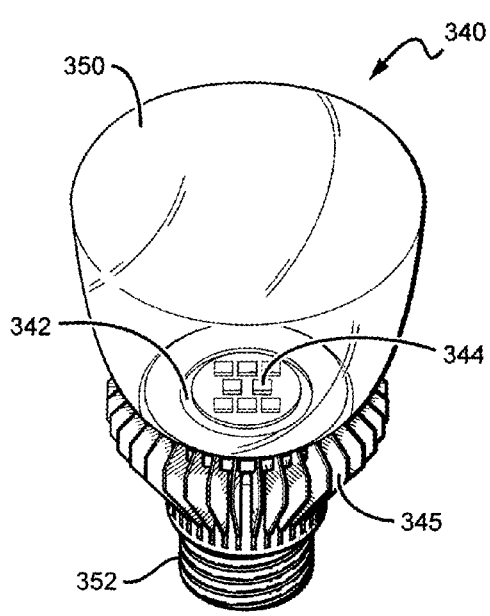
FIG. 32 is a perspective view of another embodiment of a lamp according to the present invention with a diffuser dome having a different shape.
Figure 33:
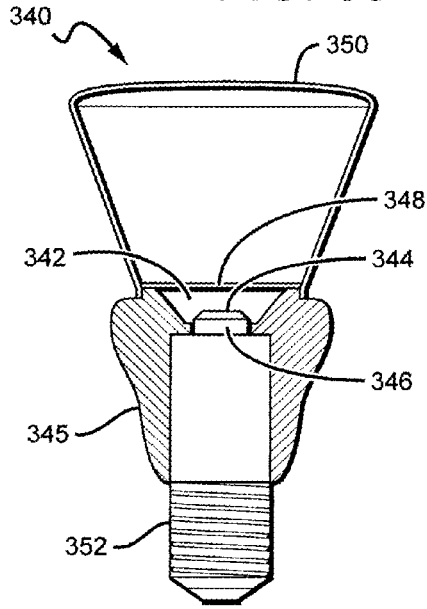
FIG. 33 is a sectional view of the lamp shown in FIG. 32.
Figure 34:
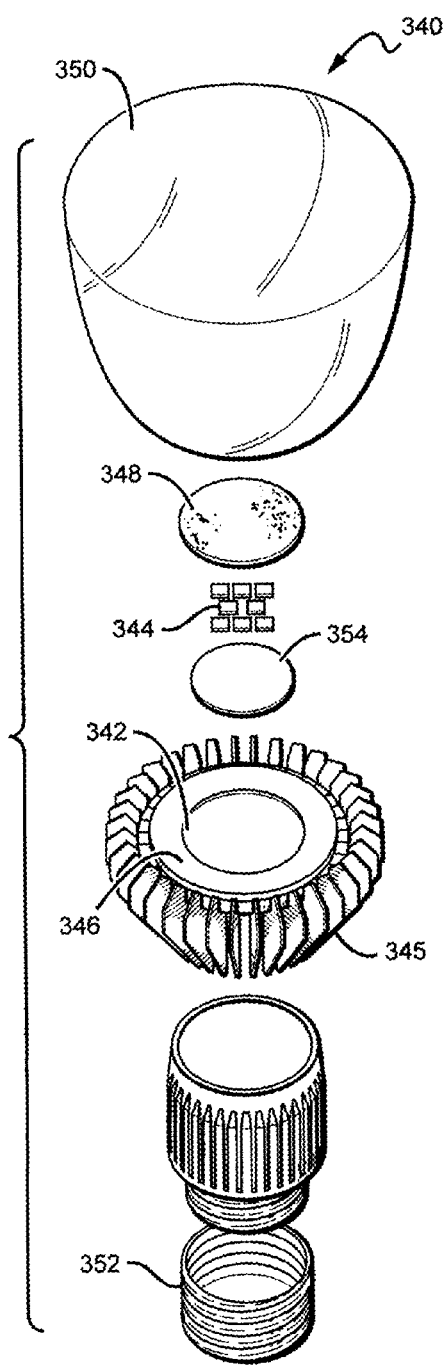
FIG. 34 is an exploded view of the lamp shown in FIG. 32.

FIGS. 32 through 34 show another embodiment of a lamp 340 according to the present invention that is similar to the lamp 320 shown in FIG. 31. It comprises a heat sink structure 345 having an optical cavity 342 with a light source 344 on the platform 346, and a phosphor carrier 348 over the optical cavity. It further comprises a screw-threaded portion 352. It also includes a diffuser dome 350, but in this embodiment the diffuser dome is flattened on top to provide the desired emission pattern while still masking the color of the phosphor.

The lamp 340 also comprises an interface layer 354 between the light source 344 and the heat sink structure 345 from the light source 344. In some embodiments the interface layer can comprise a thermally insulating material and the light source 344 can have features that promote dissipation of heat from the emitters to the edge of the light source's substrate. This can promote heat dissipation to the outer edges of the heat sink structure 345 where it can dissipate through the heat fins. In other embodiments the interface layer 354 can be electrically insulating to electrically isolate the heat sink structure 345 from the light source 344. Electrical connection can then be made to the top surface of the light source.

In the embodiments above, the phosphor carriers are two dimensional (or flat/planar) with the LEDs in the light source being co-planer. It is understood, however, that in other lamp embodiments the phosphor carriers can take many different shapes including different three-dimensional shapes. The term three-dimensional is meant to mean any shape other than planar as shown in the above embodiments. FIGS. 35 through 38 show different embodiments of three-dimensional phosphor carriers according to the present invention, but it is understood that they can also take many other shapes. As discussed above, when the phosphor absorbs and re-emits light, it is re-emitted in an isotropic fashion, such that the 3-dimensional phosphor carrier serves to convert and also disperse light from the light source. Like the diffusers described above, the different shapes of the 3-dimensional carrier layers can emit light in emission patterns having different characteristics that depends partially on the emission pattern of the light source. The scattering and converting properties of the phosphor layer may also vary across the surface of the phosphor carrier. The diffuser can then be matched with the emission of the phosphor carrier to provide the desired lamp emission pattern.

Figure 35:
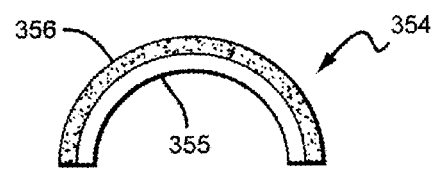
FIG. 35 is a sectional view of one embodiment of a three-dimensional phosphor carrier according to the present invention.

FIG. 35 shows a hemispheric shaped phosphor carrier 354 comprising a hemispheric carrier 355 and phosphor layer 356. The hemispheric carrier 355 can be made of the same materials as the carrier layers described above, and the phosphor layer can be made of the same materials as the phosphor layer described above, and scattering particles can be included in the carrier and phosphor layer as described above.

In this embodiment the phosphor layer 356 is shown on the outside surface of the carrier 355 although it is understood that the phosphor layer can be on the carrier's inside layer, mixed in with the carrier, or any combination of the three. In some embodiments, having the phosphor layer on the outside surface may minimize emission losses. When emitter light is absorbed by the phosphor layer 356 it is emitted omnidirectionally and some of the light can emit backwards and be absorbed by the lamp elements such as the LEDs. The phosphor layer 356 can also have an index of refraction that is different from the hemispheric carrier 355 such that light emitting forward from the phosphor layer can be reflected back from the inside surface of the carrier 355. This light can also be lost due to absorption by the lamp elements. With the phosphor layer 356 on the outside surface of the carrier 355, light emitted forward does not need to pass through the carrier 355 and will not be lost to reflection. Light that is emitted back will encounter the top of the carrier where at least some of it will reflect back. This arrangement results in a reduction of light from the phosphor layer 356 that emits back into the carrier where it can be absorbed.

The phosphor layer 356 can be deposited using many of the same methods described above. In some instances the three-dimensional shape of the carrier 355 may require additional steps or other processes to provide the necessary coverage. In the embodiments where a solvent-phosphor-binder mixture is sprayed and the carrier can be heated as described above and multiple spray nozzles may be needed to provide the desired coverage over the carrier, such as approximate uniform coverage. In other embodiments, fewer spray nozzles can be used while spinning the carrier to provide the desired coverage. Like above, the heat from the carrier 355 can evaporate the solvent and helps cure the binder.

In still other embodiments, the phosphor layer can be formed through an emersion process whereby the phosphor layer can be formed on the inside or outside surface of the carrier 355, but is particularly applicable to forming on the inside surface. The carrier 355 can be at least partially filled with, or otherwise brought into contact with, a phosphor mixture that adheres to the surface of the carrier. The mixture can then be drained from the carrier leaving behind a layer of the phosphor mixture on the surface, which can then be cured. In one embodiment, the mixture can comprise polyethylen oxide (PEO) and a phosphor. The carrier can be filled and then drained, leaving behind a layer of the PEO-phosphor mixture, which can then be heat cured. The PEO evaporates or is driven off by the heat leaving behind a phosphor layer. In some embodiments, a binder can be applied to further fix the phosphor layer, while in other embodiments the phosphor can remain without a binder.

Like the processes used to coat the planar carrier layer, these processes can be utilized in three-dimensional carriers to apply multiple phosphor layers that can have the same or different phosphor materials. The phosphor layers can also be applied both on the inside and outside of the carrier, and can have different types having different thickness in different regions of the carrier. In still other embodiments different processes can be used such as coating the carrier with a sheet of phosphor material that can be thermally formed to the carrier.

In lamps utilizing the carrier 355, an emitter can be arranged at the base of the carrier so that light from the emitters emits up and passes through the carrier 355. In some embodiments the emitters can emit light in a generally Lambertian pattern, and the carrier can help disperse the light in a more uniform pattern.

Figure 36:
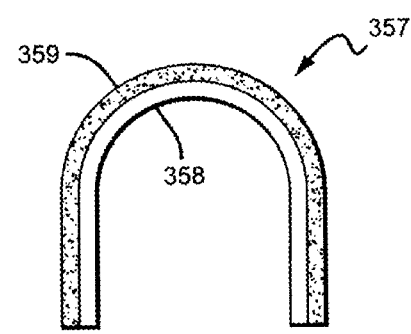
FIG. 36 is a sectional view of another embodiment of a three-dimensional phosphor carrier according to the present invention.
Figure 37:
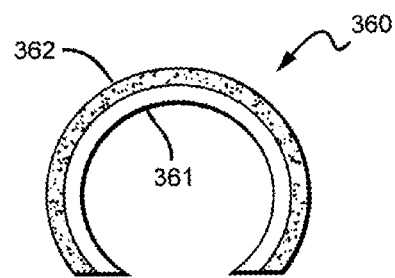
FIG. 37 is a sectional view of another embodiment of a three-dimensional phosphor carrier according to the present invention.

FIG. 36 shows another embodiment of a three dimensional phosphor carrier 357 according to the present invention comprising a bullet-shaped carrier 358 and a phosphor layer 359 on the outside surface of the carrier. The carrier 358 and phosphor layer 359 can be formed of the same materials using the same methods as described above. The different shaped phosphor carrier can be used with a different emitter to provide the overall desired lamp emission pattern. FIG. 37 shows still another embodiment of a three dimensional phosphor carrier 360 according to the present invention comprising a globe-shaped carrier 361 and a phosphor layer 362 on the outside surface of the carrier. The carrier 361 and phosphor layer 362 can be formed of the same materials using the same methods as described above.

Figure 38:
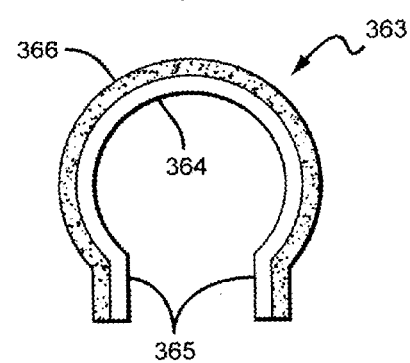
FIG. 38 is a sectional view of another embodiment of a three-dimensional phosphor carrier according to the present invention.

FIG. 38 shows still another embodiment phosphor carrier 363 according to the present invention having a generally globe shaped carrier 364 with a narrow neck portion 365. Like the embodiments above, the phosphor carrier 363 includes a phosphor layer 366 on the outside surface of the carrier 364 made of the same materials and formed using the same methods as those described above. In some embodiments, phosphor carriers having a shape similar to the carrier 364 can be more efficient in converting emitter light and re-emitting light from a Lambertian pattern from the light source, to a more uniform emission pattern.

Embodiments having a three-dimensional structure holding the LED, such as a pedestal, can provide an even more dispersed light pattern from the three-dimensional phosphor carrier. In these embodiments, the LEDs can be within the phosphor carrier at different angles so that they provide a light emitting pattern that is less Lambertian than a planar LED light source. This can then be further dispersed by the three-dimensional phosphor carrier, with the disperser fine-tuning the lamp's emission pattern.

Figure 39:
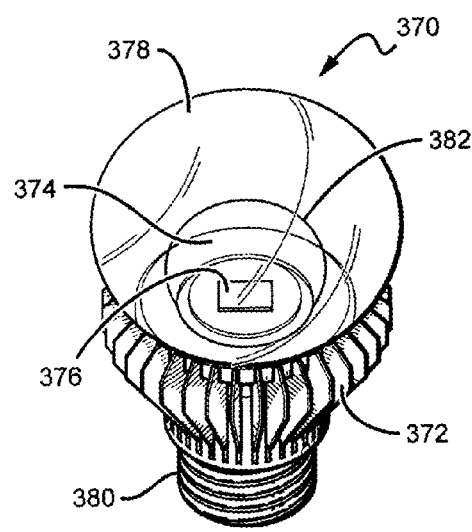
FIG. 39 is a perspective view of another embodiment of a lamp according to the present invention with a three-dimensional phosphor carrier.
Figure 41:
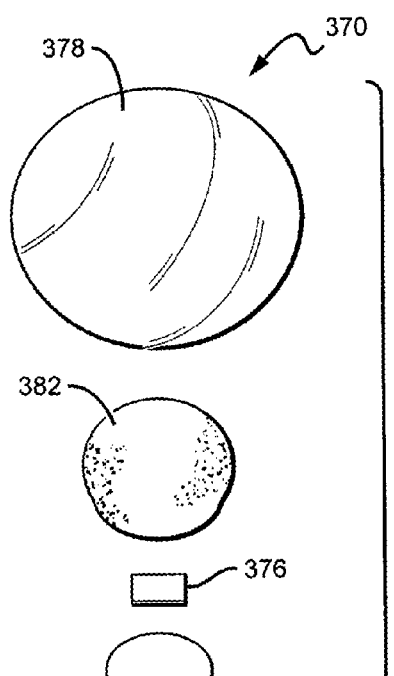
FIG. 41 is an exploded view of the lamp shown in FIG. 39.
Figure 40:
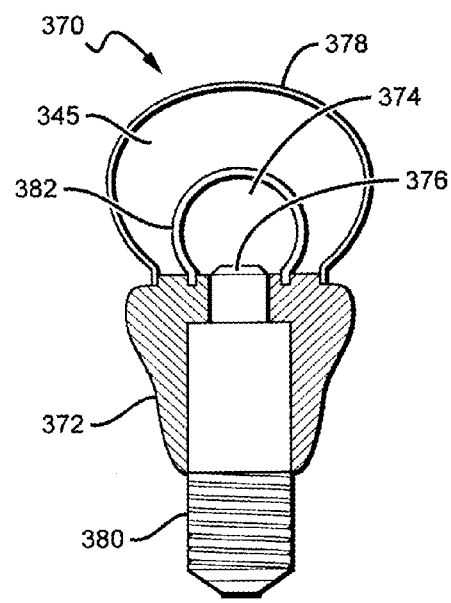
FIG. 40 is a sectional view of the lamp shown in FIG. 39.

FIGS. 39 through 41 show another embodiment of a lamp 370 according to the present invention having a heat sink structure 372, optical cavity 374, light source 376, diffuser dome 378 and a screw-threaded portion 380. This embodiment also comprises a three-dimensional phosphor carrier 382 that includes a thermally conductive transparent material and one phosphor layer. It is also mounted to the heat sink structure 372 with a thermal connection. In this embodiment, however, the phosphor carrier 382 is hemispheric shaped and the emitters are arranged so that light from the light source passes through the phosphor carrier 382 where at least some of it is converted.

The shape of the three dimensional phosphor carrier 382 provides natural separation between it and the light source 376. Accordingly, the light source 376 is not mounted in a recess in the heat sink that forms the optical cavity. Instead, the light source 376 is mounted on the top surface of the heat sink structure 372, with the optical cavity 374 formed by the space between the phosphor carrier 382 and the top of the heat sink structure 372.

In embodiments of the lamp 370 utilizing blue emitting LEDs for the light source 376 and yellow phosphor, the phosphor carrier 382 can appear yellow, and the diffuser dome 378 masks this color while dispersing the lamp light into the desired emission pattern. In lamp 370, the conductive paths for the platform and heat sink structure are coupled, but it is understood that in other embodiments they can be decoupled.

Figure 42:
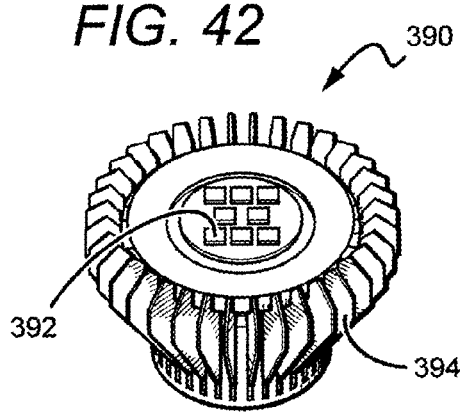
FIG. 42 is a perspective view of one embodiment of a lamp according to the present invention comprising a heat sink and light source.
Figure 43:
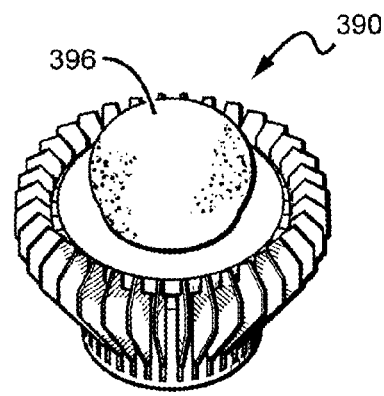
FIG. 43 is a perspective view of the lamp in FIG. 42 with a dome shaped phosphor carrier.
Figure 44:
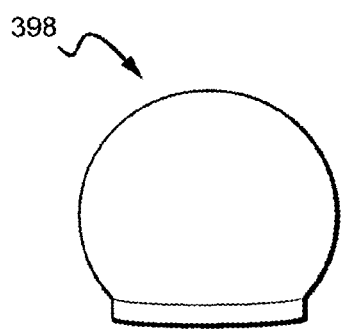
FIG. 44 is a side view of one embodiment of a dome shaped diffuser according to the present invention.
Figure 45:
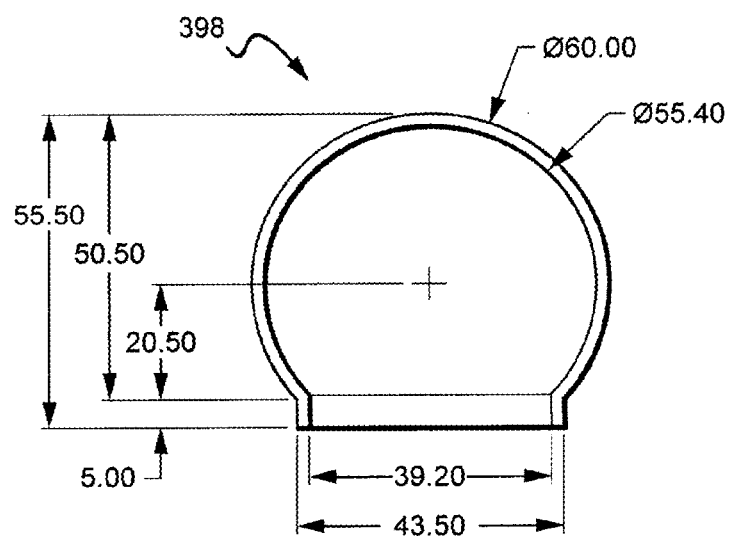
FIG. 45 is a sectional view of the embodiment of dome shaped diffuser shown in FIG. 44 with dimensions.

FIG. 42 shows one embodiment of a lamp 390 according to the present invention comprising an eight LED light source 392 mounted on a heat sink 394 as described above. The emitters can be coupled together in many different ways and in the embodiment shown are serially connected. It is noted that in this embodiment the emitters are not mounted in an optical cavity, but are instead mounted on top planar surface of the heat sink 394. FIG. 43 shows the lamp 390 shown in FIG. 42 with a dome-shaped phosphor carrier 396 mounted over the light source 392. The lamp 390 shown in FIG. 43 can be combined with the diffuser 398 as shown in FIGS. 44 and 45 to form a lamp dispersed light emission.

Figure 46:
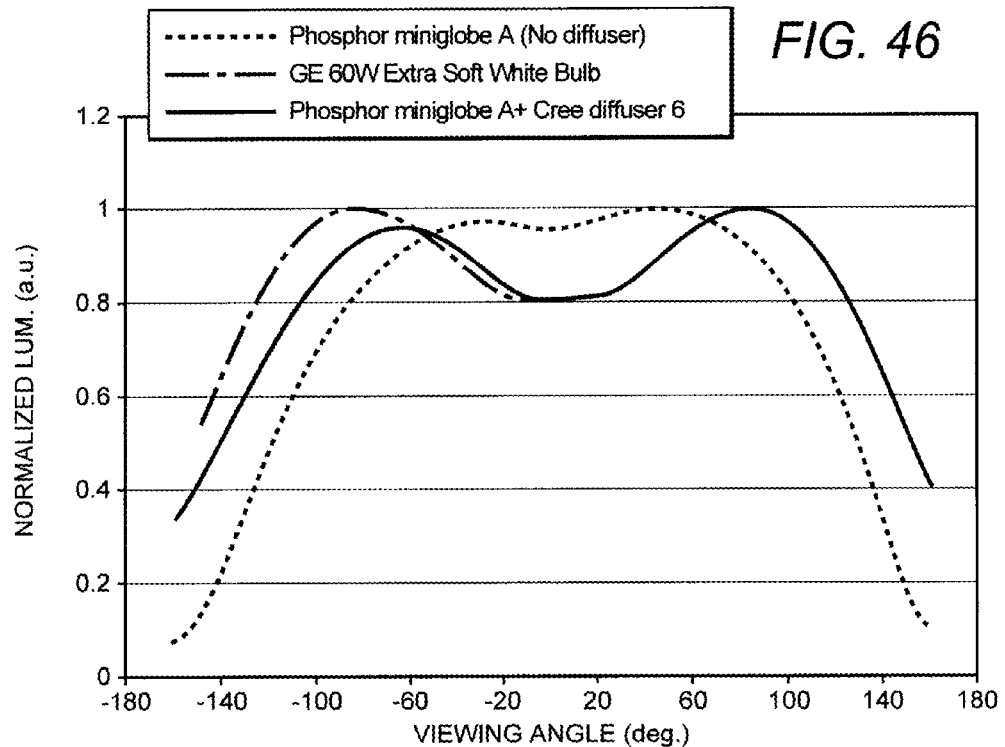
FIGS. 46 through 49 are graphs showing the emission characteristics of a lamp with the globe shaped phosphor carrier in FIG. 43 and dome shaped diffuser shown in FIGS. 44 and 45.
Figure 47:
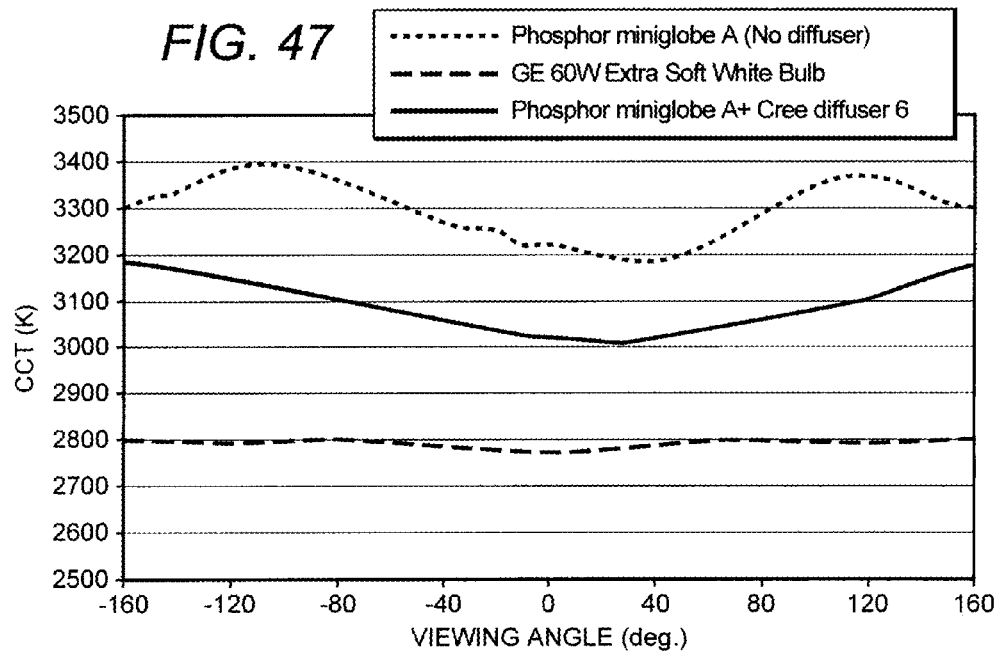
Figure 48:
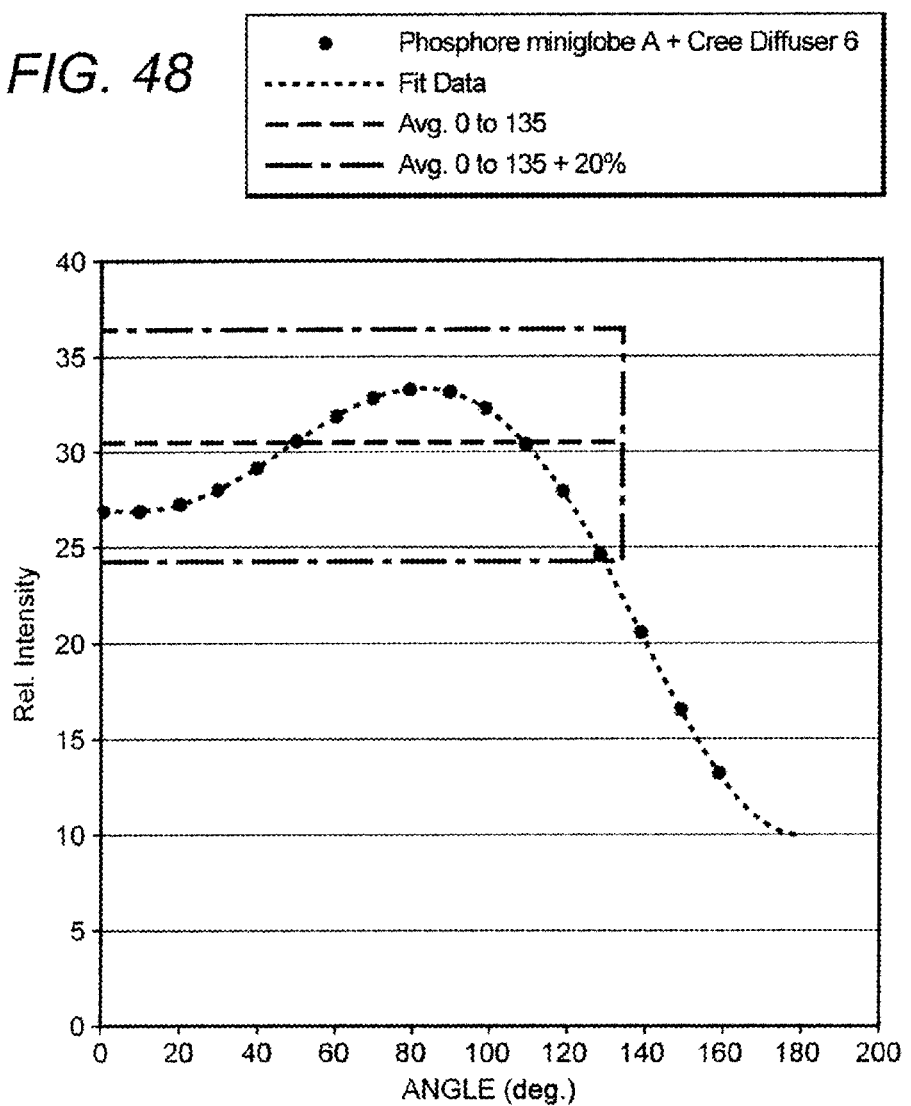
Figure 49:
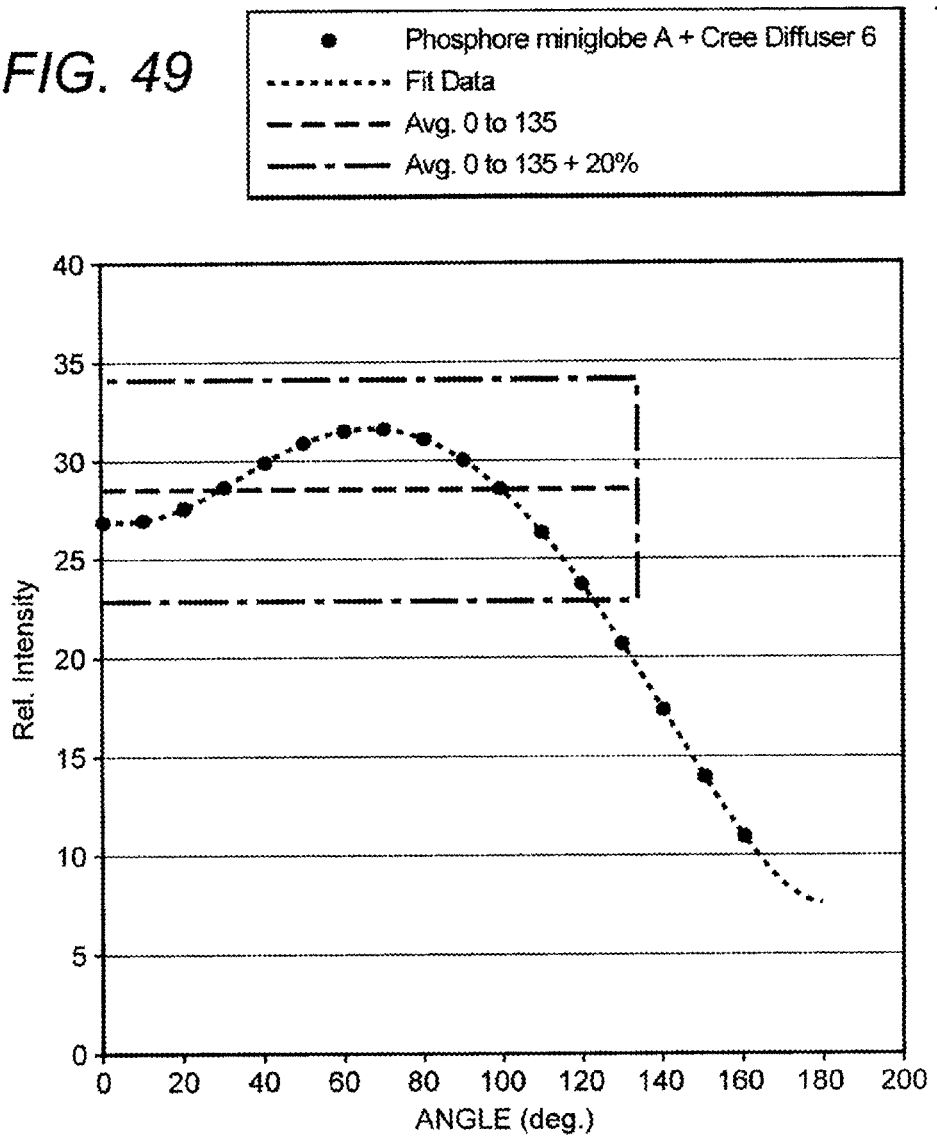
Figure 50:
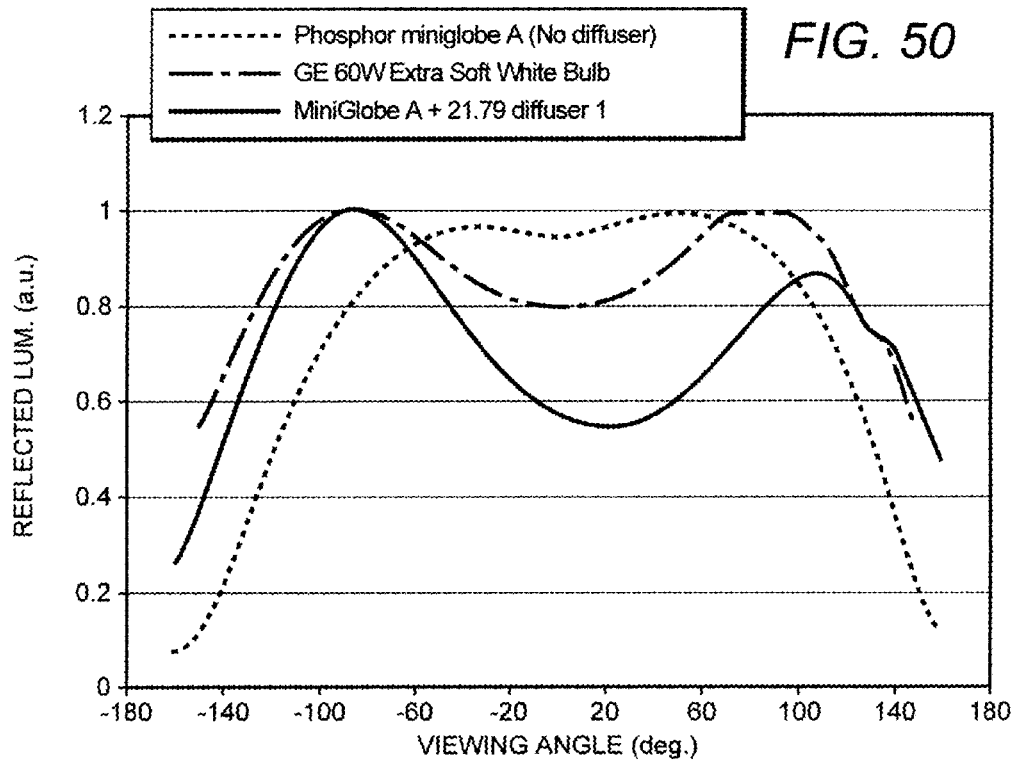
FIGS. 50 through 53 are graphs showing the emission characteristics of a lamp with the diffuser shown in FIG. 10 and phosphor globe shown in FIG. 43.
Figure 51:
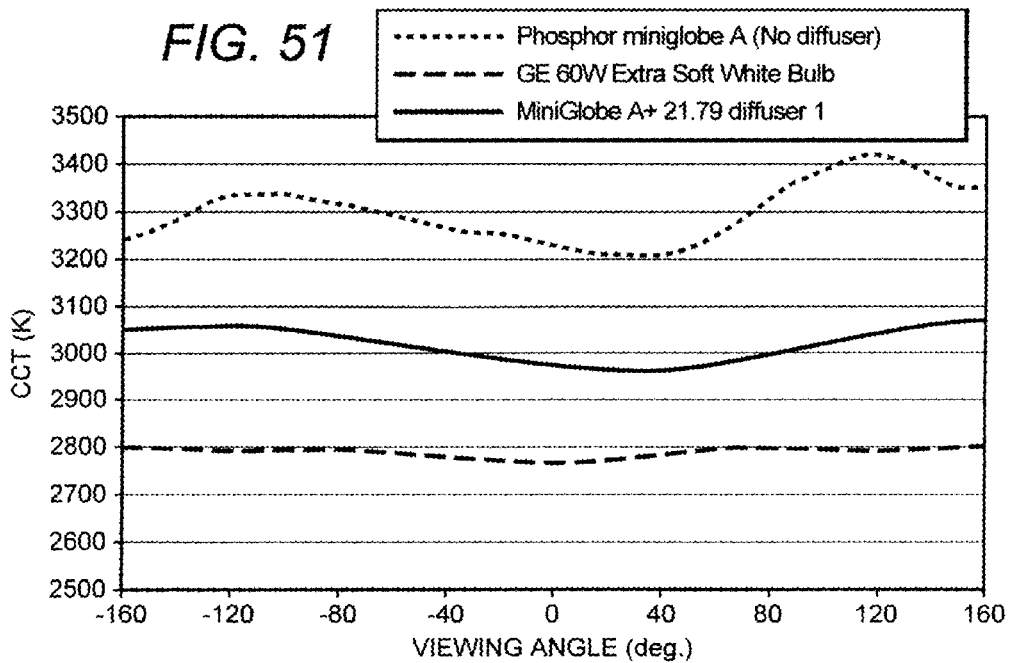
Figure 52:
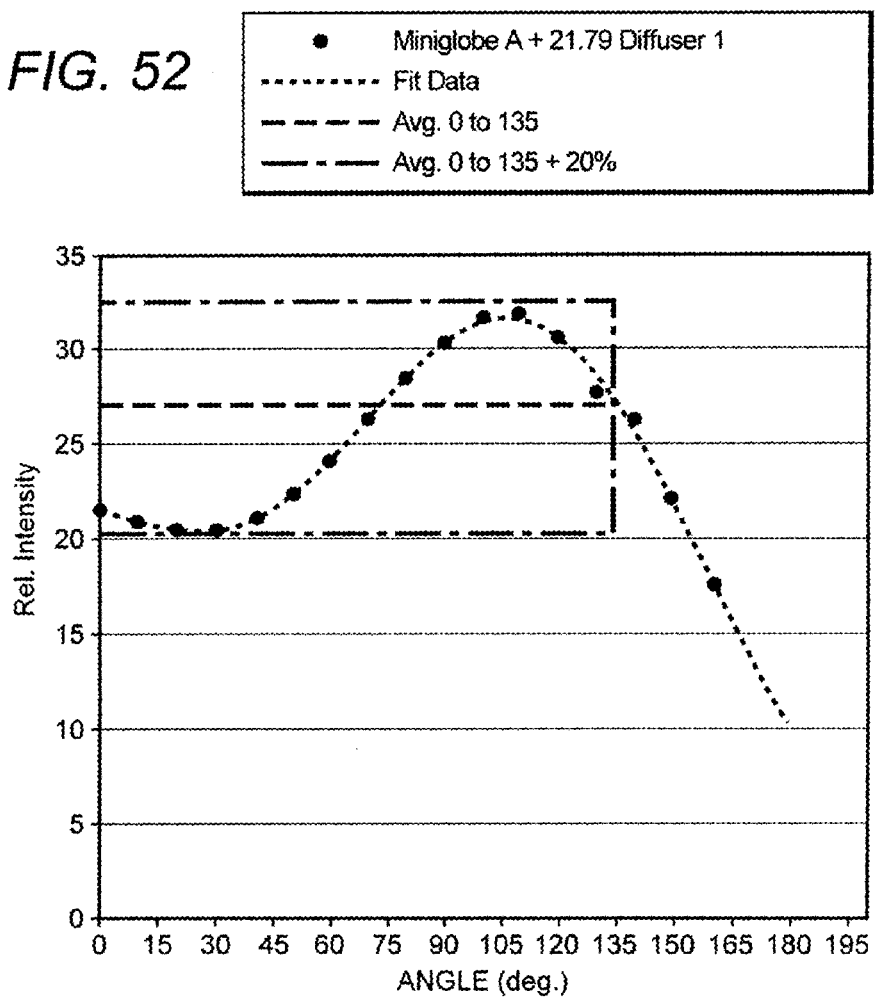
Figure 53:
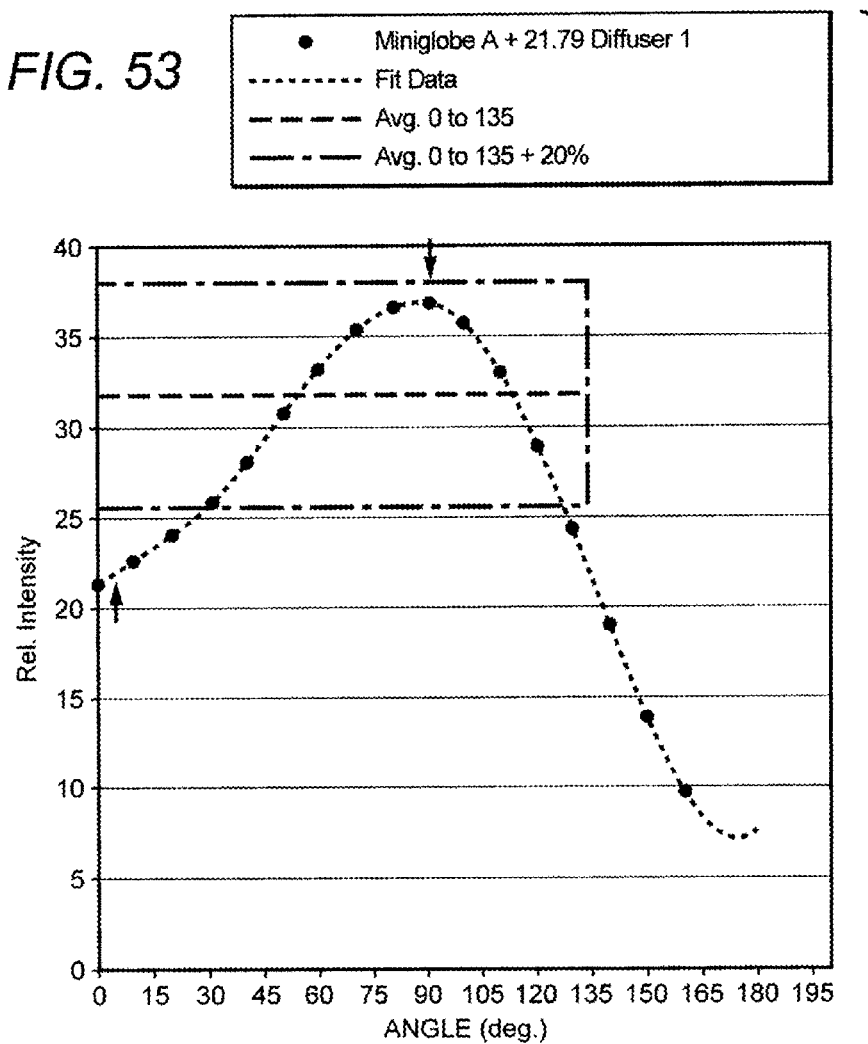
Figure 54:
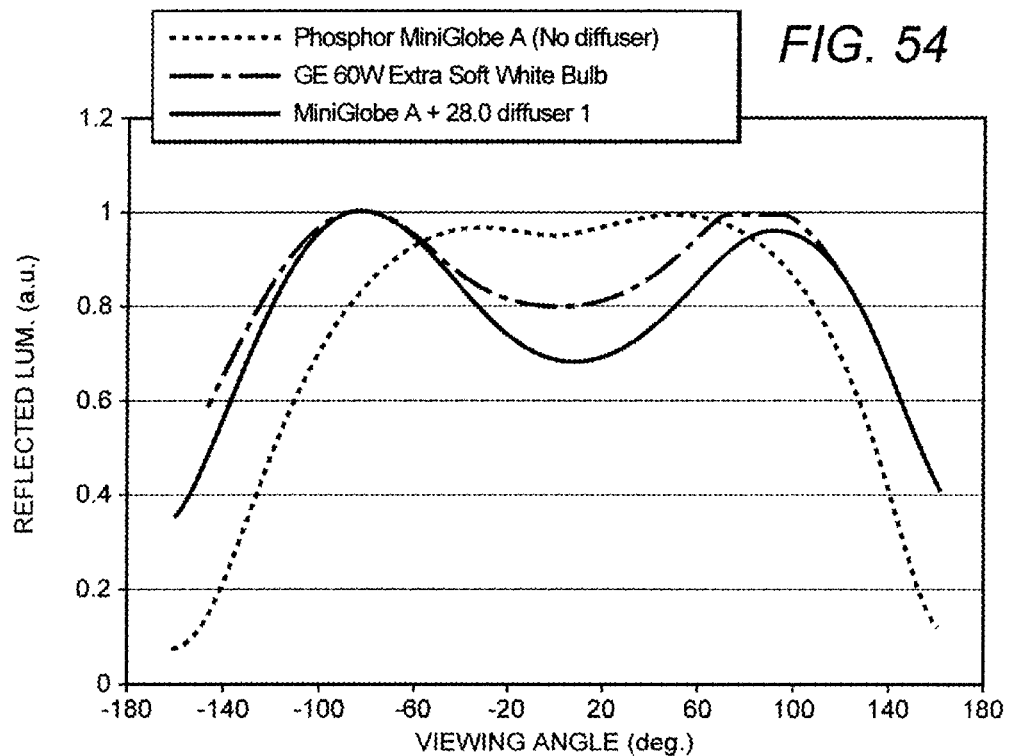
FIGS. 54 through 57 are graphs showing the emission characteristics of a lamp with the diffuser shown in FIG. 11 and phosphor globe shown in FIG. 43.
Figure 55:
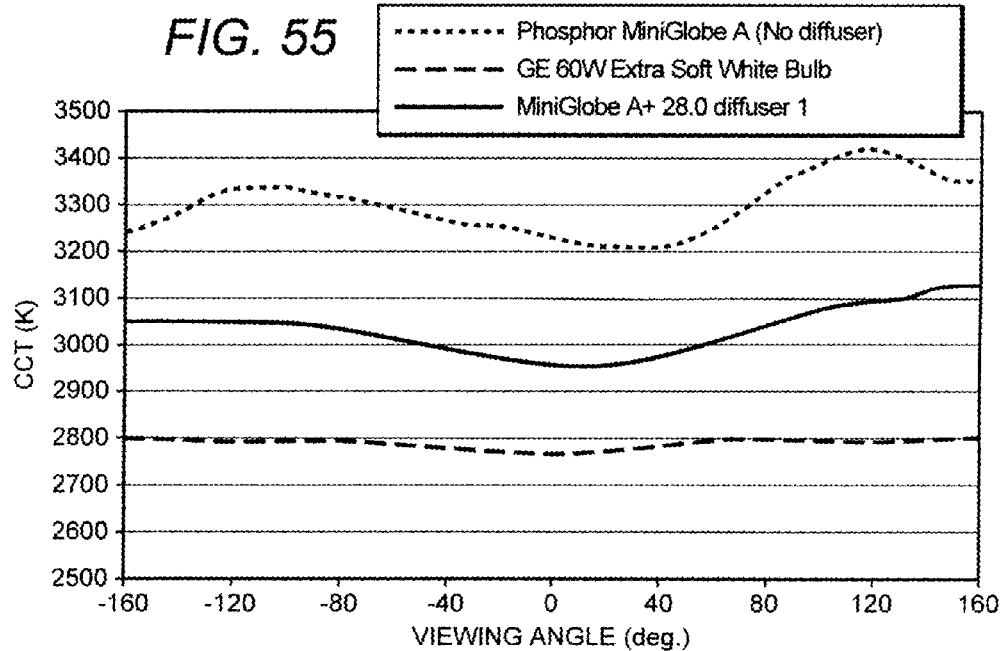
Figure 56:
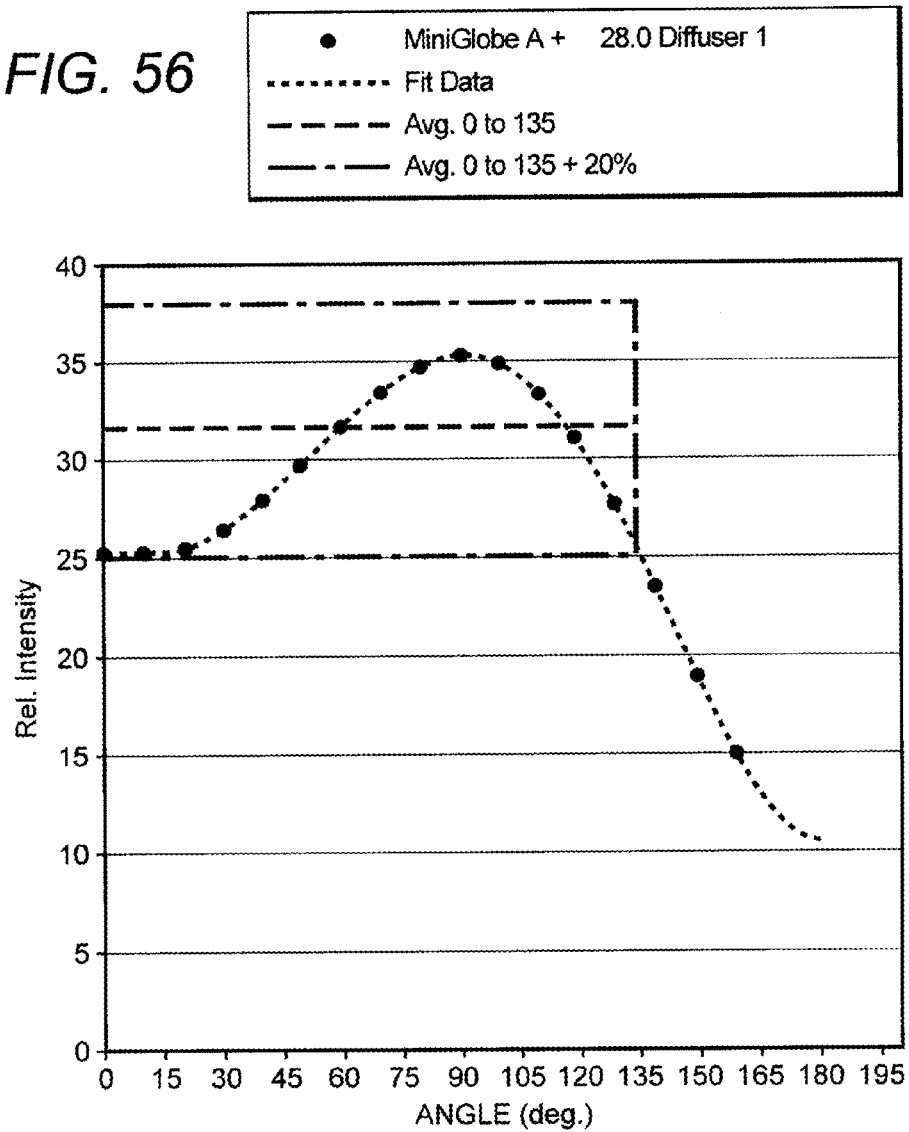
Figure 57:
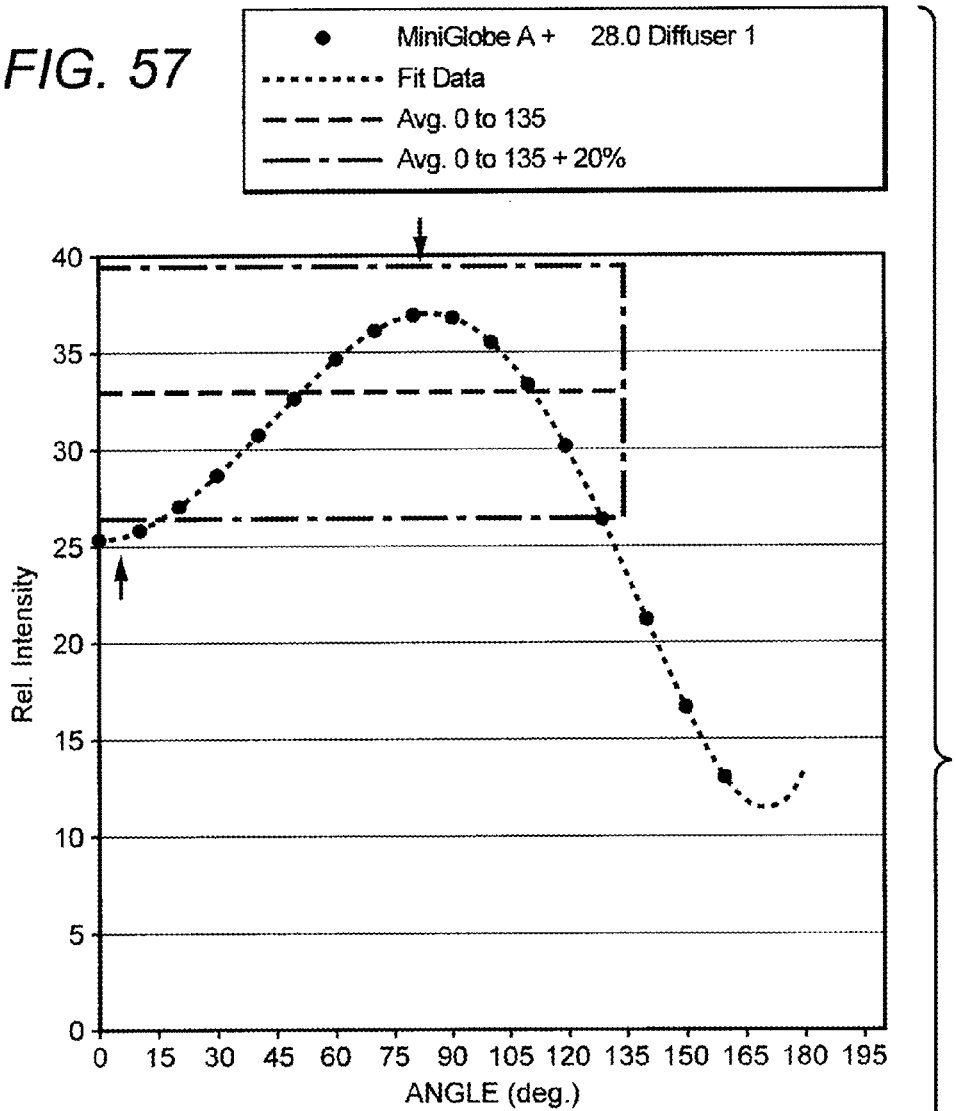
Figure 58:
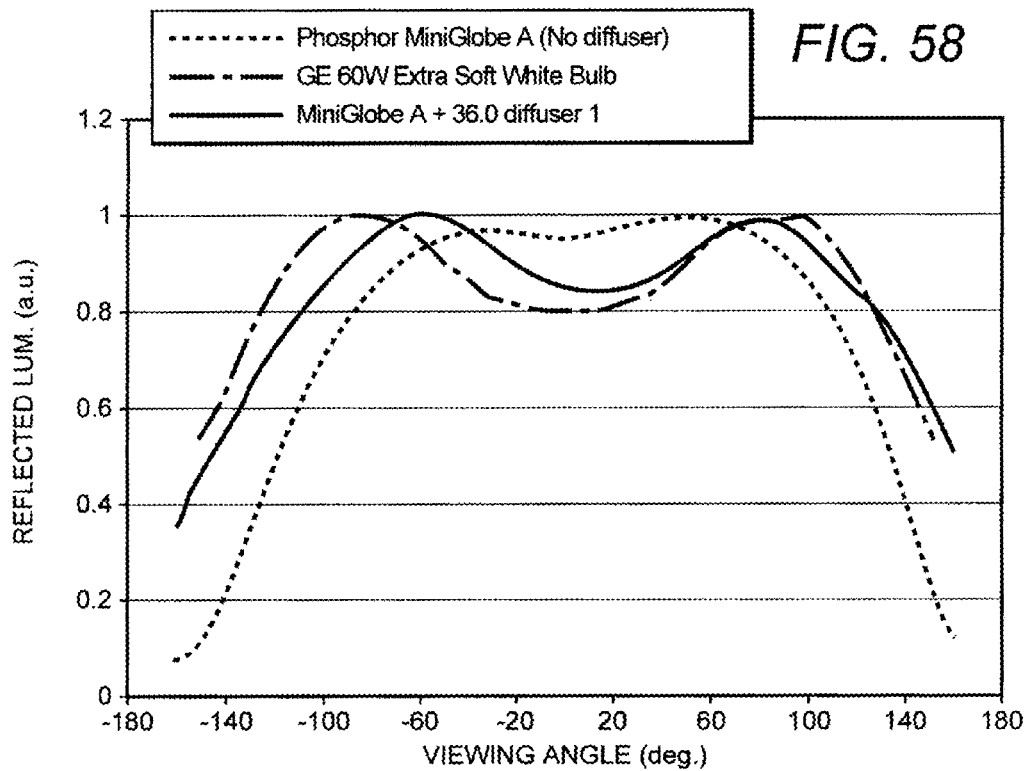
FIGS. 58 through 61 are graphs showing the emission characteristics of a lamp with the diffuser shown in FIG. 12 and phosphor globe shown in FIG. 43.
Figure 59:
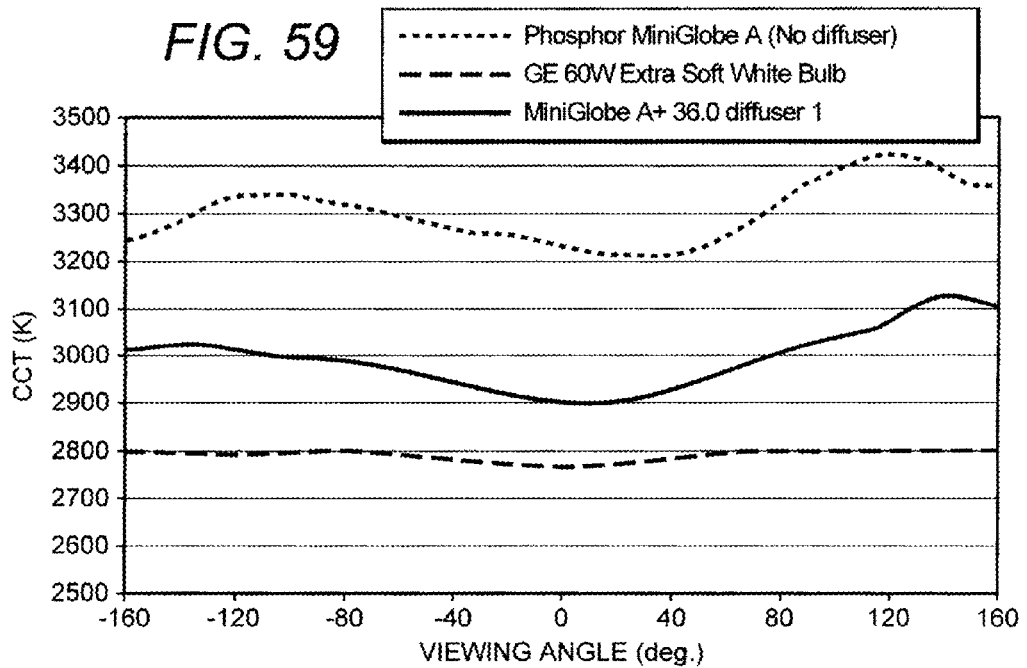
Figure 60:
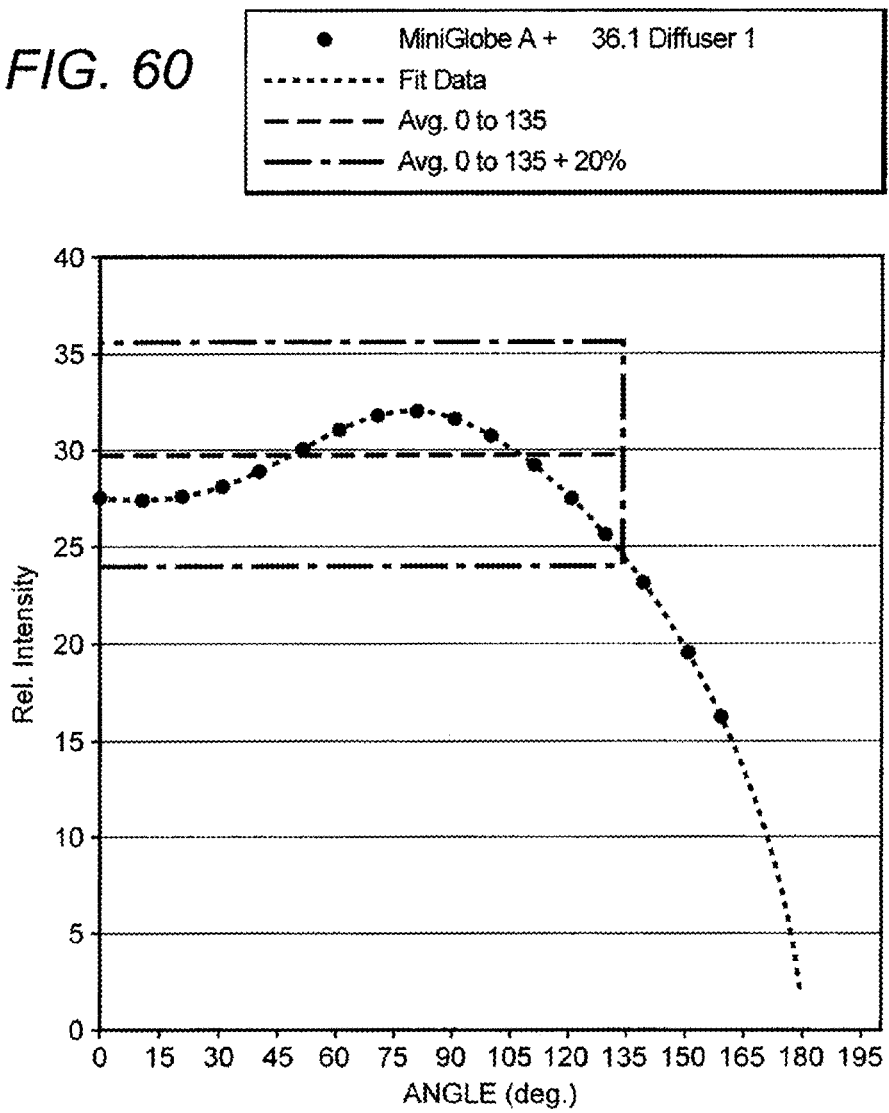
Figure 61:
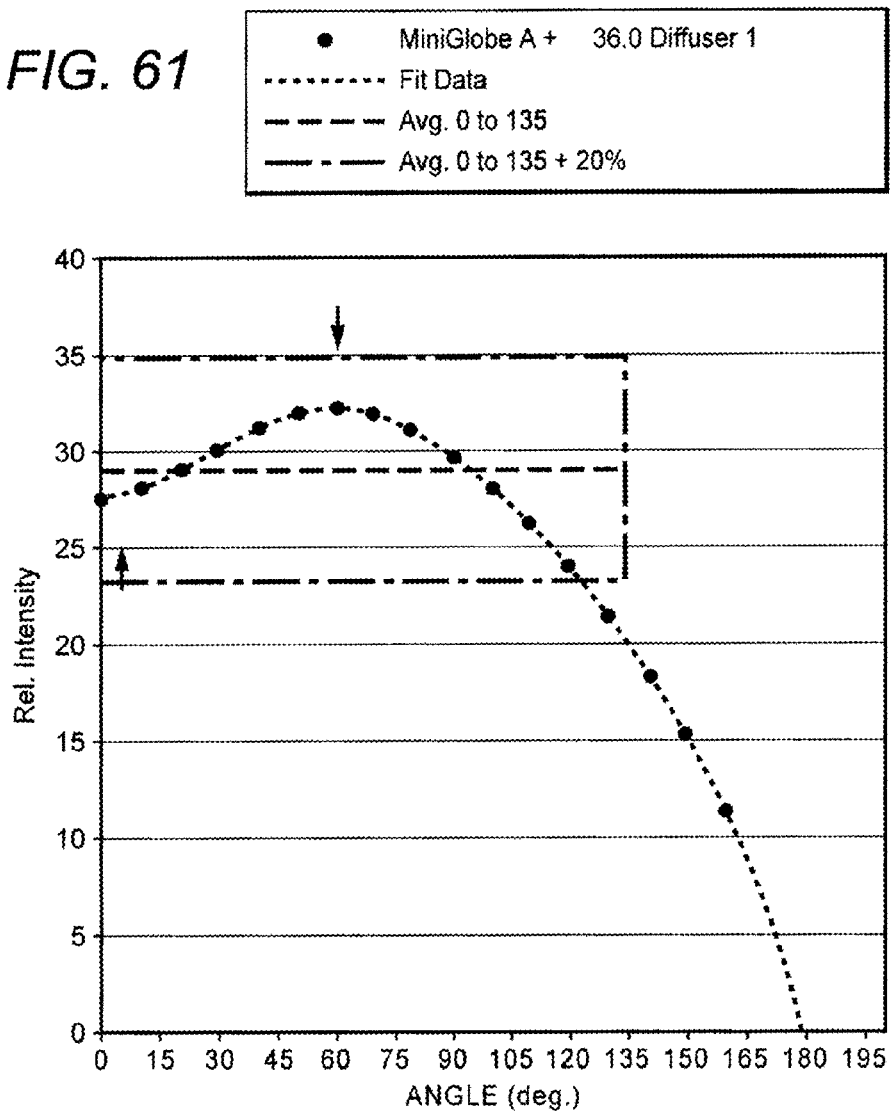

FIGS. 46 through 49 are graphs showing the emission characteristics for a lamp 390 according to the present invention having a dome shaped three-dimensional phosphor carrier with the diffuser 398 arranged over the phosphor so that light from the phosphor carrier passes through the diffuser. FIGS. 46 and 47 show the emission characteristics of the lamp compared to the lamp without a diffuser, and also compared to a standard General Electric 60 W Extra Soft Light Bulb. FIGS. 48 and 49 show variations in emission intensity from viewing angles 0 to 180°.

FIGS. 50 through 53 are similar to the graphs in FIGS. 46 through 49 and show the emission characteristics for a lamp according to the present invention also having a dome shaped three-dimensional phosphor carrier with the diffuser 140 as shown in FIG. 10 arranged over the phosphor carrier. FIGS. 54 through 57 are also similar to those in FIGS. 46 through 49 and show the emission characteristics for another lamp according to the present invention also having a dome shaped three-dimensional phosphor carrier with the diffuser 150 as shown in FIG. 11 arranged over the phosphor carrier. Likewise, FIGS. 58 through 61 are also similar to those in FIGS. 46 through 49 and show the emission characteristics for another lamp according to the present invention also having a dome shaped three-dimensional phosphor carrier with the diffuser 160 as shown in FIG. 12 arranged over the phosphor carrier.

Figure 62:
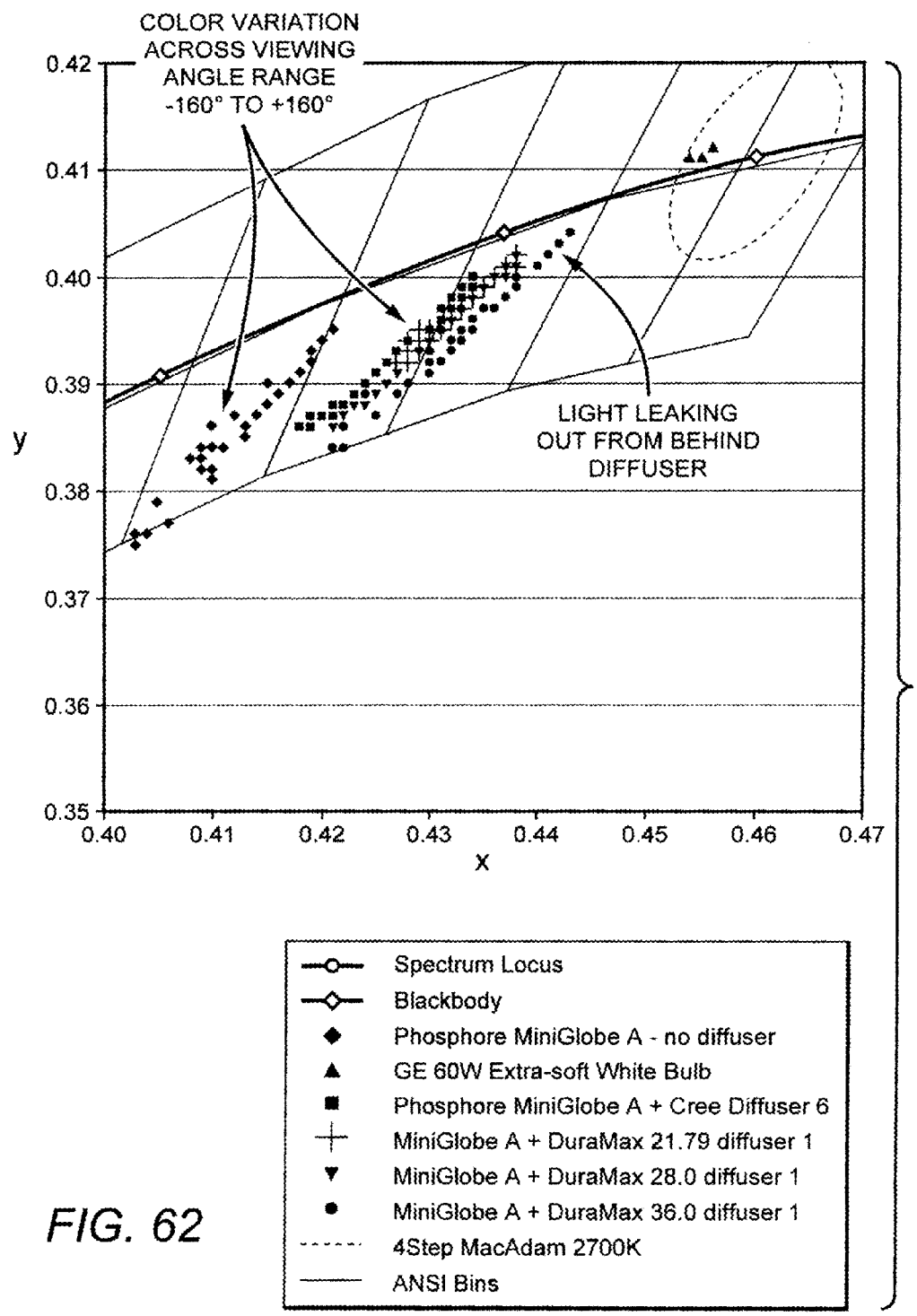
FIG. 62 is a CIE chromaticity diagram showing the color distribution over viewing angle characteristics for lamps according to the present invention.

FIG. 62 is comprises primarily a CIE diagram showing the color variation across viewing angles for the different lamp embodiments described above and shown in FIGS. 42 through 61. FIG. 63 shows another embodiment of a diffuser 400 that can be used in the embodiments experiencing leakage of phosphor carrier light, such as through the edges of the heat sink. The base 402 of the diffuser 400 can diffuse the light passing by these edges.

FIGS. 64 through 66 show still another embodiment of a lamp 410 according to the present invention. It comprises many of the same features as the lamp 370 shown in FIGS. 39 through 41 above. In this embodiment, however, the phosphor carrier 412 is bullet shaped and functions in much the same way as the other embodiments of phosphor carriers described above. It is understood that these are only a couple of the different shapes that the phosphor carrier can take in different embodiments of the invention.

Figure 67:
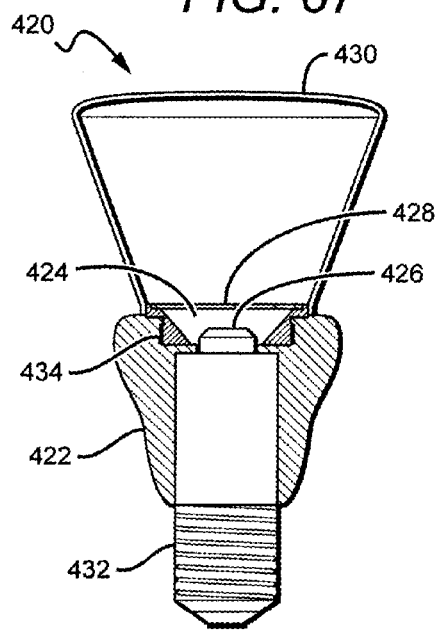
FIG. 67 is a sectional view of another embodiment of a lamp according to the present invention.
Figure 68:
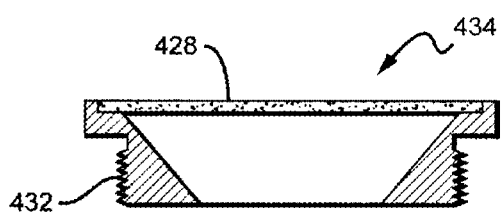
FIG. 68 is a sectional view of one embodiment of a collar cavity according to the present invention.

FIG. 67 shows another embodiment of a lamp 420 according to the present invention that also comprises a heat sink 422 with an optical cavity 424 having a lights source 426 and phosphor carrier 428. The lamp 420 also comprises a diffuser dome 430 and screw threaded portion 432. In this embodiment, however, the optical cavity 424 can comprise a separate collar structure 434, as shown in FIG. 68 that is removable from the heat sink 422. This provides a separate piece that can more easily be coated by a reflective material than the entire heat sink. The collar structure 434 can be threaded to mate with threads in the heat sink structure 422. The collar structure 434 can provide the added advantage of mechanically clamping down the PCB to the heat sink. In other embodiments the collar structure 434 can comprise a mechanical snap-on device instead of threads for easier manufacture.

Figure 69:
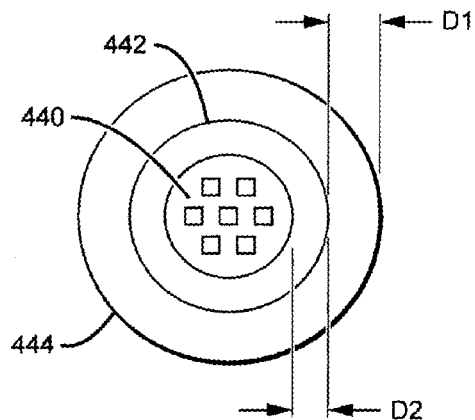
FIG. 69 is a schematic showing the footprint of different feature of one embodiment of a lamp according to the present invention.

As mentioned above, the shape and geometry of the three dimensional phosphor carriers can assist in transforming the emission pattern of the emitters to another more desirable emission pattern. In one embodiment, it can assist in changing a Lambertian emission pattern into a more uniform emission pattern at different angles. The disperser can then further transform the light from the phosphor carrier to the final desired emission pattern, while at the same time masking the yellow appearance of the phosphor when the light is off. Other factors can also contribute to the ability of the emitter, phosphor carrier and disperser combination to produce the desired emission pattern. FIG. 69 shows one embodiment of the emitter footprint 440, phosphor carrier footprint 442 and disperser footprint 444 for one lamp embodiment according to the present invention. The phosphor carrier footprint 442 and disperser footprint 444 show the lower edge of both these features around the emitter 440. Beyond the actual shape of these features, the distance D1 and D2 between the edges of these features can also impact the ability of the phosphor carrier and disperser to provide the desired emission pattern. The shape of these features along with the distances between the edges can be optimized based on the emission pattern of the emitters, to obtain the desired lamp emission pattern It is understood that in other embodiments different portions of the lamp can be removed such as the entire optical cavity. These features making the collar structure 414 removable could allow for easier coating optical cavity with a reflective layer and could also allow for removal and replacement of the optical cavity in case of failure.

The lamps according to the present invention can have a light source comprising many different numbers of LEDs with some embodiments having less than 30 and in other embodiments having less than 20. Still other embodiments can have less than 10 LEDs, with the cost and complexity of the lamp light source generally being lower with fewer LED chips. The area covered by the multiple chips light source in some embodiments can be less that 30 mm$^2$ and in other embodiments less than 20 mm$^2$. In still other embodiments it can be less that 10 mm$^2$. Some embodiments of lamps according to the present invention also provide a steady state lumen output of greater than 400 lumens and in other embodiments greater than 600 lumens. In still other embodiments the lamps can provide steady state lumen output of greater than 800 lumens. Some lamp embodiments can provide this lumen output with the lamp's heat management features allowing the lamp to remain relatively cool to the touch. In one embodiment that lamp remains less that 60° C. to the touch, and in other embodiments it remains less that 50° C. to the touch. In still other embodiments the lamp remains less than 40° C. to the touch.

Some embodiments of lamps according to the present invention can also operate at an efficiency of greater than lumens per watt, and in other embodiments at an efficiency of greater than 50 lumens per watt. In still other embodiments that lamps can operate at greater than 55 lumens per watt. Some embodiments of lamps according to the present invention can produce light with a color rendering index (CRI) greater than 70, and in other embodiments with a CRI greater than 80. In still other embodiments the lamps can operate at a CRI greater than 90. One embodiment of a lamp according to the present invention can have phosphors that provide lamp emission with a CRI greater than 80 and a lumen equivalent of radiation (LER) greater than 320 lumens/optical Watt @ 3000K correlated color temperature (CCT).

Lamps according to the present invention can also emit light in a distribution that is within 40% of a mean value in the 0 to 135° viewing angles, and in other embodiment the distribution can be within 30% of a mean value at the same viewing angles. Still other embodiments can have a distribution of 20% of a mean value at the same viewing angles in compliance with Energy Star specifications. The embodiments can also emit light that is greater than 5% of total flux in the 135 to 180° viewing angles.

Figure 70:
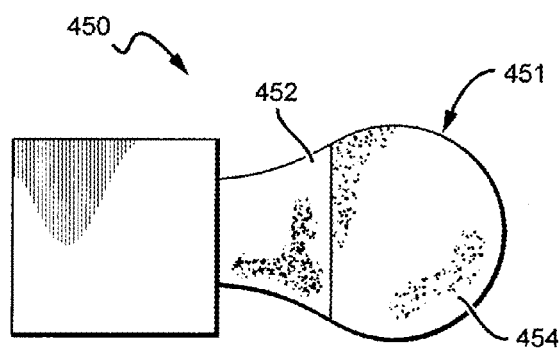
FIG. 70 is a side view of still another embodiment of a lamp according to the present invention.

As mentioned above, the diffusers according to the present invention can have different regions that scatter and transmit different amounts of light from the lamp light source to obtain the desired lamp emission pattern. Referring again to the diffuser shape shown in FIGS. 7 and 9, different regions of the diffuser can have regions with different scattering and transmission properties to obtain the an omnidirectional emission. FIG. 70 shows one embodiment of a lamp 450 according to the present invention comprising a diffuser 451 with a lower portion 452 at the base of the diffuser that can have scattering (reflecting) and transmission properties different from the upper portion 454. In this embodiment, the lower portion 452 scatters or reflects approximately 20% of the light passing through it and transmits approximately 80%. The upper portion 454 scatters or reflects 80% of the light passing through it and transmits approximately 20%. FIG. 71 is a graph 460 showing the improved lamp emission characteristics that can be realized by a lamp comprising the diffuser 451, with a co-planar light source and planar or two dimensional phosphor carrier. The transmission of the necked geometry can increase the amount of light directed sideways (~90°) relative to light emitted axially (~0°).

Figure 73:
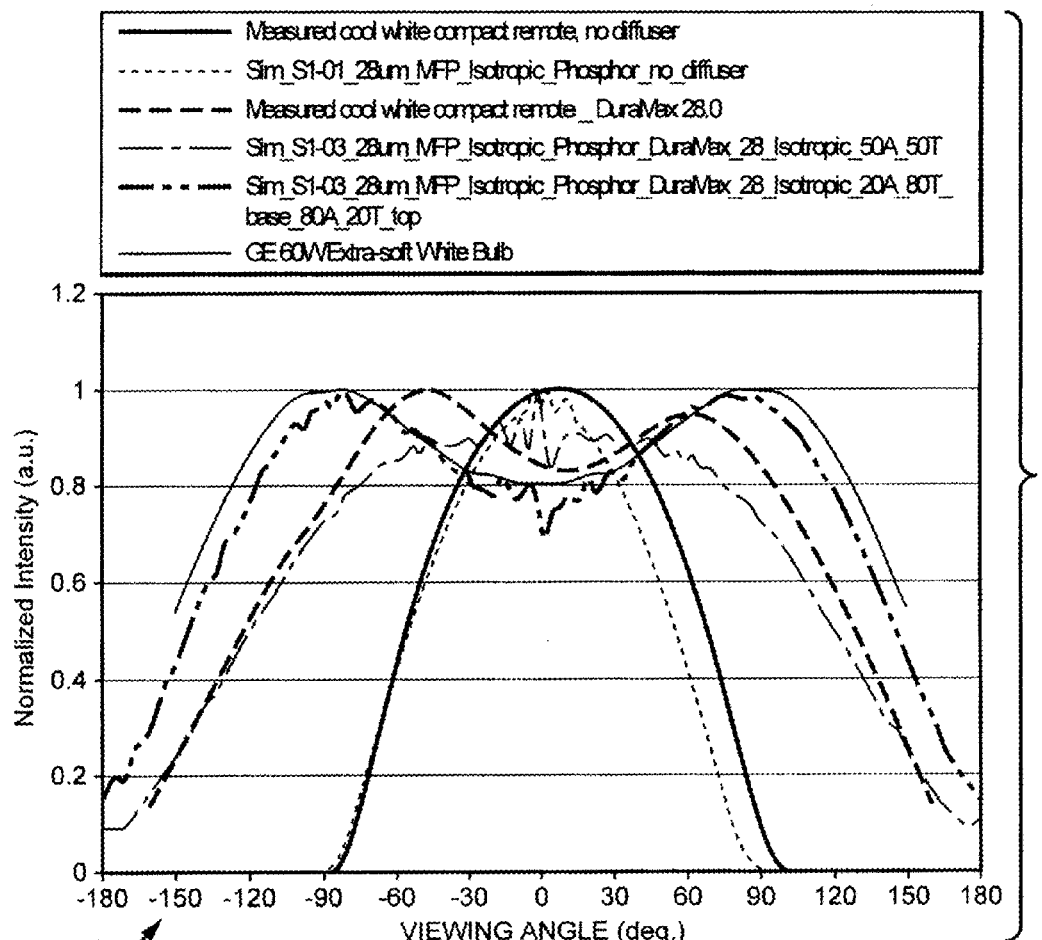
FIG. 73 is graph showing the emission characteristics of the lamp in FIG. 73.

FIG. 72 shows another embodiment of a lamp 470 according to the present invention having a diffuser 472 with a shape similar to diffuser 90 shown in FIG. 6. The lower portion 474 at the base of the diffuser can have scattering (reflecting) and transmission properties different from the upper portion 476. In this embodiment, the lower portion 474 scatters or reflects approximately 20% of the light passing through it and transmits approximately 80%. The upper portion 476 scatters or reflects 80% of the light passing through it and transmits approximately 20%. FIG. 73 is a graph 480 showing the improved emission characteristics that can be realized by a lamp comprising the diffuser 472, with a co-planar light source and planar or two dimensional phosphor carrier. By increasing the amount of light transmitted through the lower portion of the diffuser 472, nearly incandescent-like intensity distribution patterns can be achieved when combining a planar (Lambertian) light with a nearly spherical diffuser. This distribution may also be created by modifying the thickness, scattering particle density, particle size or nature, etc., such that, for example, the thickness of the scattering layer deposited on the lower portion 474 is less than that deposited on the upper portion 476.

Many different lamp embodiments have been described above with different elements arranged in different ways, but it is understood that lamps according to the present invention can be arranged in ways beyond those described above. FIGS. 74 through 77 show another embodiment of a lamp 500 according to the present invention that is similar to many of the lamps described above, including but not limited to lamp 320 shown in FIG. 31. It comprises a heat sink structure 502 having an optical cavity 504 with a light source 506 on the optical cavity platform 508. Like the embodiments above, it also comprises a phosphor carrier 510 that can be many different shapes, but in the embodiment shown is spherical. The lamp 500 further comprises a screw-threaded portion 512, that in the embodiment shown is compatible with and Edison type socket. It also has an internal lamp body 514 and comprises an interface layer (not shown) between the light source 506 and the heat sink structure 502. These elements can have many of the same features and characteristics of the similar features described above and can be manufactured using the same methods.

Figure 76:
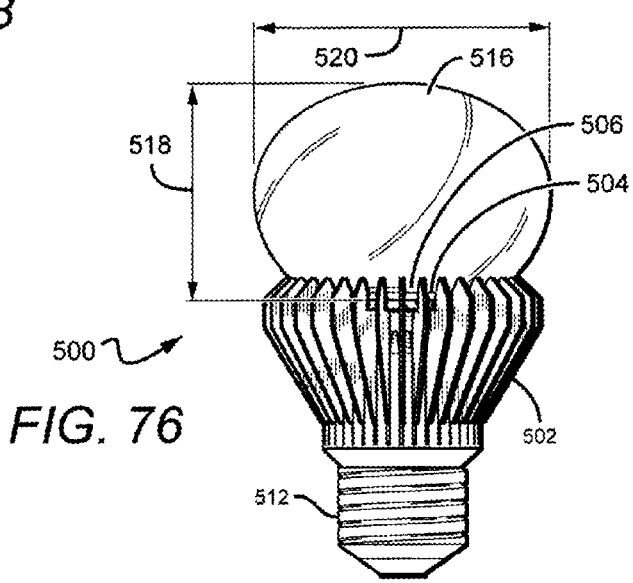
FIG. 76 is side view of the lamp shown in FIG. 74.
Figure 79:
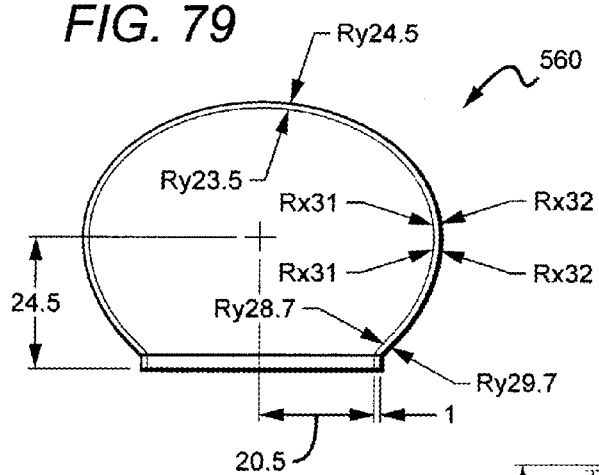
Figure 80:
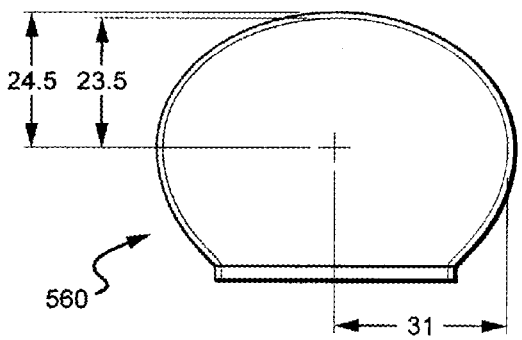
Figure 81:
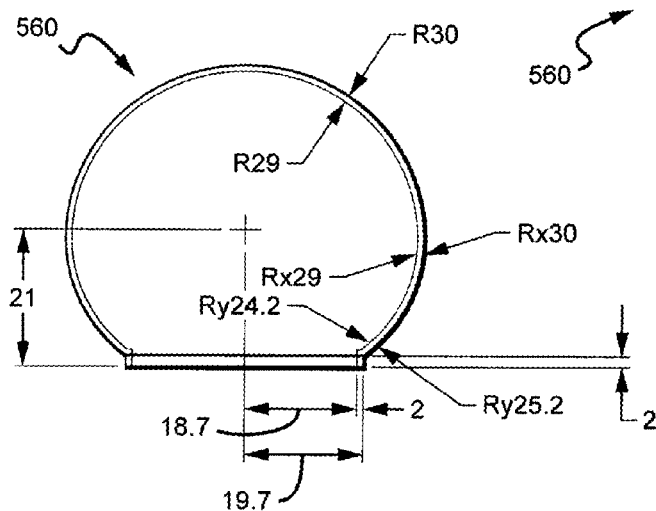
Figure 82:
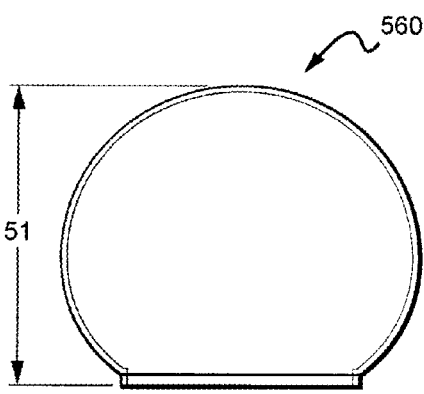

The lamp 500 further comprises a diffuser dome 516, but in this embodiment the dome is different from those described above, and has a generally asymmetric "squat" shape. The term "squat" generally refers to a dome having a height 518 that is less than the width 520 (as shown in FIG. 76). This dome shape results different distances between the phosphor carrier 510 and the diffuser dome 516 at different locations. For example, light emitting from the phosphor carrier at 0° viewing angle to the lamp (i.e. directly up) travels less distance to the diffuser dome compared to light emitting at 90° (i.e. laterally) from the phosphor carrier. This results in the distance from the phosphor on phosphor carrier to the diffuser dome being dynamic. That is, it varies depending on the emission angle.

This diffuser dome shape can result in certain advantages, including but not limited to one or both of the following. It can provide the mechanical advantage of lowering the height of the lamp 500 to allow it to more easily fit the size specifications for an A19 replacement bulb as shown above in FIG. 3. In addition it can provide the additional advantage of allowing the lamp 500 to meet the Department of Energy (DOE) Energy Star emission characteristics as described above. This dome shape provides for more diffuser area around the sides of the lamp 500 which can increase the intensity profile laterally from the lamp 500.

It is understood that the lamp features such as the diffuser, phosphor carrier, light source, etc., can have many different shapes and sizes. FIG. 78 shows another embodiment of a lamp 530 comprising a heat sink 532 with an optical cavity 534 holding a light source 536. It further comprises an Edison screw portion 538 and a squat shaped diffuser dome 540. In this embodiment, the phosphor carrier 542 is bullet shaped instead of spherical shaped. Like the embodiment above, this results in the distance from the phosphor on phosphor carrier to the diffuser dome being dynamic as described above.

It is understood that the diffuser dome can take many different shapes beyond that shown in FIGS. 74 through 78, to provide the dynamic relationship between the phosphor carrier and the diffuser dome. In some embodiments, the shape of the diffuser dome can be at least partially dependent on the shape of the phosphor carrier to achieve the desired lamp size and emission characteristics. FIGS. 79 through 82 show the dimensions for one embodiment of a squat diffuser dome 560 according to the present invention.

In some instance, uniform diffuser coatings whether internally or externally deposited on the diffuser dome may not effectively produce the desired broad emission intensity profiles suitable for Energy Star Compliance (maximum-to-average ratio <20% and minimum-to-average <20% across 0° to 135°) with high efficiency (>85%). This may even hold true for embodiments having diffusers shaped to provide the dynamic relationship between the phosphor carrier and diffuser dome.

As discussed above (such as in reference to FIGS. 70 through 73), diffuser domes according to the present invention can have different regions that scatter and transmit different amounts of light from the lamp light source to help produce the desired lamp emission pattern. This approach can also be applicable to the different embodiments shown in FIG. 74 through 82. In some embodiments, the different regions that scatter and transmit different amounts of light can be achieved by coating the diffuser dome with different amounts of diffusing materials at different regions. This can in turn modify the output beam intensity profile of a light source to provide improved emission characteristics as described above.

In some embodiments, the invention can rely on the combination of the diffuser element (i.e. diffuser dome) and diffuser coating scattering properties to produce the desired far-field intensity profile of the lamp. In different embodiments, the diffuser thickness and location may be dependent upon different factors such as the diffuser dome geometry, the light source arrangement, and the pattern of light emitting from the phosphor carrier.

In one embodiment, the diffuser dome can be arranged to convert the emission intensity profile of a two-dimensional LED, LED array, a flat phosphor conversion layer, or a three dimensional phosphor carrier, into a broader beam profile such as that associated with incandescent A19 lamp sizes and Department of Energy (DOE) Energy Star emission characteristics. This can enable the fabrication of LED-based replacements for conventional incandescent light bulbs.

Partial and/or non-uniform coatings have been found to produce broad beam intensity profiles which are desirable for incandescent replacement and satisfy Energy Star Compliance for a uniform luminous intensity distribution. The non-uniform coatings can also offer the capability to achieve Energy Star Compliance regardless of the heat sink and diffuser globe geometry. In general sense, the proper placement of a sufficient, partial coating on either a clear or uniformly-coated diffuser dome can manipulate the scattering and intensity profile of light photons passing through the diffuser dome to preferred angles. In the case of Energy Star Compliance, the preferred arrangement would be to redirect light photons such that the emission intensity at high angles is greater than 120°. These arrangements can provide for lamps using inexpensive two-dimensional light sources, while at the same time meeting the A19 size and Energy Star emission standards. The partial coatings of the embodiments can exist as coatings that cover a percentage of the diffuser and have only a singular lighter region, or the coatings can lie as a ring or band along a specific region of the diffuser.

Figure 83:
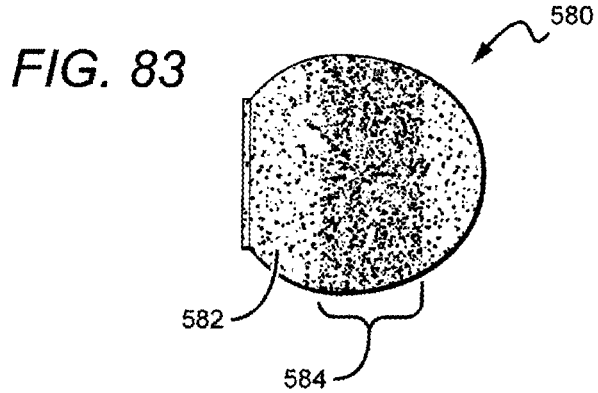
FIG. 83 is a side view of another embodiment of a diffuser dome according to the present invention.

FIG. 83 shows one embodiment of a diffuser dome 580 having a uniform coating 582 covering the majority of its surface and a thicker band coating 584 having more diffusing material. In the embodiment shown, the thicker band coating 584 spans around the diffuser dome 580 at a particular range of viewing angles, with the band coating 584 preventing more light from escaping in that specific region, causing it to depart at either higher or lower angles.

Figure 84:
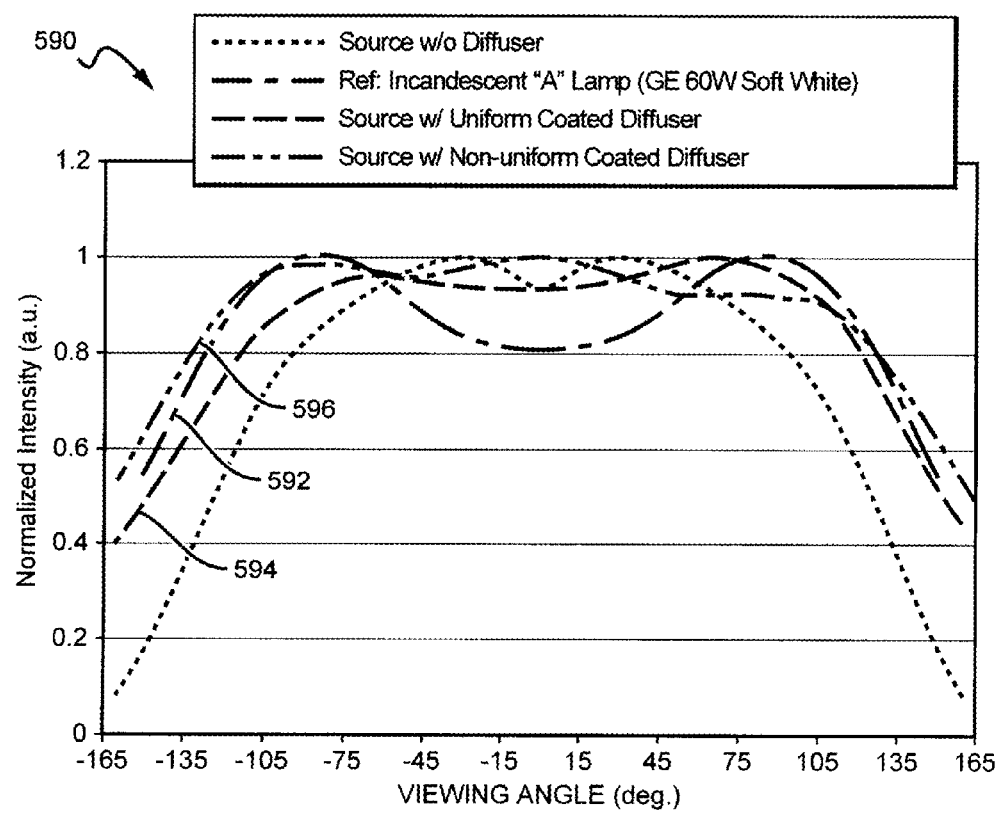
FIG. 84 is a graph showing comparison emission profiles for a lamp according to the present invention.

FIG. 84 is a graph 590 showing emission intensity profiles for a typical incandescent lamp 592, LED lamps with diffuser domes having uniform diffusion properties 594, and LED lamps with diffuser domes having bands (or areas) with more diffusing material 596. Profile 594 shows that the low viewing angle or axial light intensity of the uniform coating is lower than the intensities at angles between 45 to 105°. Referring now to profile 596, the intensities between 45 and 105° are less than that of the axial light. As a result of this intensity shift, the light is more intense at angles greater than 105°. The profile 596 shows that the lamps with non-uniform coatings can provide a luminous distribution that is equivalent to, and in some cases better than, an incandescent lamp.

Figures 85, 86, 88:
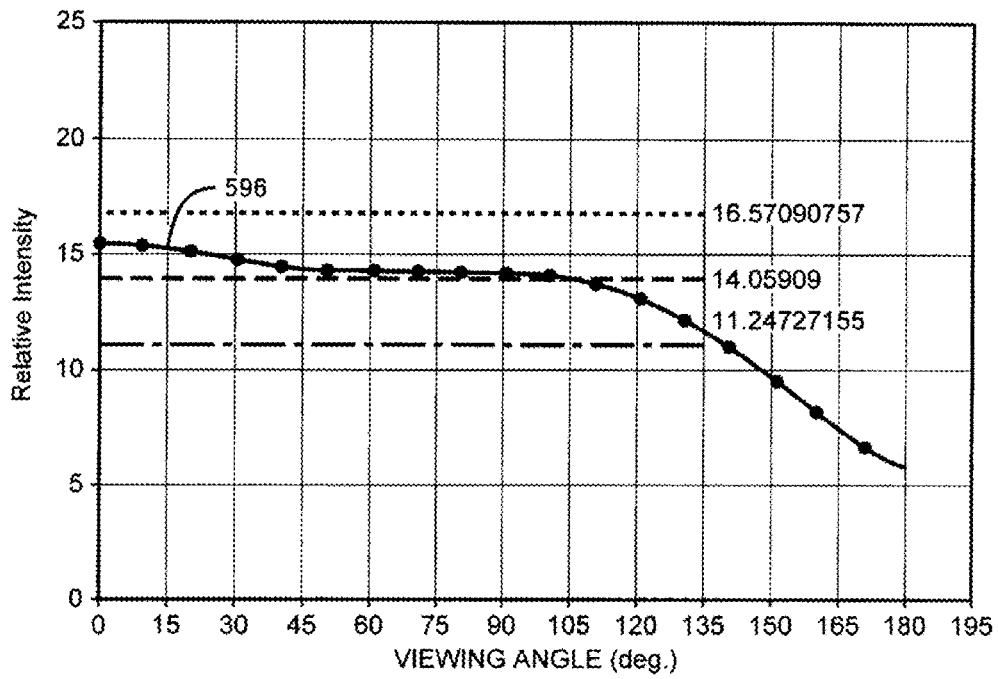
FIG. 85 is a graph showing an emission profile for a lamp according to the present invention.
FIG. 86 is a table showing the emission characteristics for one embodiment of a lamp according to the present invention.
FIG. 88 is a table showing the emission characteristics for one embodiment of a lamp according to the present invention.

FIG. 85 shows a closer view emission profile 596 shown in FIG. 84, showing the emission intensity versus viewing angle curves for LED lamp having a diffuser with a non-uniform coating (i.e. bands or areas of greater light scattering or diffusion). FIG. 86 is a table listing the Energy Star Compliance data in comparison to the performance of the lamp emitting the profile shown in FIG. 85. One of the factors relevant to Energy Star Compliance is the minimum-to-average ratio. Some lamps with uniform coating can reach values near up to 26%. By comparison emission profile shown in FIG. 86 is able to achieve a value around 17% and complies with the "less than 20%" requirement. Placement of the band coating with additional diffusing material in the correct position on or within the diffuser dome, which is between 45 and 105°, in this case, provides the desired broadened emission profile.

As mentioned above, the additional diffusers can be provided in many different bands or areas on the diffuser dome. Another embodiment of the invention comprises a non-uniform coating that can include multiple partial coats. The partial coats can be applied using any methods described in the present application, with one method being spray-coating onto a diffuser dome. One coat of an additional diffuser can be deposited near the middle of the diffuser globe, such as in a viewing angle range of approximately 45 to 105°. A second coat of an additional diffuser can then be deposited at the top of the diffuser dome to cover viewing angles of 0 to approximately 45°. These combined coatings block a significant portion of the light photons between 0 and 105°, allowing more light to pass through the diffuser dome at higher angles.

Figure 87:
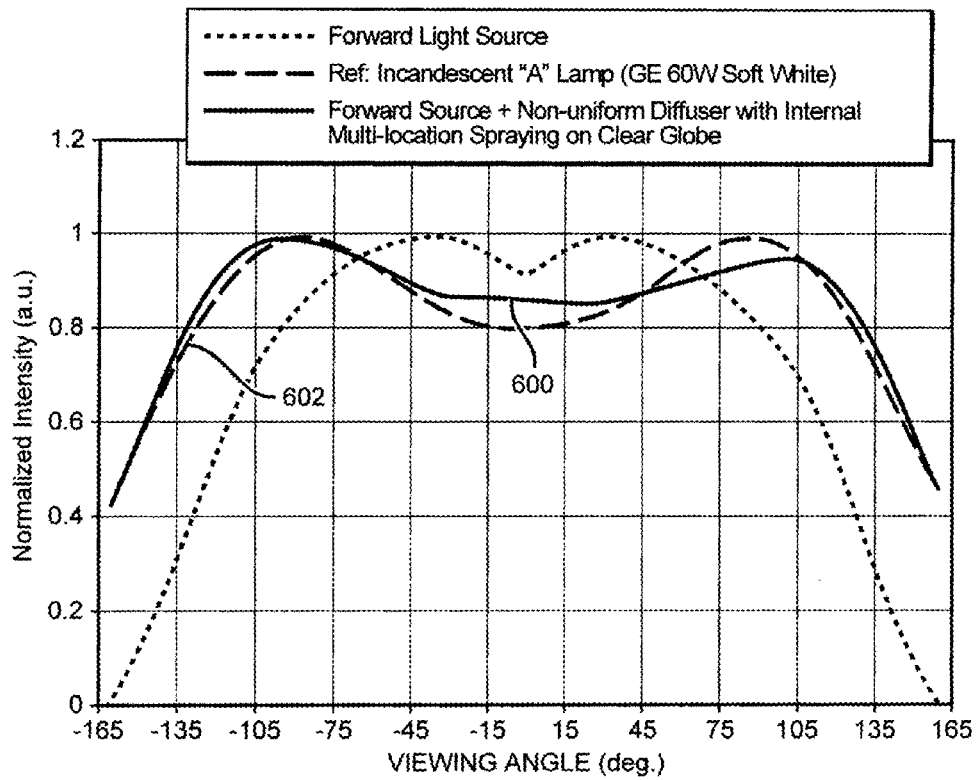
FIG. 87 is a graph showing emission profiles for certain lamp embodiments according to the present invention.

Referring now to FIG. 87, the emission intensity profile 600 of a lamp having a diffuser dome with this two part coating compared to that of a profile 602 from a typical incandescent lamp. The profiles are very similar and as shown in the table 610 in FIG. 88 this two part non-uniform configuration achieves Energy Star Compliance.

It is noted that experiments of some embodiments have shown that application of a thin first band offered some decrease in the minimum-to-average ratio (for example, 30% to 27%). By thickening the first band further the ratio was lowered more from 27% to 24%. It was also determined through experimentation that once the additional diffuser was applied at the top of the diffuser dome (in the range of approximately 0 to 45°), minimum-to-average ratios of 13 to 19% were achieved. This is only one of a number of different diffuser band arrangements that can be utilized according to the present invention to produce the desired lamp emission characteristics.

Different embodiments of diffusers according to the present invention can comprise varying scattering properties along any direction of the interior and exterior surfaces. In some embodiments the diffuser can comprise a transparent material (substrate) comprising a scattering film on its inside surface having varying scattering properties. Others can comprise a transparent globe having a scattering film on its interior and/or exterior surface. The scattering films can have many different thicknesses depending at least partially on the film/binder material used, type of scattering material, and the density of scattering material in the film. In some embodiments, the transparent globe can have a scattering film thickness ranging from 0.1 to 1000 microns, with the film being on the interior and/or exterior of the globe. In embodiments using a cellulose-based binder, the film thicknesses can range from 0.1 to 100 microns, with the film being on the interior and/or exterior of the globe. In some embodiments using cellulose based binders, alumina based scattering particles can be used with some particles having a diameter of 0.1 to 4.0 microns.

In still other embodiments, the diffuser can comprise a transparent globe and the scattering films can comprise a methyl silicone based binder, with the films being on the interior and/or the exterior of the globe. The films in these embodiments can range in thickness from 0.1 to 700 microns, and can comprise scattering particles made of different materials. Some embodiments can comprise alumina scattering particles, with these embodiments having average particle sizes in the range of 0.1 to 4.0 microns.

The thicknesses of the films can be greater than those described above and can utilize different binder and particle materials. As discussed, the diffuser dome and diffusers can comprise any materials described above and can be applied using any of the methods described above. In some embodiments the binder material for the diffuser can be an organic polymer, such as ethyl cellulose, nitrocellulose or poly(ethylene oxide) or an inorganic polymeric system, such as, silicone or ethyl polysilicate. In still other embodiments the binder can comprise an enamel. In some embodiments the diffuser can comprise scattering particles of alumina, silica and titania within some embodiments having particle sizes ranging from 0.1 to 1.0 microns. In some embodiments the diffuser globe material may be a borosilicate glass, a soda lime glass or polycarbonate thermoplastic. One embodiment can comprise alumina particles approximately 0.5 to 0.8 microns in diameter dispersed in an ethyl cellulose binder. The solvents for a solution containing the alumina particles and ethyl cellulose can be ethyl acetate, ethyl alcohol, isopropyl alcohol, ethylene glycol monoethyl ether acetate and dibutyl phthalate. The ranges described above can be applicable to lamps with the desired emission efficiency, such as greater than 85%. Having thicker layers may result in lower lamp emission efficiency.

Figure 89:
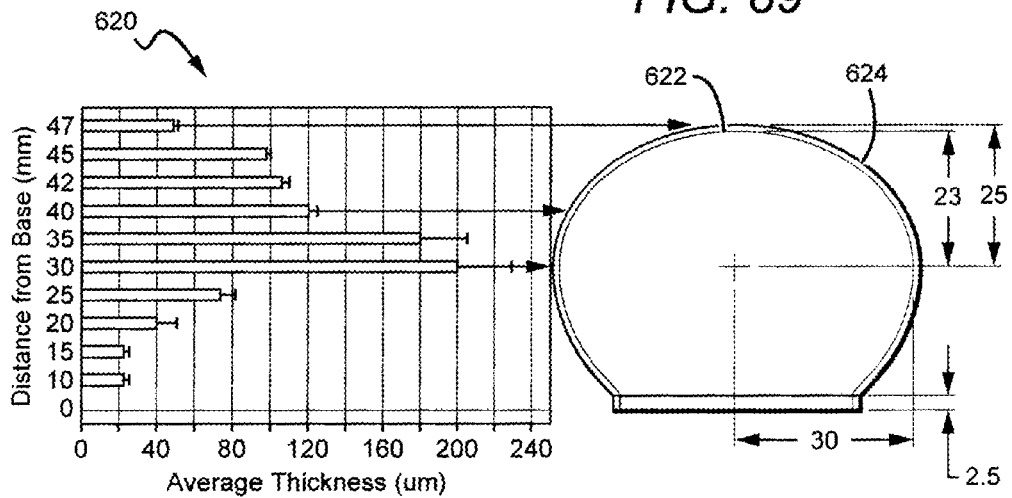
FIG. 89 is a graph showing one embodiment of diffuser layer thicknesses in a diffuser according to the present invention.

FIG. 89 is a graph 620 showing the thickness variations for one embodiment of a non-uniform scattering film 622 according to the present invention, that is formed on the inside surface of a squat diffuser 624 as described above. The thicknesses of the film 622 are measured at different heights and range from approximately 21 microns and a height of 10 mm, to a thickness of approximately 200 microns and a height of 30 mm. The thickness of the film is approximately 44 microns at the top of the diffuser. It is understood that these thicknesses can vary depending on many factors as discussed above, such as diffuser shape, binder material, type of scattering particle, etc. It is also understood that the film can be formed on the diffuser using many different methods described herein such as spraying or dipping. In other embodiments this profile can be achieved by providing a relatively thick diffuser with scattering particles included integral thereto. Portions of the dome can then be removed to leave areas or bands of greater thickness and increased scattering properties. This diffuser material can be removed using many different methods such as grinding or etching.

The graph 620 shows a band of thicker diffuser film from a height of approximately 30 mm to 40 mm, with the band having increased scattering properties to light passing through this portion or band of the diffuser. The graph also shows a film thickness of approximately 20 microns at the bottom height of 10 mm, and approximately 50 microns at the top height of approximately 47 mm. This profile results in certain ranges of thickness for different areas of the diffuser. For the bottom height to the top height, the ratio of thicknesses can fall in the range of 2-5. In other embodiments the ratio of thicknesses can fall in the range of 1.5 to 10, although in other embodiments the ratios can fall out of this range. In the embodiment shown, the bottom height to top height thickness ration is approximate 2.5. The ratio of thicknesses between the bottom height and the band can range from 2-30, or any smaller ranges within this range. This ratio in the embodiment shown being approximately 20. The film 622 uses silicone, as its binder and it is understood that using other binders, such as cellulose based binders, can result in generally thinner or thicker films that can still fall within these ratio ranges.

FIGS. 90 through 95 show different embodiments of diffuser domes having different diffuser layers arranged in different ways according to the present invention. These are only provided as examples and it is understood that many different arrangements can be provided pursuant to the present invention.

FIG. 90 shows a diffuser dome 630 having a uniform external diffuser coating 632, and an external partial coating 634 on the uniform coating 632. The partial coating 634 can be applied using many different methods such as by spraying or dip-coating. FIG. 91 shows a diffuser dome 640 with a uniform internal diffusing coating 642 and a partial external coating 644 that can be applied using different methods such as spraying or dip-coating. FIG. 92 shows a diffuser dome 650 having a uniform external coating 652, and a partial internal coating 654. FIG. 93 shows a diffuser dome 660 with a uniform external coating 662 and a partial internal coating 664 with varying thicknesses. FIG. 94 shows a clear or transparent diffuser dome 670 having a partial internal coating 672 having varying thicknesses. FIG. 95 also shows a clear or transparent diffuser dome 680 having multiple internal coatings 682, 684 all or some of which can have varying thicknesses.

Although much of the discussion above is directed to varying the diffusing characteristics in areas of the diffuser dome, it is understood that the remote phosphor can have areas of differing concentrations of conversion material. This can also assist in producing the desired emission profile as well as the desired light characteristics. In some embodiments, the remote phosphor can have increased conversion material at or around the top, although the increase can be in other areas.

It is understood that the arrangements described above are equally applicable to lighting applications beyond the bulb-type described above. All or some of the features above are also applicable to area and tube-type lighting. That is, these different types of light can utilize remote conversion materials of different shape and remote diffusers of different shapes. As with the embodiments above, the remote diffusers can have areas with increased diffusing characteristics, or can have shapes that help produce the desire emission profile.

It is understood that lamps or bulbs according to the present invention can be arranged in many different ways beyond the embodiments described above. The embodiments above are discussed with reference to a remote phosphor but it is understood that alternative embodiments can comprise at least some LEDs with a conformal phosphor layer. This can be particularly applicable to lamps having light sources emitting different colors of light from different types of emitters. These embodiments can otherwise have some or all of the features described above.

Figure 96:
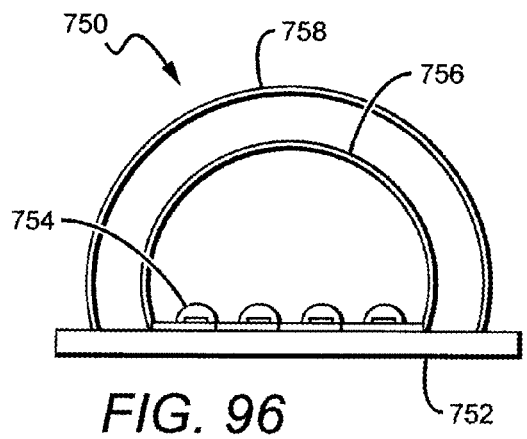
FIG. 96 is a sectional view of another embodiment of a lamp according to the present invention.

FIGS. 96 through 111 show additional lamp or bulb embodiments arranged according to the present invention. FIG. 96 shows one embodiment of a lamp 750 comprising a planar submount or heat sink 752 having an array of co-planar LEDs 754 on the top surface of the heat sink 752. A three-dimensional or non-planar phosphor carrier 756 is mounted to the heat sink 752 over the LEDs 754 with a space between the LEDs 754 and the phosphor carrier 756. A diffuser 758 is included over the phosphor carrier 756 with a space between the two. The elements of the lamp 750 and the embodiments described below in FIGS. 97 to 111 can have the same properties and can be fabricated in the same way as corresponding elements in the lamps described in the embodiments above. In this embodiment, the phosphor carrier 756 and diffuser 758 are essentially spherical with the diffuser 758 masking the phosphor carrier 756.

Figure 97:
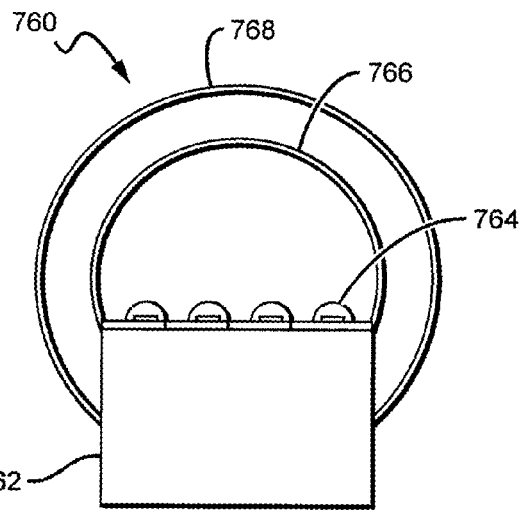
FIG. 97 is a sectional view of another embodiment of a lamp according to the present invention.
Figure 98:
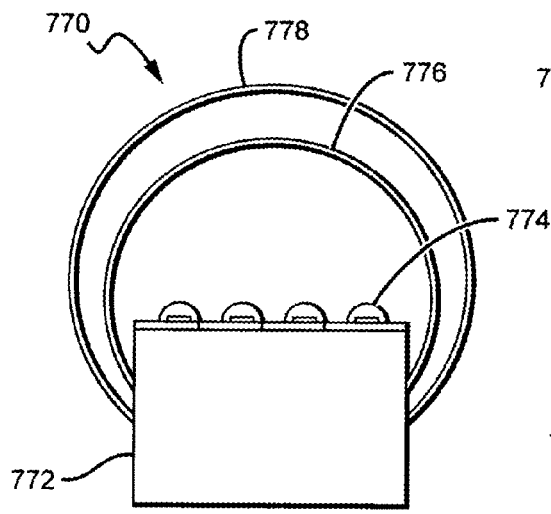
FIG. 98 is a sectional view of another embodiment of a lamp according to the present invention.

FIG. 97 shows another embodiment of a lamp 760 according to the present invention having submount or heat sink 762 with co-planar LEDs 764 mounted to the heat sink 762 and a phosphor carrier 766 mounted over and spaced apart from the LEDs 764. A diffuser 768 is mounted over and spaced apart from the phosphor carrier 766, with both again being essentially spherical. In this embodiment the heat sink 762 has greater depth and in one embodiment can have a cube shape. The diffuser 768 is mounted to a side surface of the heat sink 762 and the phosphor carrier 766 is mounted to the top surface of the heat sink 762. FIG. 98 shows another embodiment of a lamp 770 according to the present invention having a similar heat sink 772, co-planar LEDs 774 and diffuser 778 as those shown in the lamp 760 of FIG. 97. A phosphor carrier 776 is also included that is mounted to the side surface of the heat sink 772.

Figure 99:
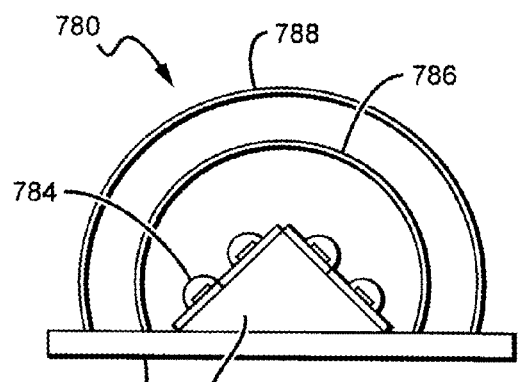
FIG. 99 is a sectional view of still another embodiment of a lamp according to the present invention.
Figure 100:
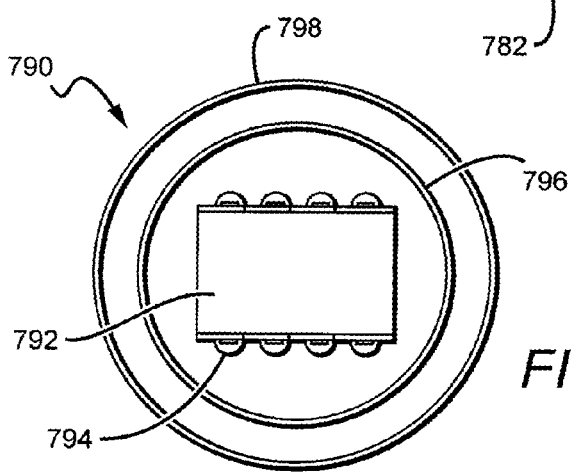
FIG. 100 is a top view of another embodiment of a lamp according to the present invention.

FIG. 99 shows another embodiment of lamp 780 according to the present invention that is similar to the lamp 750 in FIG. 96, and comprises a submount or heat sink 782, with a phosphor carrier 786 and diffuser 788. It also comprises LEDs 784 that in this embodiment are mounted on a pedestal 789 having angled surfaces so that the LEDs 784 are not co-planar and can emit light in different directions. FIG. 100 shows another embodiment of a lamp 790 according to the present invention having a cube shaped submount or heat sink 792, a phosphor carrier 796 and a diffuser 798. LEDs 794 are also included, but in this embodiment they are on side surfaces of the heat sink 792 such that the LEDs 794 are emitting in different directions. It is understood that the LEDs 794 can also be on other surfaces of the heat sink 792, and that the phosphor 796 and diffuser 798 can be spherical shaped or many other shapes such as tube shaped.

Figure 101:
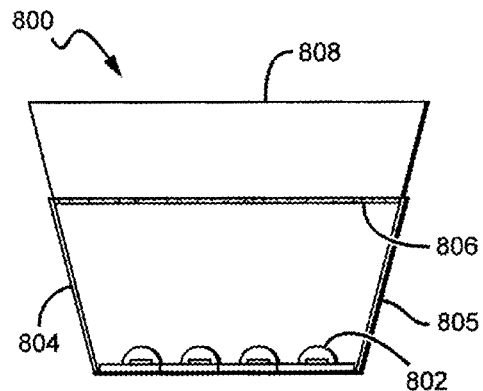
FIG. 101 is a sectional view of flood light type embodiment of a lamp according to the present invention.
Figure 102:
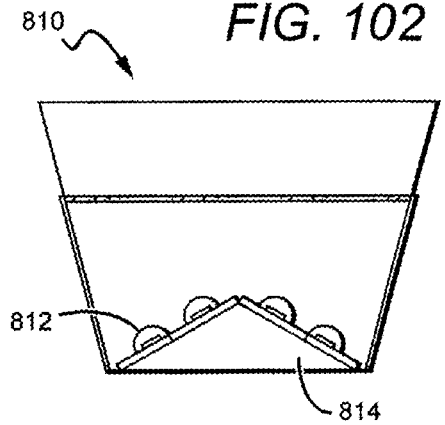
FIG. 102 is a sectional view of another embodiment of a flood light type lamp according to the present invention.
Figure 103:
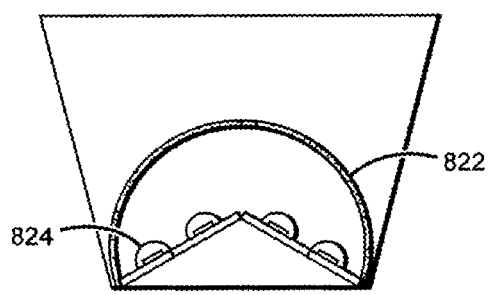
FIG. 103 is a sectional view of another embodiment of a flood light type lamp according to the present invention.

FIGS. 101 through 103 show different embodiments of lamps that can be arranged for different applications, with the embodiments shown being arranged as flood lights. FIG. 101 shows one embodiment of a lamp 800 having co-planar LEDs 802 mounted at a base of a housing 804 having side surfaces 805 that can be opaque to the lamp light and can be reflective. A phosphor carrier 806 is mounted within the housing 804 over and spaced apart from the LEDs 802. A diffuser 808 is mounted to the housing over and spaced apart from the phosphor carrier 806. FIG. 102 shows another embodiment of a lamp 810 according to the present invention that is similar to lamp 800, but in this embodiment the LEDs 812 are mounted on a pedestal 814 so that they are not co-planar. FIG. 103 shows another embodiment of a lamp 820 according to the present invention that is similar to lamp 810, but has a spherical shaped phosphor carrier 822 mounted over the LEDs 824.

Figure 104:
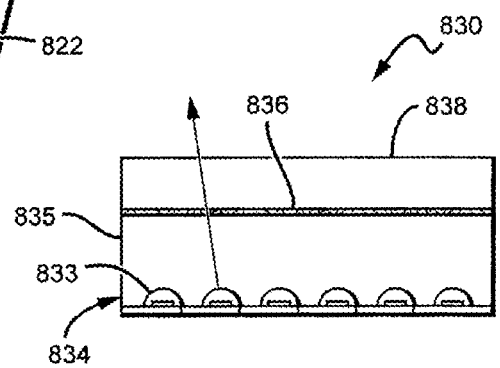
FIG. 104 is a sectional view of a two-dimensional panel embodiment of a lamp according to the present invention.
Figure 105:
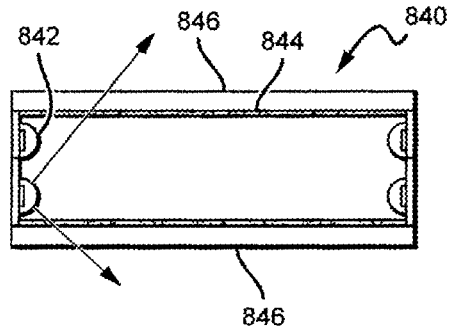
FIG. 105 is a sectional view of another two-dimensional panel embodiment of a lamp according to the present invention.
Figure 106:
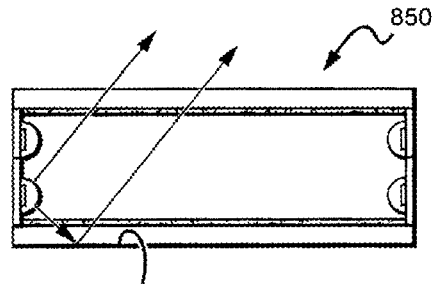
FIG. 106 is a sectional view of another two-dimensional panel embodiment of a lamp according to the present invention.

Different embodiments can have many different arrangements and shapes, and FIG. 104 shows another embodiment of a lamp 830 comprising a two-dimensional lamp panel. LEDs 833 are mounted within a housing 834 having opaque/reflective side surfaces 835. A phosphor converter 836 and a diffuser 838 are mounted to the housing 834 over and spaced apart from the LEDs 833. FIG. 105 shows another embodiment of lamp 840 comprising a two-dimensional two side emitting panel/box. In this embodiment LEDs 842 can be mounted on opposite sides of the box emitting towards each other. A phosphor carrier 844 can run the length of the box on the edge of the LEDs 842 and diffuser 846 runs the length of the box outside of a spaced apart from the phosphor carrier 844. FIG. 106 shows still another embodiment of a lamp 850 according to the present invention that is similar to lamp 840 but in this embodiment is a two-dimensional one side emitting panel/box having a backside reflector 852.

Figure 107:
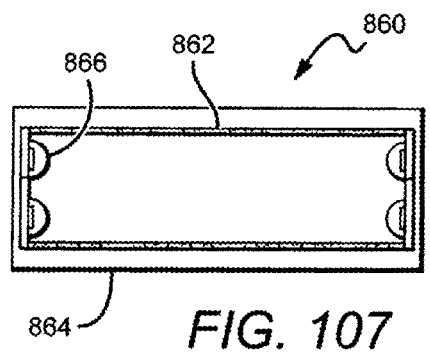
FIG. 107 is a sectional view of tube shaped embodiment of a lamp according to the present invention.
Figure 108:
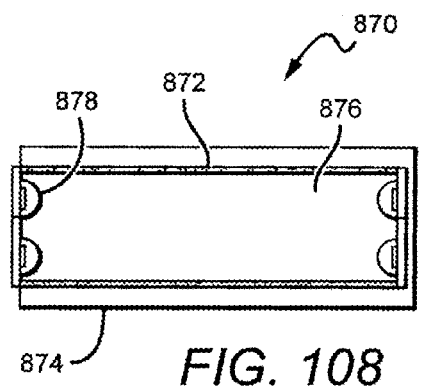
FIG. 108 is a sectional view of another tube shaped embodiment of a lamp according to the present invention.
Figure 109:
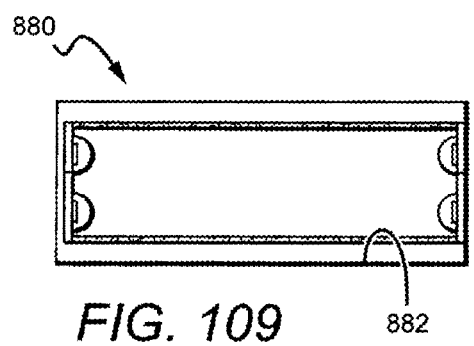
FIG. 109 is a sectional view of another tube shaped embodiment of a lamp according to the present invention.

FIG. 107 shows another embodiment of a lamp 860 according to the present invention similar to the lamp 840 shown in FIG. 105. In this embodiment however, the phosphor carrier 862 and diffuser 864 are tube shaped and can comprise a waveguide or air at least partially along the length of the phosphor carrier between the LEDs 866. FIG. 108 shows another embodiment of a lamp 870 according to the present invention that is similar to the lamp 860, and has tube shaped phosphor carrier 872 and diffuser 874. In this embodiment lamp 870 further comprises a graded extraction element waveguide 876 running at least partially along the length of the phosphor carrier 872 between the LEDs 878. FIG. 109 shows another embodiment of lamp 880 according to the present invention that is also similar to the lamp 860 but in this embodiment a portion of the tubular shaped diffuser can comprise a reflector 882.

Figure 110:
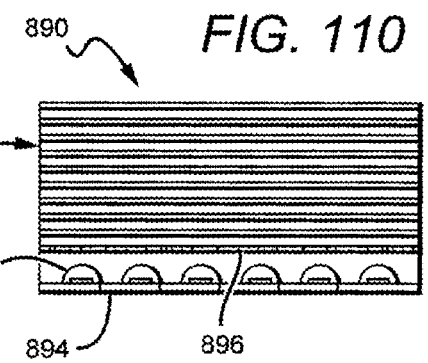
FIG. 110 is a sectional view of light emission panel embodiment of a lamp according to the present invention.

FIG. 110 shows still another embodiment of lamp 890 according to the present invention comprising a two-dimensional uniform light emission panel. An array of co-planar LEDs 892 is mounted on the edge of a cavity or substrate 894. A phosphor carrier 896 is mounted over and spaced apart from the LEDs 892 and a multiple diffuser layers 898 are mounted over and spaced apart from the phosphor carrier. The bottom surface of the substrate 894 can comprise a reflective surface, with this arrangement a panel light source emitting at least some in a direction perpendicular to the substrate 894.

Figure 111:
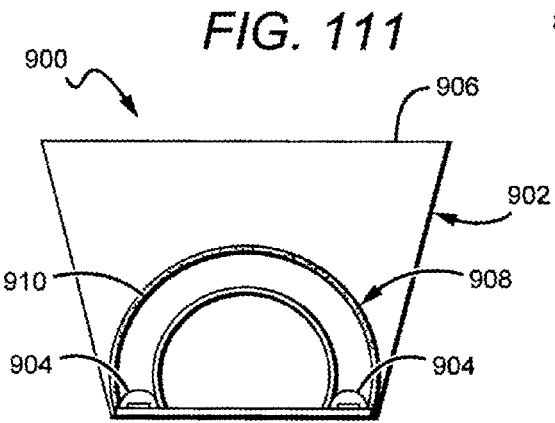
FIG. 111 is a sectional view of another flood light embodiment of a lamp according to the present invention.

FIG. 111 shows still another embodiment of a lamp 900 that can be arranged as a flood light similar to the embodiments described above. The lamp 900 comprises a housing 902 with opaque or reflective side surfaces, with LEDs 904 mounted at the base of the housing 902. A diffuser 906 is also mounted to the housing 902 and is spaced apart from the LEDs 904. A three-dimensional waveguide 908 is included in the housing 902 between the LEDs 904 and the diffuser with the LEDs 904 emitting light into the waveguide 908. At least some of the surfaces of the waveguide 908 are covered by a phosphor or phosphor carrier 910, with LED light passing through the waveguide interacting with the phosphor 908 and being converted.

Although the present invention has been described in detail with reference to certain preferred configurations thereof, other versions are possible. Therefore, the spirit and scope of the invention should not be limited to the versions described above.

We claim:

1. A lamp, comprising:
a solid state light source emitting a substantially forward emission pattern;
a diffuser to alter said forward emission pattern so that said lamp emits an emission pattern comprising greater uniformity than said forward emission pattern;
wherein the diffuser comprises a plurality of diffuser attributes that are used to control a desired emission profile for the lamp; and
wherein said diffuser comprises varying scattering properties over its surface based on the desired emission profile for the lamp.

2. The lamp of claim 1, wherein said substantially forward emission pattern comprises a substantially Lambertian emission pattern.

3. The lamp of claim 1, wherein said light source is substantially planar.

4. The lamp of claim 1, wherein said substantially uniform emission pattern is substantially omnidirectional.

5. The lamp of claim 1, wherein said diffuser comprises varying scattering properties along at least one dimension of the diffuser.

6. The lamp of claim 5, wherein said varying scattering properties comprises varying scattering surface properties, or varying volume of scattering materials.

7. The lamp of claim 5, wherein said varying scattering properties comprise higher diffuser scattering power in the axis of said light source emission comprising a higher light intensity, and lower diffuser scattering power in the axis of said light source emission comprising a lower light intensity.

8. The lamp of claim 1, wherein said light source is a solid state light source.

9. The lamp of claim 1, further comprising a wavelength conversion element in the light path between said light source and diffuser.

10. The lamp of claim 9, wherein said conversion element comprises a transparent phosphor carrier.

11. The lamp of claim 9, wherein said wavelength conversion element comprises a phosphor carrier comprising a transparent, thermally conductive material.

12. The lamp of claim 9, wherein said conversion element is three-dimensional.

13. The lamp of claim 12, wherein said conversion element is substantially rotationally symmetric.

14. The lamp of claim 12, wherein said conversion element is a substantially linear diffuser dome.

15. The lamp claim 9, wherein said conversion element is planar.

16. The lamp of claim 1, wherein said diffuser comprises a diffuser dome.

17. The lamp of claim 1, wherein said diffuser comprises a rotationally symmetric diffuser dome.

18. The lamp of claim 1, wherein said diffuser comprises a substantially linear diffuser dome.

19. The lamp of claim 1, wherein said diffuser comprises a diffusing material, wherein said diffuser comprises one or more areas covered by a greater amount of diffusing material.

20. The lamp of claim 1, further comprising heat dissipation elements to conduct conversion heat away from said wavelength conversion material.

21. The lamp of claim 1, wherein said light source comprises a plurality of co-planar light emitting diodes (LEDs).

22. The lamp of claim 1, wherein the light emitted from the diffuser comprises a spatial uniformity that is within 40% of a mean value within a range of viewing angles.

23. The lamp of claim 1, wherein the light emitted from the diffuser comprises a spatial uniformity that is within 20% of a mean value within a range of viewing angles.

24. A lamp, comprising:
a light source; and
an optical element at least partially covering said light source so that at least some light from said light source passes through said optical element, said optical element comprising scattering properties that vary along at least one dimension of the element to modify the emission distribution of the light emitted by said light source, said optical element comprising a plurality of diffuser attributes including said scattering properties, wherein said diffuser attributes are used to control a desired emission profile for the lamp.

25. The lamp of claim 24, wherein said optical element modifies angular distribution of light emitted by said light source.

26. The lamp of claim 24, wherein said light source emits light with a substantially non-uniform emission distribution, said optical element modifying said substantially non-uniform distribution to a substantially uniform distribution.

27. The lamp of claim 24, wherein said light source emits a substantially Lambertian emission pattern, said optical element modifying said substantially Lambertian emission pattern to a substantially uniform emission pattern.

28. The lamp of claim 24 wherein said optical element comprises a diffuser comprising varying scattering properties.

29. The lamp of claim 28, wherein said diffuser comprises varying scattering properties along one dimension of the diffuser.

30. The lamp of claim 24, wherein said light source is a solid state light source.

31. The lamp of claim 24, further comprising a wavelength conversion element in the light path between said light source and diffuser.

32. The lamp of claim 31, wherein said conversion element comprises a phosphor carrier.

33. The lamp of claim 31, wherein said conversion element is three-dimensional.

34. The lamp claim 31, wherein said conversion element is planar.

35. The lamp of claim 31, wherein said conversion element is substantially rotationally symmetric.

36. The lamp of claim 24, wherein said optical element comprises a diffuser.

37. The lamp of claim 36, wherein said diffuser is substantially rotationally symmetric.

38. The lamp of claim 24, wherein the light emitted from the optical element comprises a spatial uniformity that is within 40% of a mean value within a range of viewing angles.

39. The lamp of claim 24, wherein the light emitted from the optical element comprises a spatial uniformity that is within 20% of a mean value within a range of viewing angles.

40. The lamp of claim 24, wherein said varying scattering properties comprise higher diffuser scattering power in the axis of said light source emission comprising a higher light intensity, and lower diffuser scattering power in the axis of said light source emission comprising a lower light intensity.

41. A lighting device comprising:
a light source;
a diffuser spaced from and in the light path of the light source; and
a wavelength conversion element between the light source and the diffuser and spaced from the light source and the diffuser, wherein said diffuser is shaped such that there are different distances between said diffuser and said conversion material at different emission angles;
wherein said diffuser comprises diffusing properties that vary across one or more areas of the diffuser based on the desired emission profile for the lighting device.

42. The lighting device of claim 41, wherein said light source is a solid state light source.

43. The lighting device of claim 41, wherein said wavelength conversion element comprises a phosphor carrier comprising a thermally conductive material.

44. The lighting device of claim 41, wherein said diffuser comprises a diffuser dome.

45. The lighting device of claim 41, wherein said diffuser is substantially rotationally symmetric.

46. The lighting device of claim 41, wherein said diffuser comprises a diffusing material, wherein said diffuser incorporates one or more areas with varying diffusing properties.

47. The lighting device of claim 41, wherein said diffuser disperses light from said light source and/or said wavelength conversion material.

48. The lighting device of claim 41, further comprising heat dissipation elements to conduct conversion heat away from said wavelength conversion element.

49. The lighting device of claim 41, wherein said wavelength conversion element is three-dimensional.

50. The lighting device of claim 41, wherein said wavelength conversion element is planar.

51. The lighting device of claim 41, wherein said conversion element is substantially rotationally symmetric.

52. The lighting device of claim 41, wherein said light source comprises a plurality of co-planar light emitting diodes (LEDs).

53. The lighting device of claim 41, wherein said light source comprises a plurality of non-co-planar light emitting diodes (LEDs).

54. The lighting device of claim 41, wherein the space between said light source and said wavelength conversion material and the space between said diffuser and said phosphor comprise light mixing chambers.

55. The lighting device of claim 41, wherein said diffuser at least partially conceals the appearance of said wavelength conversion material when said lighting device is not operating.

56. The lighting device of claim 41, wherein said diffuser exhibits a substantially white appearance when said lighting device is not operating.

57. The lighting device of claim 41, providing a steady state lumen output of at least 800 lumens.

58. The lighting device of claim 41, comprising emission efficiency of greater than 50 lumens per watt.

59. The lighting device of claim 41, wherein said light source comprises 10 or fewer light emitting diodes.

60. The lighting device of claim 41, wherein said light source comprises a light emitting chip area of 10 mm$^2$ or less.

61. The lighting device of claim 41, emitting light with a color render index (CRI) greater than 80.

62. The lighting device of claim 41, wherein the light emitted from the diffuser comprises a spatial uniformity that is within 40% of a mean value within a range of viewing angles.

63. The lighting device of claim 62, wherein said range of viewing angles is 0 to 135°.

64. The lighting device of claim 41, wherein the light emitted from the diffuser comprises a spatial uniformity that is within 20% of a mean value within a range of viewing angles.

65. The lighting device of claim 64, wherein said range of viewing angles is 0 to 135°.

66. The lighting device of claim 41, wherein the light emitted from the diffuser comprises a color uniformity that is within a standard deviation on a CIE diagram within a range of viewing angles.

67. The lighting device of claim 66, wherein the standard deviation is a 4-step MacAdams ellipse.

68. The lighting device of claim 66, wherein said range of viewing angles is 0 to 135°.

69. A lighting device comprising:
a light source;
a diffuser spaced from the light source, said diffuser comprising areas with different diffusing characteristics, said areas comprising scattering elements that comprise varying scattering properties based on the desired emission profile for the lighting device; and
a wavelength conversion element between the light source and the diffuser and spaced from the light source and the diffuser.

70. The light emitting device of claim 69, wherein said different diffusing characteristics are provided by areas comprising differing amounts of diffusing material.

71. The lighting device of claim 70, wherein said diffuser is rotationally symmetric.

72. The light emitting device of claim 69, wherein said different diffusing characteristics comprise differing amounts of diffusing characteristics.

73. The light emitting diode of claim 69, wherein said diffuser comprises a differing amount of diffusing material at a viewing angle 0 and 45 degrees viewing angle.

74. The light emitting device of claim 69, wherein said diffuser is shaped such that there are different distances between said diffuser and said conversion element at different emission angles.

75. The lighting device of claim 69, wherein said diffuser comprises a diffuser dome.

76. The lighting device of claim 69, wherein the conversion and/or scattering properties of said conversion element vary across its surface.

77. A lamp, comprising:

a solid state light source emitting in an emission pattern; and a diffuser to alter said light source emission pattern so that said lamp emits a emission pattern comprising greater uniformity than said light source emission pattern, said diffuser being shaped with a lateral area comprising a smaller radius of curvature than a top area of said diffuser, wherein said diffuser comprises varying scattering properties based on the desired emission profile for the lamp.

78. A lighting device comprising:

a solid state light source;

a diffuser spaced from and in the light path of the light source; and a wavelength conversion element between the light source and the diffuser and spaced from the light source and the diffuser, wherein said conversion element comprises varying scattering properties and said diffuser comprises varying scattering properties based on the desired emission profile for the lighting device, wherein said lighting device emits a more uniform pattern than would be emitted by said conversion element or said diffuser diffusing said light source light without the other.

* * * * *